(12) United States Patent
Lee

(10) Patent No.: US 10,520,540 B2
(45) Date of Patent: Dec. 31, 2019

(54) SURVEY SIGNAL TRANSMITTER

(71) Applicant: Hyun Chang Lee, Seoul (KR)

(72) Inventor: Hyun Chang Lee, Seoul (KR)

( * ) Notice: Subject to any disclaimer, the term of this patent is extended or adjusted under 35 U.S.C. 154(b) by 207 days.

(21) Appl. No.: 15/833,860

(22) Filed: Dec. 6, 2017

(65) Prior Publication Data

US 2018/0113162 A1 Apr. 26, 2018

Related U.S. Application Data

(62) Division of application No. 15/037,445, filed as application No. PCT/KR2014/011130 on Nov. 19, 2014.

(30) Foreign Application Priority Data

| Nov. 19, 2013 | (KR) | 10-2013-0140715 |
| Sep. 21, 2014 | (KR) | 10-2014-0125371 |
| Nov. 18, 2014 | (KR) | 10-2014-0161154 |

(51) Int. Cl.
*G01R 31/08* (2006.01)
*G01R 31/02* (2006.01)
(Continued)

(52) U.S. Cl.
CPC ........... *G01R 31/025* (2013.01); *G01R 27/16* (2013.01); *G01R 31/021* (2013.01); *G01R 31/08* (2013.01); *G01R 31/083* (2013.01); *G01V 3/15* (2013.01)

(58) Field of Classification Search
CPC .... G01R 31/083; G01R 31/08; G01R 31/021; G01R 31/025; G01R 27/16; G01V 3/15
(Continued)

(56) References Cited

U.S. PATENT DOCUMENTS

| 2,974,276 A | 3/1961 | Davis |
| 3,299,351 A | 1/1967 | Williams |

(Continued)

FOREIGN PATENT DOCUMENTS

| EP | 2509149 A1 | 10/2012 |
| EP | 2645133 A1 | 10/2013 |

(Continued)

OTHER PUBLICATIONS

"New Technology #56" granted by MOKE (Ministry of Knowledge Economy) of Republic of Korea http://www.electricity.or.kr/ntep.search/search_view Jun. 2007.

(Continued)

*Primary Examiner* — Jeff W Natalini
(74) *Attorney, Agent, or Firm* — EIP US LLP

(57) ABSTRACT

A survey voltage transmitter includes a diode, a resistor, a first connection wire connected to a hot wire of AC power at a place, a second connection wire connected to a neutral wire of the AC power, a switching unit for turning on/off a circuit connected between the hot wire and the neutral wire to control a current flow through the diode and the resistor connected in series, a switching control unit for controlling a switch time of the circuit by providing a time control signal to the switching unit to turn on the circuit at a predetermined phase angle of the AC power and turn off the circuit before a half wave extinction phase angle of the AC power, and a coding unit for controlling the switching control unit to generate the current flow or not and for generating a series of logic values corresponding to the current flow.

6 Claims, 45 Drawing Sheets

(51) Int. Cl.
*G01V 3/15* (2006.01)
*G01R 27/16* (2006.01)

(58) Field of Classification Search
USPC .......................................................... 324/509
See application file for complete search history.

(56) References Cited

U.S. PATENT DOCUMENTS

| | | | |
|---|---|---|---|
| 3,735,249 A | 5/1973 | Stoll | |
| 4,135,129 A | 1/1979 | Johnston | |
| 4,258,323 A | 3/1981 | Andrews | |
| 4,584,530 A | 4/1986 | Nicholson | |
| 5,241,254 A * | 8/1993 | Offringa | B60L 50/30 318/800 |
| 5,714,885 A | 2/1998 | Lulham | |
| 6,163,144 A * | 12/2000 | Steber | G01R 19/15 324/133 |
| 6,819,115 B1 | 11/2004 | Keefe | |
| 7,443,172 B2 | 10/2008 | Fraedrich | |
| 7,446,535 B1 | 11/2008 | Tenghamn | |
| 8,400,154 B1 | 3/2013 | Olsson et al. | |
| 8,599,029 B2 * | 12/2013 | Chien | G01R 31/026 324/657 |
| 8,633,700 B1 | 1/2014 | England et al. | |
| 9,497,808 B2 * | 11/2016 | Murata | H05B 33/0815 |
| 2003/0026980 A1 | 2/2003 | Takeda | |
| 2005/0212518 A1 | 9/2005 | Sedlet | |
| 2005/0280422 A1 | 12/2005 | Kishibata | |
| 2010/0315092 A1 | 12/2010 | Nacson et al. | |
| 2013/0197891 A1 | 8/2013 | Jessop et al. | |
| 2013/0314099 A1 | 11/2013 | Ko | |
| 2013/0319862 A1 | 12/2013 | Kotowski et al. | |
| 2014/0015538 A1 | 1/2014 | Laepple | |
| 2014/0361777 A1 | 12/2014 | Marsala | |
| 2015/0003130 A1 * | 1/2015 | Ware | H02M 7/06 363/89 |
| 2018/0106847 A1 | 4/2018 | Lee | |

FOREIGN PATENT DOCUMENTS

| | | |
|---|---|---|
| EP | 3073279 A1 | 9/2016 |
| GB | 843419 A | 8/1960 |
| JP | 46016457 B | 5/1971 |
| JP | 54026483 A | 2/1979 |
| JP | 06-100572 B2 | 12/1994 |
| JP | H06-100572 B2 | 12/1994 |
| JP | H08-320308 A | 12/1996 |
| JP | 2000258280 A | 9/2000 |
| JP | 2001264281 A | 9/2001 |
| JP | 2002162431 A | 6/2002 |
| JP | 2003215180 A | 7/2003 |
| JP | 2004212376 A | 7/2004 |
| JP | 2004219214 A | 8/2004 |
| JP | 2006138691 A | 6/2006 |
| JP | 2006329946 A | 12/2006 |
| JP | 2007279031 A | 10/2007 |
| KR | 10-0503713 B1 | 7/2005 |
| KR | 10-0778089 B1 | 11/2007 |
| KR | 10-0816101 B1 | 3/2008 |
| KR | 10-0966759 B1 | 6/2010 |
| WO | 2007119642 A1 | 10/2007 |
| WO | 2013113627 A1 | 8/2013 |
| WO | 2013148714 A1 | 10/2013 |
| WO | 2013005655 A1 | 2/2015 |

OTHER PUBLICATIONS

Partial Supplementary European Search Report dated Jun. 29, 2017 for EP Application No. 14863212.8.
Singapore Office Action dated Jul. 5, 2017 for application No. 11201604986V.
International Search Report dated Feb. 2, 2015 on related PCT Application No. PCT/KR2014/011130 filed Nov. 19, 2014.
Extended European Search report dated Dec. 1, 2017 on related application EP 14863212.8, filed Nov. 19, 2014.
Australian Examination Report dated Sep. 11, 2018 for Australian Application No. 2014353729.
Japanese Office Action dated Aug. 7, 2018 for Japanese Application No. 2016-533081.
"Ceuret et al.; ""Carbon Fibre Cloth as an Electrode Material: Electrical Conductivity and Mass Transfer""—Journal of Applied Electrochemistry 32: 1175-1182; 2002".
United States Non-Final office action dated Aug. 28, 2019 for U.S. Appl. No. 15/833,809.
United States Non-Final office action dated Sep. 20, 2019 for U.S. Appl. No. 15/833,836.
Chinese Office action dated Sep. 11, 2019 for Chinese Application No. 201480072448.2.

* cited by examiner

FIG. 26

| Date | Electrode 1V | Electrode 1A | Electrode 2V | Electrode 2A | Electrode 3V | Electrode 3A | Electrode 4V | Electrode 4A | Trajectory information | Temperature | Humidity | Moisture | Wind |
|---|---|---|---|---|---|---|---|---|---|---|---|---|---|
| 2000-06-14 PM 8:32:11 | 49 | 34 | 17 | 36 | 13 | 10 | 8 | 19 | 1678 | 26 | 54 | 0 | 2 |
| 2000-06-14 PM 8:32:11 | 29 | 24 | 47 | 38 | 14 | 25 | 17 | 19 | 1678 | 26 | 54 | 0 | 2 |
| 2000-06-14 PM 8:32:11 | 15 | 28 | 25 | 37 | 12 | 34 | 12 | 21 | 1678 | 26 | 54 | 0 | 2 |
| 2000-06-14 PM 8:32:11 | 4 | 13 | 20 | 38 | 16 | 10 | 11 | 18 | 1678 | 26 | 54 | 0 | 2 |
| 2000-06-14 PM 8:32:11 | 18 | 16 | 30 | 36 | 22 | 5 | 12 | 19 | 1678 | 26 | 54 | 0 | 2 |
| 2000-06-14 PM 8:32:11 | 27 | 11 | 15 | 34 | 21 | 7 | 7 | 17 | 1678 | 26 | 54 | 0 | 2 |
| 2000-06-14 PM 8:32:11 | 26 | 22 | 31 | 37 | 16 | 14 | 13 | 17 | 1678 | 26 | 54 | 0 | 2 |
| 2000-06-14 PM 8:32:11 | 16 | 22 | 54 | 39 | 6 | 18 | 10 | 18 | 1678 | 26 | 54 | 0 | 2 |
| 2000-06-14 PM 8:32:11 | 15 | 27 | 38 | 35 | 4 | 10 | 21 | 20 | 1678 | 26 | 54 | 0 | 2 |
| 2000-06-14 PM 8:32:11 | 22 | 18 | 27 | 35 | 9 | 15 | 6 | 18 | 1678 | 26 | 54 | 0 | 2 |
| 2000-06-14 PM 8:32:11 | 20 | 9 | 17 | 34 | 14 | 26 | 5 | 20 | 1678 | 26 | 54 | 0 | 2 |
| 2000-06-14 PM 8:32:11 | 14 | 17 | 7 | 40 | 20 | 11 | 17 | 18 | 1678 | 26 | 54 | 0 | 2 |
| 2000-06-14 PM 8:32:11 | 6 | 18 | 39 | 38 | 14 | 14 | 14 | 17 | 1678 | 26 | 54 | 0 | 2 |
| 2000-06-14 PM 8:32:11 | 5 | 18 | 72 | 42 | 5 | 6 | 16 | 18 | 1678 | 26 | 54 | 0 | 2 |
| 2000-06-14 PM 8:32:11 | 9 | 27 | 46 | 34 | 6 | 10 | 10 | 18 | 1678 | 26 | 54 | 0 | 2 |
| 2000-06-14 PM 8:32:11 | 18 | 33 | 15 | 37 | 3 | 12 | 5 | 16 | 1678 | 26 | 54 | 0 | 2 |
| 2000-06-14 PM 8:32:11 | 16 | 32 | 9 | 37 | 11 | 7 | 7 | 18 | 1678 | 26 | 54 | 0 | 2 |
| 2000-06-14 PM 8:32:11 | 20 | 44 | 19 | 36 | 14 | 14 | 20 | 17 | 1679 | 26 | 54 | 0 | 2 |
| 2000-06-14 PM 8:32:12 | 27 | 36 | 28 | 42 | 6 | 11 | 18 | 18 | 1679 | 26 | 54 | 0 | 2 |
| 2000-06-14 PM 8:32:12 | 17 | 26 | 26 | 39 | 5 | 21 | 14 | 19 | 1679 | 26 | 54 | 0 | 2 |
| 2000-06-14 PM 8:32:12 | 18 | 6 | 29 | 33 | 8 | 20 | 10 | 18 | 1679 | 26 | 54 | 0 | 2 |
| 2000-06-14 PM 8:32:12 | 37 | 19 | 19 | 36 | 4 | 16 | 11 | 19 | 1679 | 26 | 54 | 0 | 2 |
| 2000-06-14 PM 8:32:12 | 42 | 17 | 23 | 37 | 4 | 9 | 7 | 18 | 1679 | 26 | 54 | 0 | 2 |
| 2000-06-14 PM 8:32:12 | 36 | 18 | 10 | 35 | 7 | 5 | 9 | 18 | 1679 | 26 | 54 | 0 | 2 |

FIG. 27

| Trajectory information | Longitude | Latitude | Validity | Speed |
|---|---|---|---|---|
| 1 | 127.19596 | 37.55364 | ☑ | 0 |
| 2 | 127.19597 | 37.55364 | ☑ | 1 |
| 3 | 127.19597 | 37.55365 | ☑ | 1 |
| 4 | 127.19597 | 37.55364 | ☑ | 0 |
| 5 | 127.19597 | 37.55365 | ☑ | 5 |
| 6 | 127.19598 | 37.55366 | ☑ | 8 |
| 7 | 127.19599 | 37.55369 | ☑ | 13 |
| 8 | 127.19601 | 37.55373 | ☑ | 16 |
| 9 | 127.19603 | 37.55377 | ☑ | 20 |
| 10 | 127.19607 | 37.55381 | ☑ | 23 |
| 11 | 127.19611 | 37.55386 | ☑ | 21 |
| 12 | 127.19615 | 37.55390 | ☑ | 22 |
| 13 | 127.19620 | 37.55394 | ☑ | 22 |
| 14 | 127.19625 | 37.55398 | ☑ | 21 |
| 15 | 127.19629 | 37.55402 | ☑ | 18 |
| 16 | 127.19632 | 37.55406 | ☑ | 20 |
| 17 | 127.19668 | 37.55404 | ☑ | 21 |
| 18 | 127.19074 | 37.55410 | ☑ | 21 |
| 19 | 127.19681 | 37.55411 | ☑ | 26 |
| 20 | 127.19701 | 37.55410 | ☑ | 26 |
| 21 | 127.19652 | 37.55407 | ☑ | 15 |
| 22 | 127.19654 | 37.55422 | ☑ | 18 |
| 23 | 127.19645 | 37.55425 | ☑ | 17 |
| 24 | 127.19649 | 37.55426 | ☑ | 16 |
| 25 | 127.19654 | 37.55434 | ☑ | 14 |
| 26 | 127.19655 | 37.55431 | ☑ | 16 |
| 27 | 127.19653 | 37.55430 | ☑ | 17 |
| 28 | 127.19654 | 37.55436 | ☑ | 18 |
| 29 | 127.19652 | 37.55441 | ☑ | 18 |
| 30 | 127.19651 | 37.55447 | ☑ | 19 |

SURVEY SIGNAL TRANSMITTER

CROSS-REFERENCE TO RELATED APPLICATIONS

This application is a divisional under 35 U.S.C. § 120 of U.S. application Ser. No. 15/037,445, filed Jun. 24, 2016, which is a national stage entry of International Application No. PCT/KR2014/011130, filed Nov. 19, 2014, which claims priority to Republic of Korea Application No. 10-2014-0161154, filed Nov. 18, 2014, Republic of Korea Application No. 10-2014-0125371, filed Sep. 21, 2014, and Republic of Korea Application No. 10-2013-0140715, filed Nov. 19, 2013 under 35 U.S.C. § 119(a). Each of the above-referenced patent applications is incorporated by reference in its entirety.

FIELD OF THE DISCLOSURE

The present disclosure relates to a mobile electric leakage locating and exploring device and method, more particularly, a mobile apparatus with multiple wet type wheel electrodes contacting the earth to locate ground potential increasing points while tracing laying paths of an electric line to acquire field information to update and repair, and a method for the same.

BACKGROUND

Description of the Related Technology

Republic of Korea Patent No. 10-0778089 discloses an exploration system and method for acquiring the field configured network information of an underground low voltage (LV) distribution system, particularly in urban areas where multiple transformers are grouped in a same location, including a plurality of master devices, a slave device and a detecting device. The plurality of master devices are connected to the terminals of phases and earth inside of each of the transformers to broadcast the unique identification codes of a transformer, a phase and a circuit over the feeding electric lines, the slave device acquires the information of a source transformer, a connected phase and a circuit by reading the codes in the broadcast or requests reply from the connecting point of an electric line at a service entrance to a customer premise, and the detecting device acquires the information of the source transformer, a phase and a customer by collecting a signal transmitted by the slave device in the middle of the laying path of the electric line without removing the insulation while in service.

Republic of Korea Patent No. 10-0816101 relates to an earth voltage leakage sensing device and discloses the arrangement of a transmitting device and a receiving device to perform the task in service. While the transmitting device applies a chain of asymmetrical pulse signals to a pad mounted transformer, a stream of output signals fed by the transformer to feeder cables are mixed signals of AC mains and asymmetrical pulse AC signals. The receiving device includes a signal input part for gathering the earth voltage signals from the ground, a filtering part to eliminate the symmetrical voltage of AC mains and noises from the signal inputs, a comparator part to compare the DC signal polarity to display the + or − of the signal from the filtering part, and an averaging part to average the value of accumulated DC signal value from the filtering part in the specific period to display the signal value with the polarity from the comparator part, and picks the asymmetrical pulse signal from the earth after removing the commercial AC voltage wave from the detectable composite signal at the leaking point.

Republic of Korea Patent No. 10-0966759 relates to a method for detecting and repairing a comprehensive streetlight power system including a power cable from a utility and power distribution system to each streetlight pole. The method includes performing an electric leakage diagnosis by measuring a resistive and capacitive leakage current value under no load and full load conditions at a location where cables stretched down from the utility pole run into a protective pipe for protecting the cables to determine whether an electric leakage occurs in a street light power system when the resistive and capacitive leakage current values are exceeding a threshold level, tracing an underground cable from the utility pole to measure an electromagnetic flux over the ground by increasing the sensitivity by step to detect an earth leaking point, and marking an earth leaking point by recording distances from landmarks.

In addition to above prior patents, *New Technology #56* granted by MOKE (Ministry of Knowledge Economy) of Republic of Korea may be referenced as a non-patent document (http://www.electricity.or.kr/ntep/search/search_view).

SUMMARY

According to some embodiments, a survey voltage transmitter is provided. The transmitter includes a diode. The transmitter includes a resistor. The transmitter includes a first connection wire connected to a hot wire of AC power at a place. The transmitter includes a second connection wire connected to a neutral wire of the AC power at the place. The transmitter includes a switching unit for turning on/off a circuit connected between the hot wire and the neutral wire to control a current flow through the diode and the resistor connected in series. The transmitter includes a switching control unit for controlling a switch time of the circuit by providing a time control signal to the switching unit to turn on the circuit at a predetermined phase angle of the AC power and turn off the circuit before a half wave extinction phase angle of the AC power. The transmitter includes a coding unit for controlling the switching control unit to generate the current flow or not and for generating a series of logic values corresponding to the current flow.

According to some other embodiments, another survey current transmitter configured to identify a burial path of a power cable is provided. The transmitter includes a diode. The transmitter includes a resistor. The transmitter includes a first connection wire connected to a hot wire of AC power at a place. The transmitter includes a second connection wire connected to a neutral wire of the AC power at the place. The transmitter includes a switching unit for turning on and off a circuit connected between the hot wire and the neutral wire to control a current flow through the diode and the resistor connected in series. The transmitter includes a switching control unit for controlling a switch time of the circuit by providing a time control signal to the switching unit to turn on the circuit at a predetermined phase angle of the AC power and turn off the circuit after a half wave extinction phase angle of the AC power. The transmitter includes a coding unit for controlling the switching control unit to generate the current flow or not and for generating a series of logic values corresponding to the current flow.

BRIEF DESCRIPTION OF THE DRAWINGS

FIG. 26 illustrates configuration of a database of a mobile ground potential measurement device according to an embodiment of the present disclosure;

FIG. 27 shows a database including details of the trajectory information of FIG. 26;

DETAILED DESCRIPTION

Figure 1:
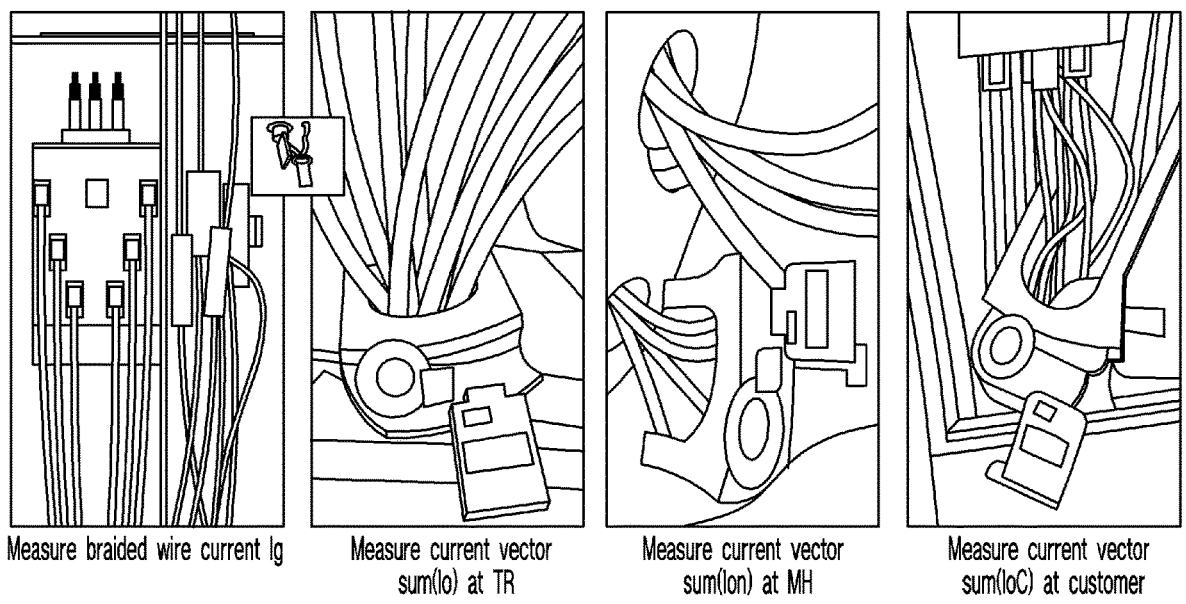
FIG. 1 is a photograph showing a procedure of electric leakage detection according to the conventional art.
Figure 2:
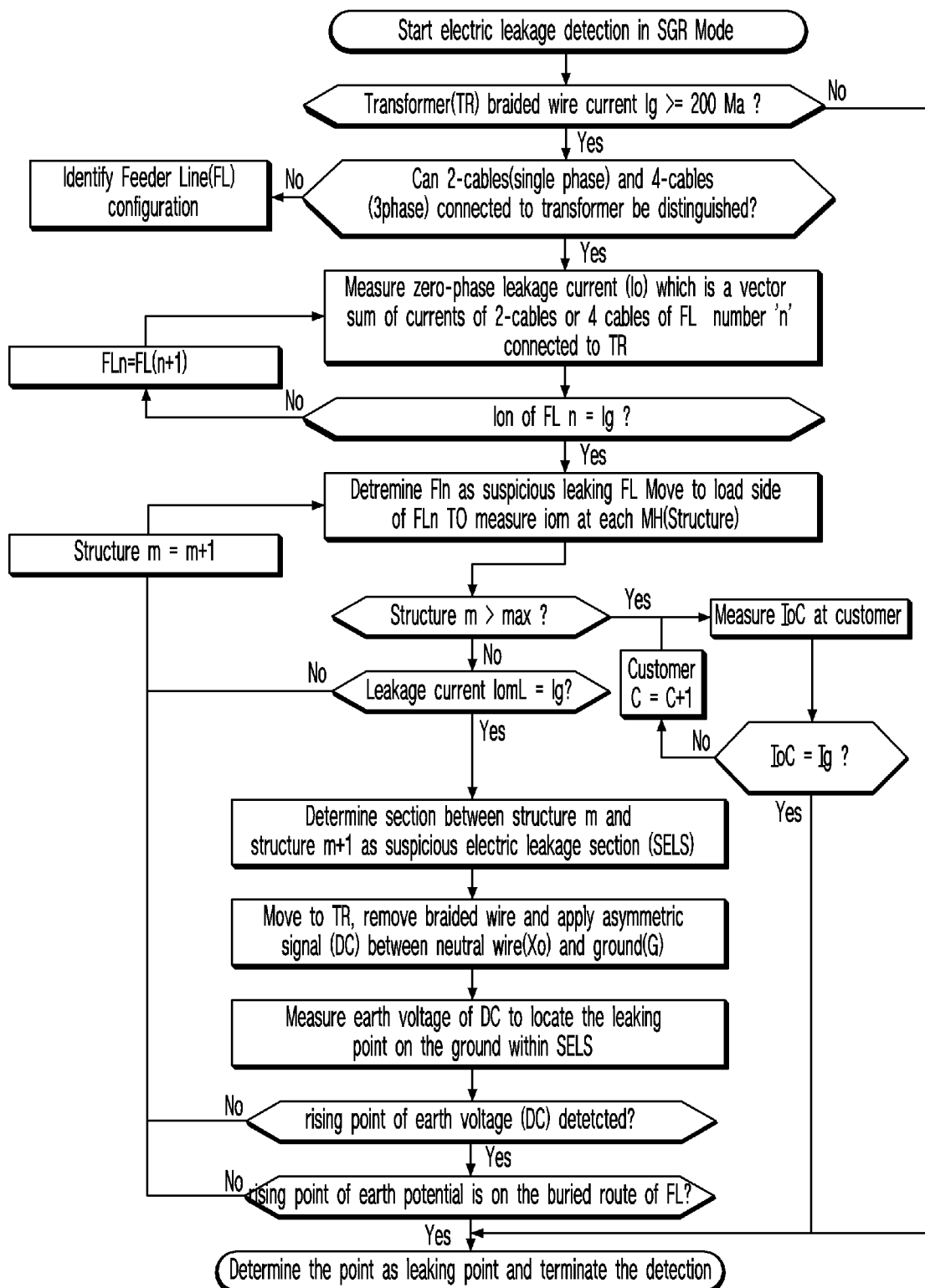
FIG. 2 is a flowchart illustrating detection of electric leakage according to the conventional art.

FIG. 1 shows a series of photos while FIG. 2 shows a work flow chart to explain an example of locating earth leaking points in the prior art.

Referring to FIGS. 1 and 2, the conventional method to locate an earth voltage leaking point has 4 steps: (step 1) determining whether the earth voltage leaking happens to any of feeder lines fed by a transformer if more than 200 mA flows through a braided wire (Ig) which bridges an earth ground (G) and a transformer winding neutral (Xo); (step z2) finding a suspicious earth leaking feeder line which carries a vector sum current as much as said braided wire current (Ig) at the transformer; (step 3) finding a suspicious earth leaking section in the route of the said suspicious earth leaking feeder line; and (step 4) locating the earth leakage point on the ground within the said suspicious earth leaking section of the said feeder line.

The step 2 and step 3 for finding the suspicious earth leaking feeder and the suspicious earth leaking section are conducted by detecting the current vector sum (zero phase sequence current) (10) shown in the photos of FIG. 1, flowing through the 2 wires (phase+neutral) for a single phase or 4 wires (A, B and C phases+neutral) for a three-phase system.

Figure 4:
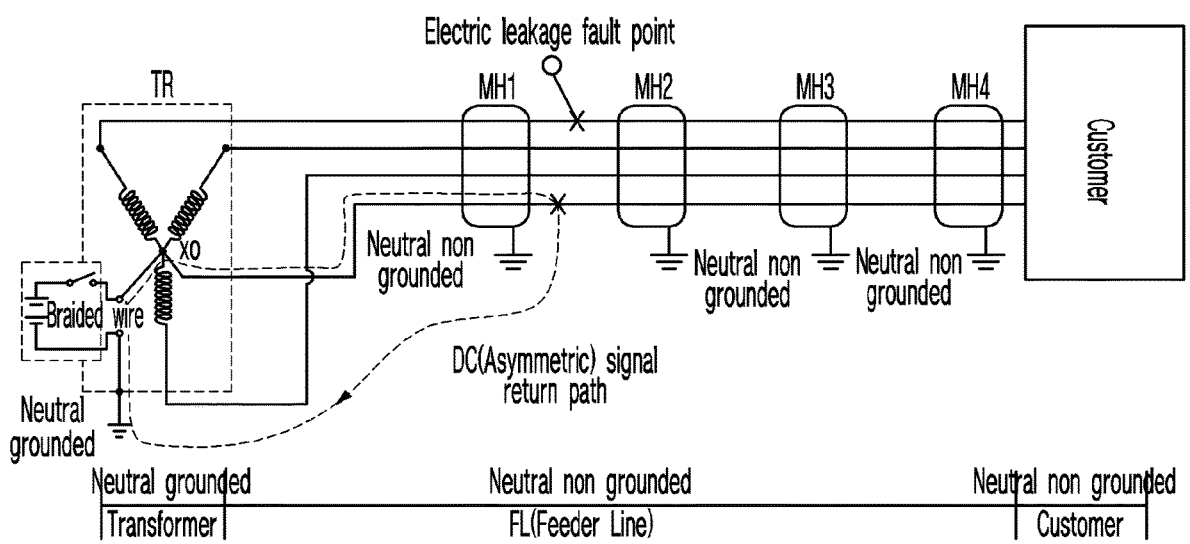
FIG. 4 is a diagram illustrating detection of an electric leakage point of a non-grounded neutral LV cable used in the conventional art.

On the other hand, measures of the current vector sum (Io) at the structures (joint places such as manhole) where a suspicious feeder line passes through to find a first structure of the said current (10) disappeared to determine the suspicious section between the last structure with the leak current (10) and the first one without it (10) as step 3, to perform step 4 to locate the earth leaking point on the ground within the said suspicious section, connect the asymmetrical pulse signal from the transmitting device to the terminals which is between the winding neutral (Xo) and the ground (G) after removing the braided wire at the transformer, finalizing the earth leaking point where the peak of the asymmetrical pulse signal by the receiving device as shown in FIG. 4, or determine that the earth leaking happens to customer's premise if the current vector sum (10) is not disappeared until the end of the said feeder line.

Figure 3:
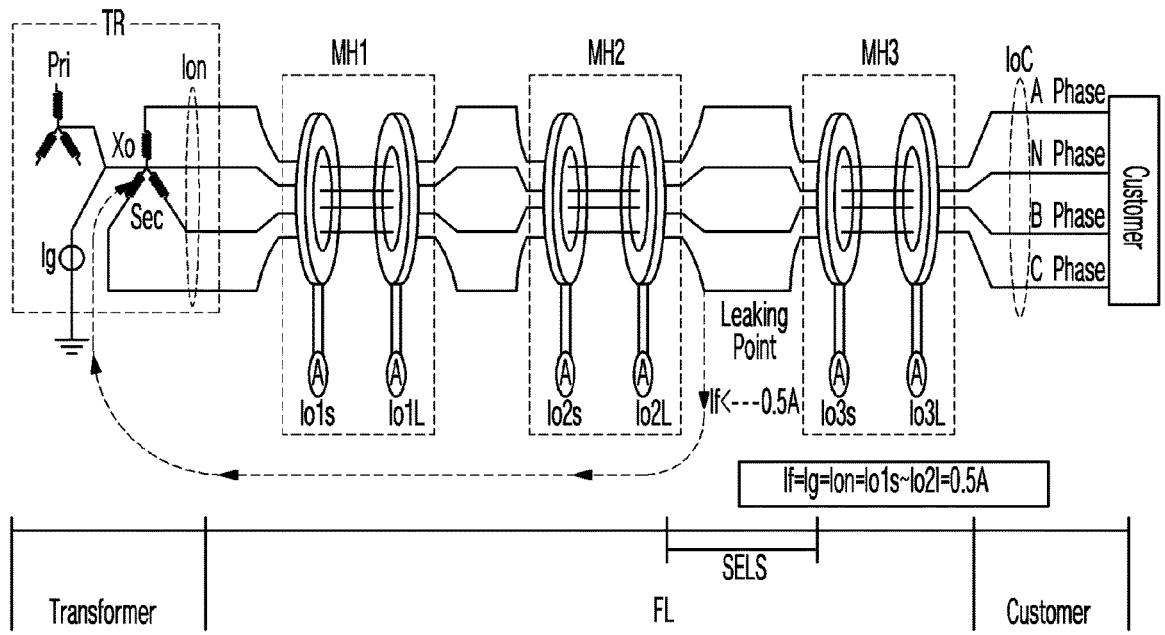
FIG. 3 is a diagram illustrating detection of a suspicious electric leakage section of a non-grounded neutral low voltage (LV) cable used in the conventional art.

In some countries in North America and Republic of Korea, shown in the left top corner of the FIG. 3, the primary and secondary winding center points (neutral) of a distribution transformer are bonded and directly earth grounded through the braided wire, Y-y directly earth grounded, but the neutral wire of the feeder lines and customer's premises are isolated from the earth ground. When an earth fault (leakage) happens to either feeder lines or customer's premises, an earth fault current should return only to the transformer by a SGR (Source Ground Return) method. If the insulation of the feeder line is broken somewhere between the structure 2 and structure 3, assume that the commercial voltage of AC mains would leak out to the earth and return to the transformer through the earth resistance, creating a 0.5 A fault current (If) to the neutral point of transformer via the braided wire (Ig), and the zero-phase sequence current (Ion) of O.5A at the feeder line which is same as the fault (If). The braided wire (Ig) current would be extended to the load side of structure 2 (Io2L) (If=Ig=Ion=Iols−Io2L) but disappeared at the source side of structure 3 (Io3S), so the section between the structure 2 and structure 3 would be determined as a suspicious earth leaking section.

Figure 10:
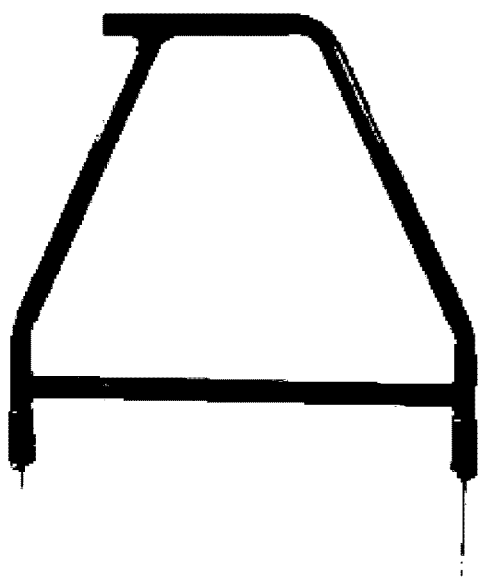
FIG. 10 illustrates a probe with a ground contact electrode having a sharp tip according to the conventional art.

In FIG. 4, if the suspicious section of earth leaking is determined somewhere between manhole 1 and manhole 2, perform the earth leaking point accurate locating job to repair the earth faulted conductor wires by an excavation work on the ground within the said suspicious section by picking a peak level of an asymmetrical pulse signal, which is a DC 50V maximum, generated by a transmitting device connected to the neutral (Xo) wire and ground (G) after removing the braided wire at the transformer by the receiving device which has sharp tip electrodes at both ends thereof shown in FIG. 10.

An advantage of employing the SGR method is a simple mechanism to determine whether an earth leakage happens to any feeder lines or customer premises by measuring the return fault ground current (Ig), but it also has a disadvantage that the leaking voltage would remain electrically hazardous to the public if the earth resistance is not good enough to discharge (return) the earth fault current where a place like far end from the source.

Since a series of electric shock accidents occurred in 2005 due to the aforementioned disadvantage, Republic of Korea has introduced a new grounding system, TNC defined by IEC Standard, which earths the neutral not only at the source, transformer, but also at the structures in the feeder lines, called PEN (Protective Earth Neutral), where multiple PENs are located both at a transformer and in the feeder lines to provide the additional return paths to the earth leaking current to quickly clear up the dangerous voltage by shortening the return distance to prevent the electric shock accident.

Figure 5:
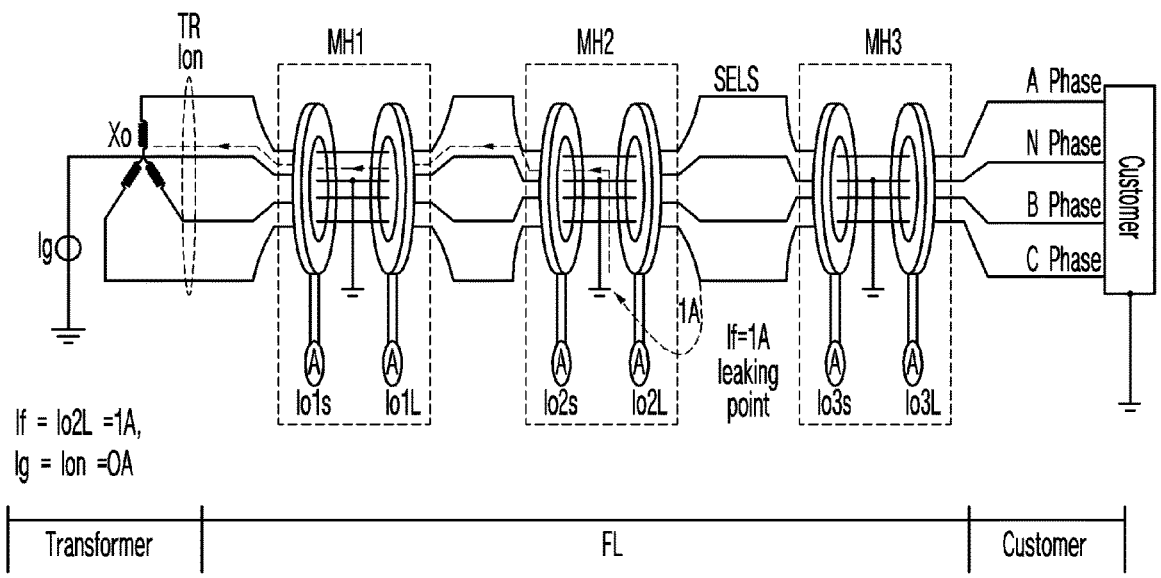
FIG. 5 is a diagram illustrating detection of a suspicious electric leakage section of a neutral grounded LV cable used in the conventional art.

However, there is no other new method or apparatus to detect the earth leaking under the introduced new grounding system. The conventional technology judges mostly depending on currents at the transformer (Ig) and feeder line (Ion). FIG. 5 shows an example of earth voltage leaking happening somewhere between the structures 2 and 3 under the TNC environment, where the earth fault current (If) of 1 A would no longer return to the transformer but to the nearest FED PEN2 which makes the fault returning current OA at the braided wire, such that the conventional method made wrong determinations that the feeder line which has 1 A earth leaking is healthy and thus could lead to abandon maintenance, leaving electric shock dangers as high as possible to pedestrians.

Figure 6:
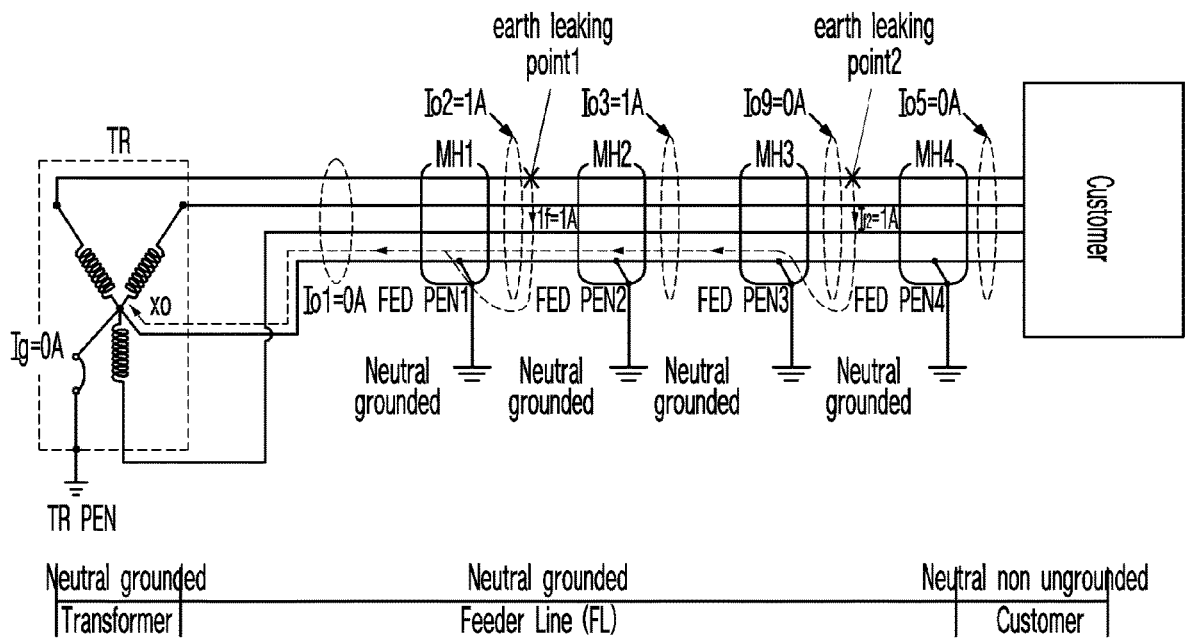
FIG. 6 is a diagram illustrating detection of a multiple electric leakage points of a neutral grounded LV cable used in the conventional arts.

FIG. 6 shows an earth leakage happening at multiple points in a feeder line, same as FIG. 5 where the two earth fault currents (If) would not return to the transformer, and thus return a fault current (Ig), and the zero-phase sequence current (Io) at the transformer could not be detectable. Thereby, the judgment made by the currents measurement at the transformer could not be correct to represent the true status of earth leakage in the feeder lines. The only way to detect the true earth leaking feeder line and earth leaking section should be made by measuring the zero phase sequence current (Ion) at all the structures along the paths of the feeder lines go through. The earth leaking sections could be determined between manholes 1 and 2 (Io2), and manholes 3 and 4 (Io4) of the feeder line.

Figure 7:
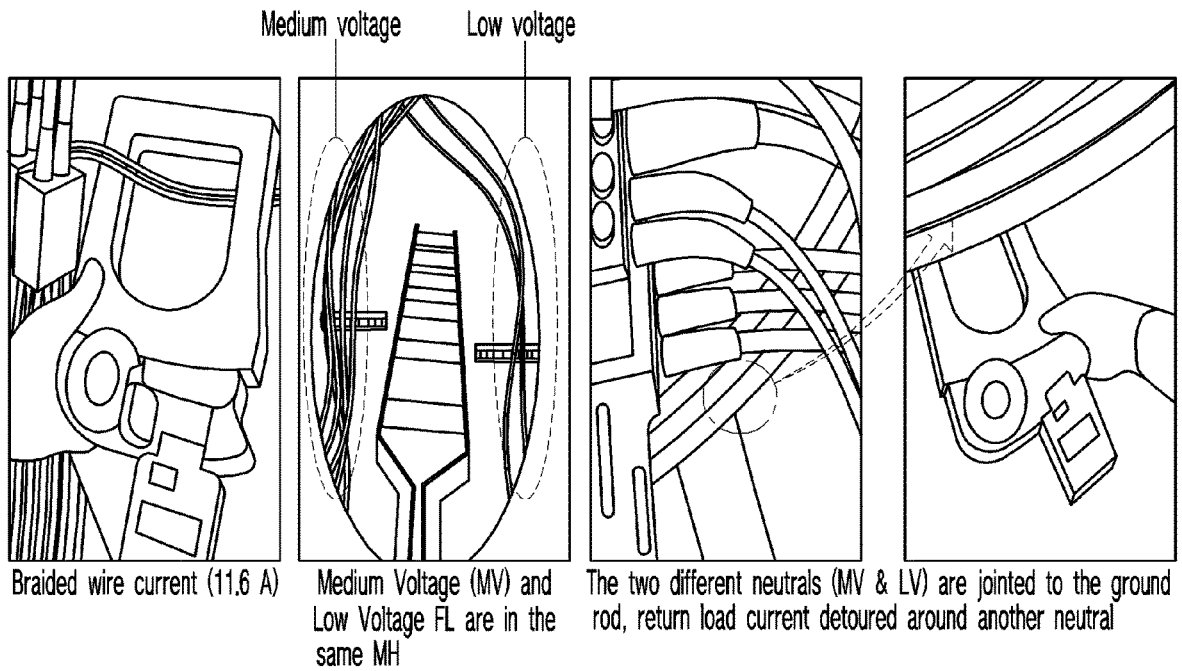
FIG. 7 is a photograph illustrating a case of detection of a zero-phase leakage current at a PEN of a neutral grounded LV cable (which is in fact a case where the conventional device mistakenly detected a detoured current on a neutral wire as a voltage leakage)

But in real, an unbalanced phase load current returns through the neutral conductor wire to the source transformer like the earth fault current (If). FIG. 7 shows some amounts of return load currents detoured around another neutral conductor wire depending on the line impedance and ampacity of the return load currents at the FED PEN.

Figure 8:
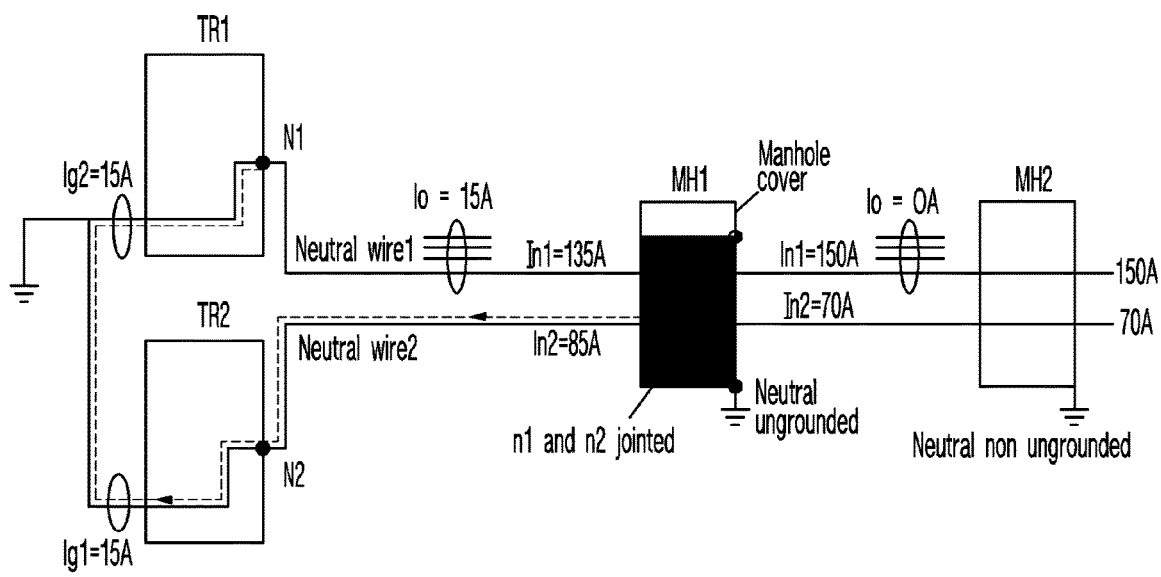
FIG. 8 is a diagram illustrating a detoured current at a PEN of a neutral grounded LV cable.

That is, when the phase unbalanced return load current of 150 A flows through neutral conductor wire 1 (N1) to the transformer 1 (TR1) while the 70 A of the returning load current goes through the neutral conductor wire 2(N2) to the transformer 2 (TR2), in the structure 2 where two neutrals are non-grounded and used as a dedicated return path to each transformer showing OA in zero phase current (Io) until the structure 1 where neutrally grounded, the imbalance of flowing currents in connections N1 and N2, a 15 A of current from N1 becomes detoured through the relatively lower current flowing N2 and reaches TR1 through the earth grounded neutral wire of medium voltage (MV) and the braided wire of both TR1 and TR2 shown in FIG. 8, which could be a meaning of a leak current (Ig) in the conventional method. The detoured return load current of 15 A is treated as possible as a returning fault current until finding a reason that the bypassed current at structure 1 after step 3 and step 4 are carried out, which is a manpower and budget waste.

Figure 9:
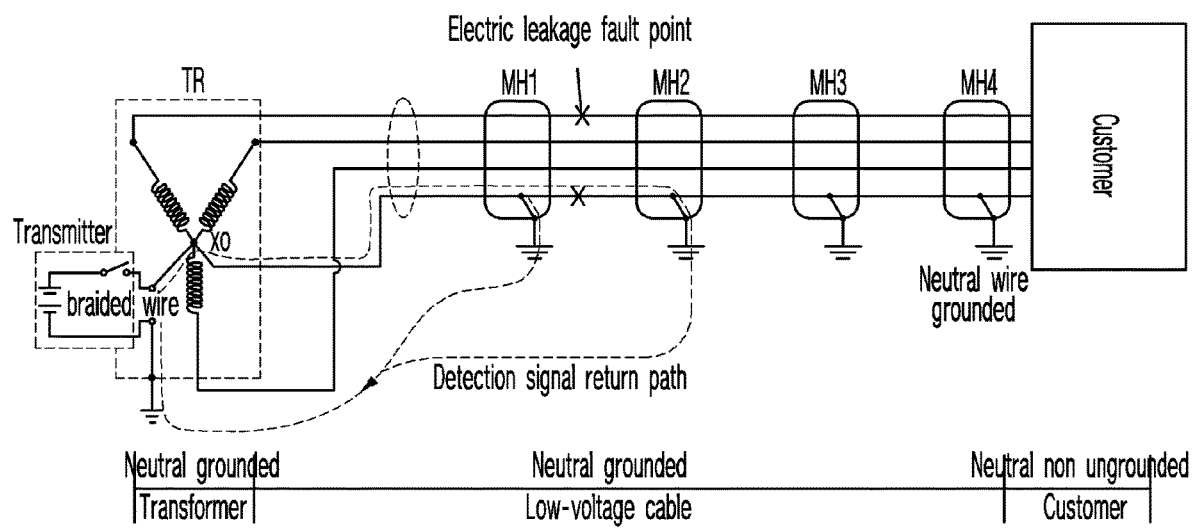
FIG. 9 is a diagram illustrating detection of electric leakage of a neutral grounded LV cable used in the conventional art.

Moreover, even if the braided wire current is from the true earth fault detected by the conventional method to determine the suspicious section between the structures 1 and 2 shown in FIG. 9, the DC 50V of asymmetrical signal is continuously transmitted using the conventional transmitting device to the neutral conductor wire of the feeder line expected to be leaked at a place of insulation fault, but the DC voltage leaks all over the PENs and returns to the ground of transformer before arriving at the true leaking point, therefore the conventional method could not detect the earth leaking point and questioning whether the location of insulation failed neutral is always the same location of faulty phase conductor wires which carry the dangerous voltage risk under the TNC earth system.

In addition, when assuming that the true earth voltage leaking happens in the feeder line 2 with a leaking current of 200 mA, the small earth fault current would be hidden by the big detoured current of 15 A, even if it is successfully captured at the braided wire. But the conventional method cannot distinguish the hidden one in the bigger current, and thus can judge that the current is caused by the bypass current at the structure 1 and close the investigation without finding a true earth voltage leakage.

Technical Solution

Therefore, the present disclosure is such as to solve the conventional problems, using a method with a mobile earth leakage locating and exploring apparatus having multiple wet type wheel electrodes according to the present disclosure. The method includes: (1) tracing the laying paths of phase conductor wires; (2) locating an increasing point of a AC mains earth potential; (3) locating a peak increasing point of a DC survey signal using polarity comparison when a logic value is '1'; and (4) identifying an earth leaking source by analyzing the logic values of the earth potential to provide a technology for accurately locating an excavating position to repair the fault, also leaking source information to enable to remove the dangerous voltage to prevent electric shock accidents and equipment failure before civil works where an immediate action is required.

In accordance with another aspect of the present disclosure, there is provided a mobile ground potential scanning device including a plurality of electrodes configured to be capacitively coupled to ground, a plurality of moisture supply means for supplying moisture to the plurality of electrodes and ground, and a potential measuring section for measuring a plurality of earth potential values input from the plurality of electrodes.

Preferably, the electrodes may be in a form of wheels.

Preferably, the potentiometer may include a filter for extracting power frequency and harmonics.

Preferably, the mobile ground potential scanning device may further include a record section for recording a stream of data including the plurality of earth potential values at specific locations in accordance with coordinate movements of the mobile detection device.

Preferably, the mobile ground potential scanning device may further include a map section for plotting a colored point in a coordinate plane on a map to represent the data in the record section.

In accordance with another aspect of the present disclosure, there is provided a survey voltage signal transmitter including a diode; a resistor; a first connection wire connected to a hot (phase) wire of AC power at a place; a second connection wire connected to a neutral wire of the AC power at the place; a switching unit for turning on and off a circuit connected between the hot wire and the neutral wire to control a current flow through the diode and the resistor connected in series; a switching control unit for controlling a switch time of the circuit by providing a time control signal to the switching unit to turn on the circuit at a predetermined phase angle of the AC power and turn off the circuit before a half wave extinction phase angle of the AC power; and a coding unit for controlling the switching control unit to whether generate the current flow or not and generating series of logic values corresponding to the current flow.

Preferably, the survey voltage signal transmitter may further include an interface unit for synchronizing the switch time with an associated device through communications.

Preferably, the switching unit has three switching circuits to switch if the AC power has three phases.

The survey voltage signal transmitter may further include an input and setting unit to enter identity information of the voltage transmitter to the coding unit and set a single phase or three phases of the AC power.

In accordance with another aspect of the present disclosure, there is provided a survey current signal transmitter to identify a burial path of a power cable, the survey current signal transmitter including a diode; a resistor; a first connection wire connected to a hot (phase) wire of AC power at a place; a second connection wire connected to a neutral wire of the AC power at the place; a switching unit for turning on and off a circuit connected between the hot wire and the neutral wire to control a current flow through the diode and the resistor connected in series; a switching control unit for controlling a switch time of the circuit by providing a time control signal to the switching unit to turn on the circuit at a predetermined phase angle of the AC power and turn off the circuit after a half wave extinction phase angle of the AC power; and a coding unit for controlling the switching control unit to whether generate the current flow or not and generating series of logic values corresponding to the current flow.

Preferably, the survey current signal transmitter may further include an interface unit to synchronize the switching time with an associated device through communications.

In accordance with another aspect of the present disclosure, there is provided an accurate earth leak point survey apparatus including a magnetic field sensor; a plurality of electrodes configured to be capacitively coupled to ground; a signal timing unit for finding and setting a time T by analyzing signals input from the magnetic field sensor, wherein the time T matches a signal start time of a survey current transmitter; a signal detection unit for identifying a polarity and magnitude of a signal from the magnetic field sensor for a predetermined discrete period of time at a predetermined interval time from the time T; and a potential measuring unit for measuring an earth potential value input from the plurality of electrodes.

Preferably, the potential measuring unit is synchronized with the time T to identify the polarity and magnitude of the earth potential from the plurality of electrodes for the predetermined discrete period time at the predetermined interval time from the time T.

Preferably, the signal detection unit is configured to simultaneously identify the polarity and magnitude of the signal from each of the plurality of the magnetic sensors.

Preferably, the accurate earth leak point survey apparatus may further include an impedance selection unit for selecting a plurality of impedances and changing the values of impedances in parallel with the earth potential value.

Preferably, the potential measuring unit is configured to display earth leaking source information by reading a chain of logic values of the input signals from the electrodes.

In accordance with another aspect of the present disclosure, there is provided a method for detecting an electric leakage point of electric wires being supplied with power without interrupting such power supply, the method including moving a plurality of electrodes configured to be capacitively coupled to ground through moisture to record a stream of data including an earth potential at a respective location; and determining a suspicious area of electric voltage leakage by an electric wire of power supply.

In accordance with another aspect of the present disclosure, there is provided another method for detecting an electric leakage point of electric wires being supplied with power without interrupting such power supply, the method including transmitting a unipolar DC survey voltage signal to an electric wire of the power supply; transmitting a chain of electromagnetic wave signals generated around the electric wire to synchronize a reference time to measure an earth potential of the unipolar DC voltage signal and capture an electromagnetic tracking signal; tracing a buried route of the electric wire by analyzing the electromagnetic tracking signal according to the reference time; measuring the earth potential of the unipolar DC voltage signal on the ground according to the reference time; and locating the electric leakage point by identifying a polarity of the unipolar DC voltage signal.

Preferably, the method may further include measuring the earth potential at the point on the ground determined as the electromagnetic tracking signal at a location where a weaker electromagnetic signal detected in between two stronger oppositely signed electromagnetic signals.

Preferably, the method may further include analyzing information contained in the unipolar DC signal to identify a source of the electric leakage.

Advantageous Effects

According to embodiments of the present disclosure, an electric leakage detection device and method employing a mobile ground potential measurement device with water-supplied wheel-type electrodes have the following effects.

First, a location where an AC commercial power ground potential is increasing may be identified while the device quickly moves using water-supplied wet type wheel electrodes. Accordingly, an electric leakage position may be accurately identified without an error according to measurement of a zero-phase leakage current, and thus detection reliability may be enhanced.

Second, a buried path of an electric wire may be accurately distinguished and detected to pinpoint an electric leakage point on the electric wire having a hazard of electric shocks, and thus the excavation position (the electric leakage point) can be accurately located by measuring the AC commercial voltage ground potential and the DC voltage on the ground. Thereby, the electric leakage that may cause electric shocks may be identified, and further the maintenance operation of the electric wire may be performed. Accordingly, accidents may be prevented.

Third, while two persons perform the path detection and measurement of ground potential separately in conventional cases, one person can perform the operations using the mobile ground potential measurement device, and use of the water-supplied wheel-type electrodes can save time to move around. Accordingly, time for measurement may be shortened and labor may be saved by storing and managing ground potential values for respective positions.

Fourth, if it takes a long time to perform the excavation operation for fault recovery, temporary actions such as separation of a low-voltage cable exhibiting electric leakage from the power source may be taken before the excavation operation to eliminate the cause of electric shock. Thereby, maintenance costs may be saved.

Reference will now be made in detail to the preferred embodiments of the present disclosure, examples of which are illustrated in the accompanying drawings. However, it should be noted that the present disclosure is not limited or defined by the embodiments. Descriptions which are determined to be apparent to those skilled in the art or redundant may be omitted.

Figure 11:
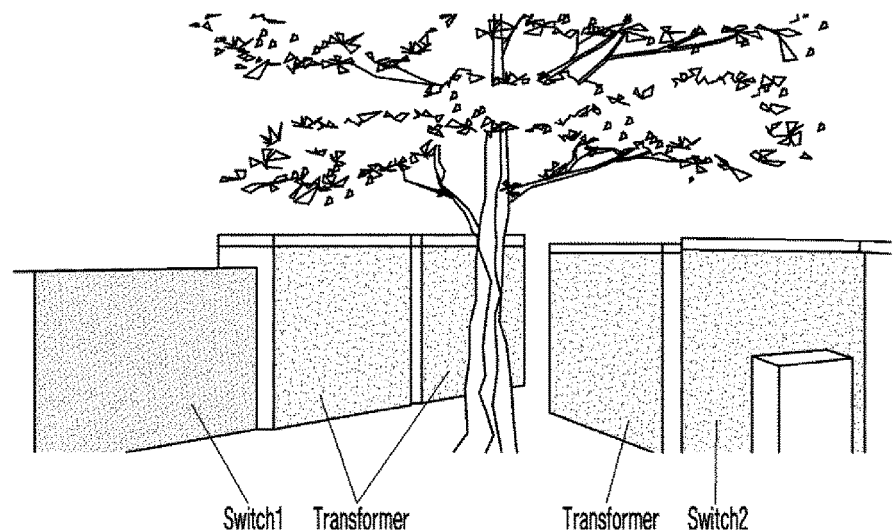
FIG. 11 shows multiple switches and transformers installed at one place in an urban area.

In the Republic of Korea, the MV (Medium Voltage) and LV (Low Voltage) feeder lines are buried while the switch gears and transformers are grouped on the ground in a place to reduce installation footprints in high density urban areas as shown in FIG. 11.

Figure 12:
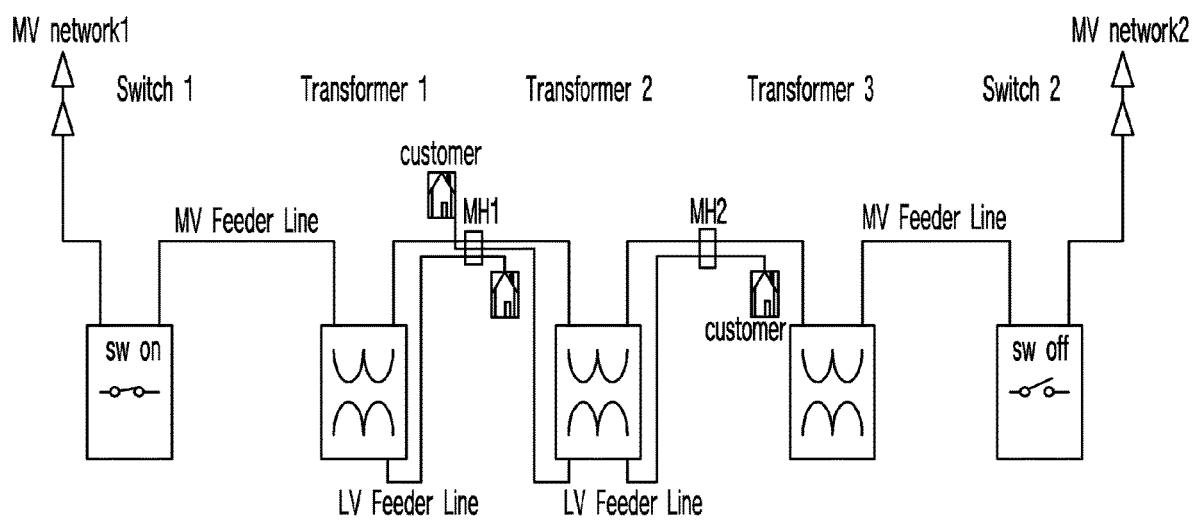
FIG. 12 illustrates a block diagram to show medium voltage (MV) and LV feeders, which are sharing a neutral wire in one system.

FIG. 12 shows a block diagram of the MV and LV feeder lines configured in the area shown in FIG. 11 that 3 pad mounted transformers are connected in series with a MV network through a SWI or a SW2 at each end. The figure shows that the MV is fed by SW1, and that each transformer steps down the MV to LV to supply AC mains to the end customers using the LV feeder lines which are installed in the same structures with MV feeder line(s) sharing the earth ground rod. The manhole 1 has 3 feeder lines including 1 MV and 2 LV sand 3 neutrals of the 3 different feeder lines jointed into an earth ground, which are susceptible to detour a returning load current to another path mostly depending on impedance and thus a flowing current could be highly fallible to locate the earth leaking section by measuring a vector sum current of a LV feeder in a system where a detoured neutral current is easily made and causes a current vector sum value which might be treated as a possible earth fault current to be investigated.

Thus, the present disclosure relates to an inventive technology which does not measure a return current (Ig) and a zero phase sequence current (10) in order to locate the earth leaking point like a conventional technology, however it provides means to detect a rising point of the AC mains and a DC survey voltage signals on the ground while moving along the trajectory of the phase conductors (electric wires) of the feeder lines and recording the earth potential in accordance with the location data.

Figure 13:
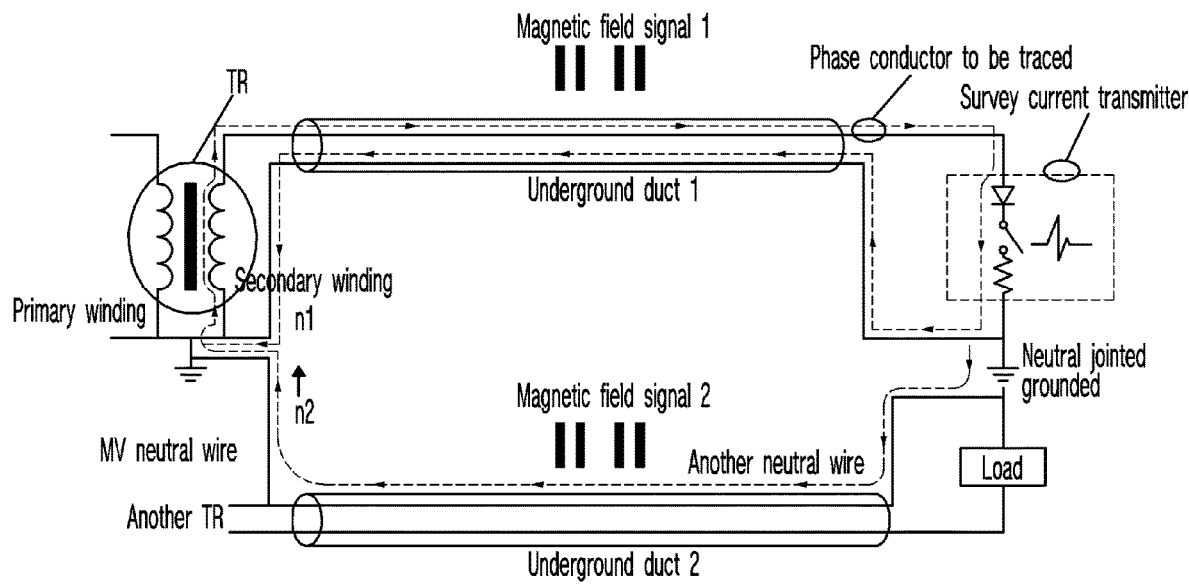
FIG. 13 is a circuit diagram illustrating detoured survey current signals at a PEN of a neutral grounded LV cable.

The survey current signal to trace the buried route of feeder line will have a same detoured returning phenomenon at the PENs like the returning load current does under the neutral ground environment when the survey current signal generated by momentary switching between the phase and neutral conductor wires through a diode and resistors connected in series by the survey current signal transmitter shown in FIG. 13, but the strength of the radiated electromagnetic (EM) signal from the detoured current is stronger than that from the feeder line to be traced which causes major source of error in determining the route of bypass neutral route as that of the feeder line which has a risk of electric shock to be accurately traced.

Figure 14:
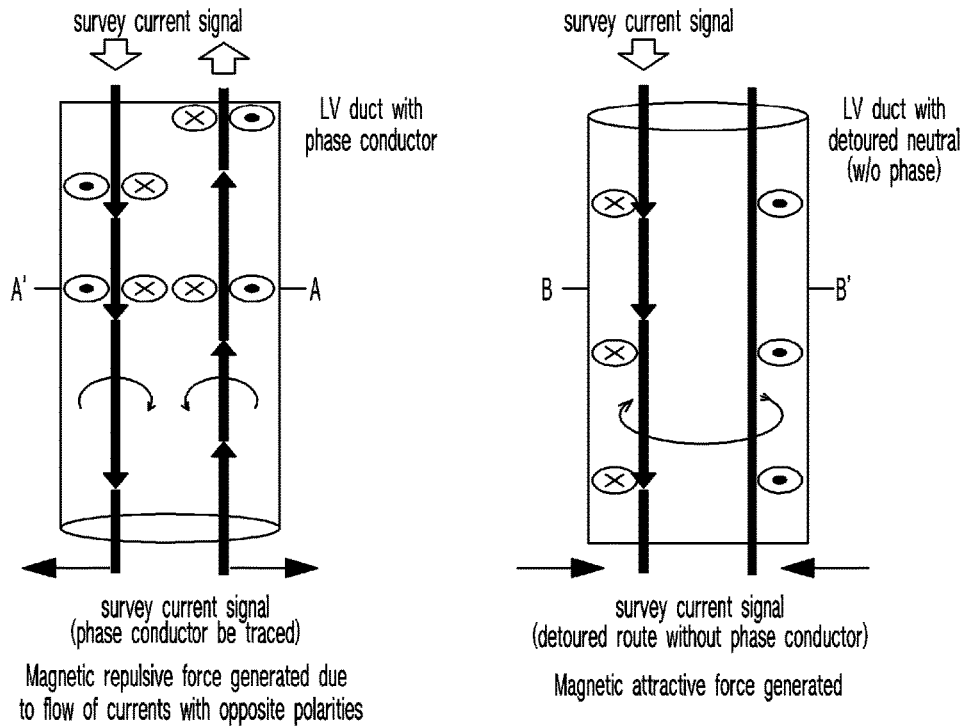
FIG. 14 illustrates a magnetic force relationship between 2 conductors and a single conductor to carry the survey current signal.

FIG. 14 shows a vertical sectional view of ducts of feeder lines, where the direction of the magnetic field around the conductor wire is perpendicular to the direction of the survey current flowing with the right hand rule, the one duct where a phase conductor wire must be traced and associated with a neutral conductor has two electromagnetic force circles around each conductor wire in opposite directions to exert the electromagnetic force to repel each other while the other duct with the detoured neutral conductor wire has a uni-directional magnetic field circle around the conductor wire without repulsion from the neighbors.

Figure 15:
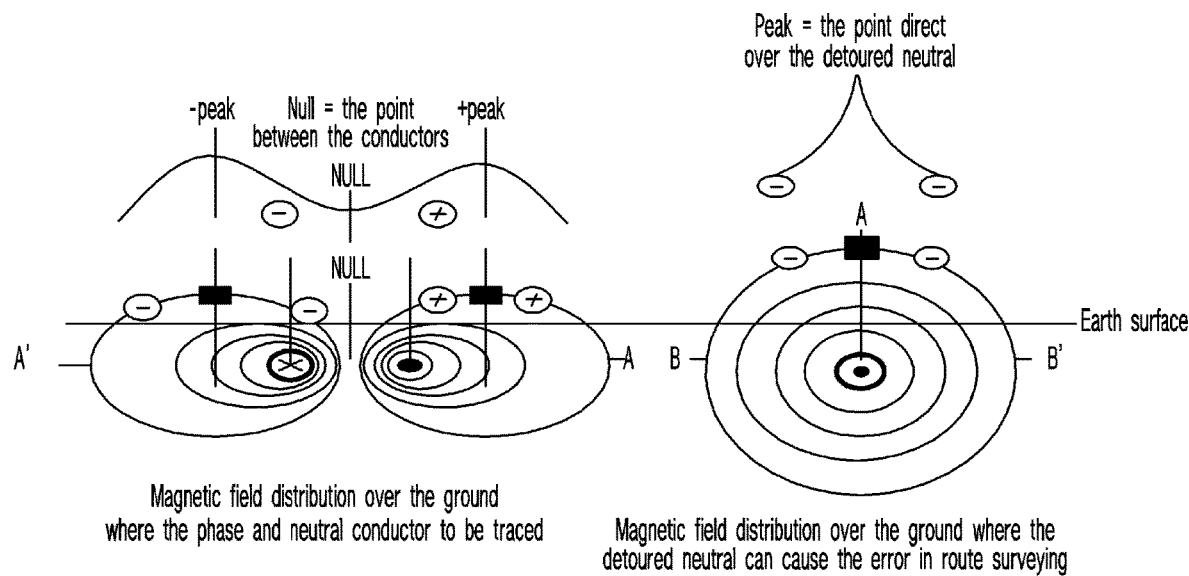
FIG. 15 illustrates a horizontal sectional view of magnetic fields in FIG. 14.

FIG. 15 are horizontal sectional views of the magnetic fields detected on the ground, showing the characteristics thereof.

A nulling point of magnetism disposed between the conductor wires with the different polarities makes a lower peak of the electromagnetic field as shown in section A-A' when surveyed on the ground, but section B-B' has a full peak of the concentric circles of magnetic field in a single polarity direction over the detoured neutral conductor wire without a nulling point as illustrated in the figure.

The repulsion between the phase and neutral conductor wires in the same duct makes the surveyor to mistakenly believe the route of the detoured neutral conductor wire as the phase conductor wire because the resultant of the electromagnetic fields from the latter is higher than that of the former and because tracing the feeder line mostly depends on the peak strength of the electromagnetic field over the ground to determine the route of the buried route of the feeder line.

Previously, in the prior art considered, nothing other than the position of the highest peak of the resultant of the magnetic field over the ground as the laying position of the feeder line was used to detect the location of conductor wires because the survey current flows only through the dedicated phase and neutral conductor wires of the feeder line. But after all neutral conductor wires in a system are joined to an earth ground rod to be easily detoured through another neutral conductor wire, in the present disclosure, two factors are considered to accurately trace the hot (phase) conductor wire of the feeder line instead of the peak detection at the points over the detoured neutral conductor. One is whether a weaker electromagnetic signal space, such as a null phenomenon, is detected between two stronger magnetic signals, and another is whether the two stronger signals have opposite polarities as shown in FIG. 15, in order to implement the present disclosure by positioning 4 ferrite coiled magnetic sensors 15 cm apart in horizon perpendicular to the direction of the buried route of the conductor wires as shown in FIG. 16 to catch the null of magnetism between the different polarity signals at a position, preferably 20 cm above the ground level to locate the duct where the phase and neutral conductor wires are disposed inside.

Figure 16:
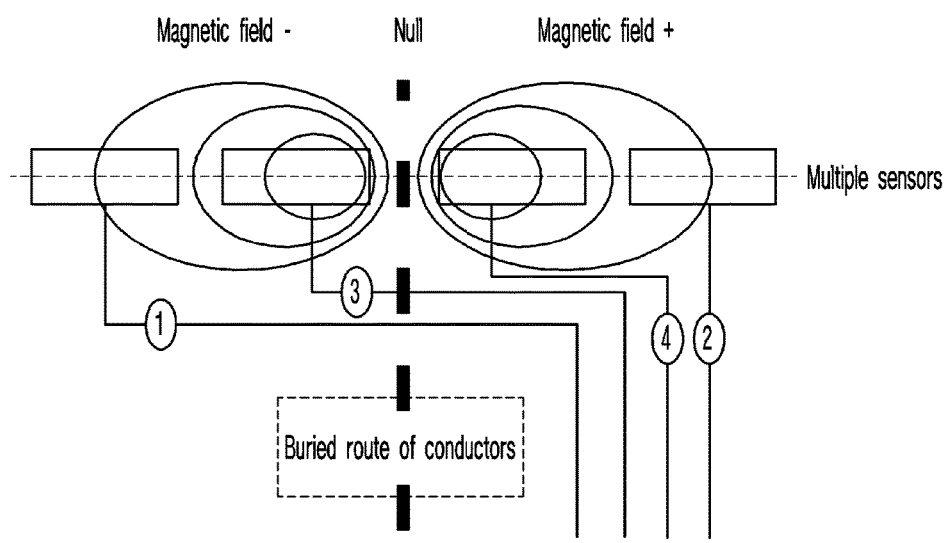
FIG. 16 illustrates an arrangement of multiple magnetic field sensors according to an embodiment of the present disclosure.
Figure 17:
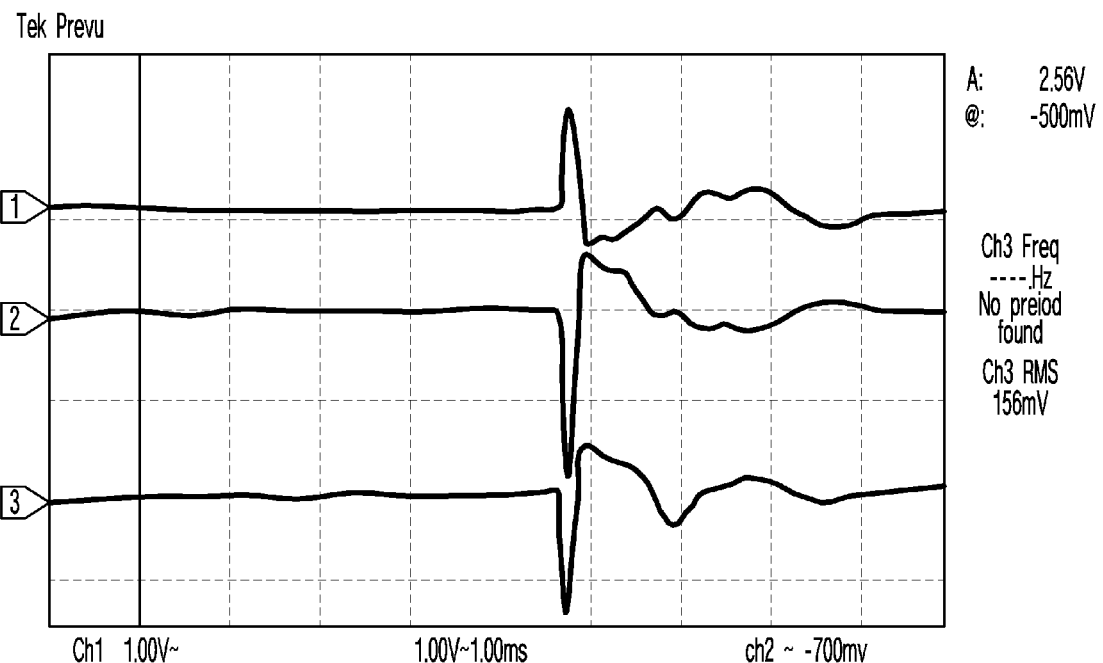
FIG. 17 illustrates a waveform of electromagnetic signals obtained over an underground duct with two opposite direction current flows.

FIG. 17 shows 3 waveforms of the electromagnetic signals generated by a survey current signal transmitter after removing the power frequency of the load current at a place directly over a duct containing phase and neutral conductor wires. Here, the arrangement of the electromagnetic sensors are in horizon, each position of the sensors shown in FIG. 16 is linked to the waveforms, where the top waveform is from the left sensor (①), the middle waveform is from the right sensor (②), the last one at bottom is from the middle sensor (③). The polarity of the waveform on top from sensor at the left side is positive +, while the other two from the middle and right side sensors are same as negative −. The location of the buried duct of the phase and neutral conductor wires is between the sensors of the different polarities ① (left) and ③ (middle).

Figure 18:
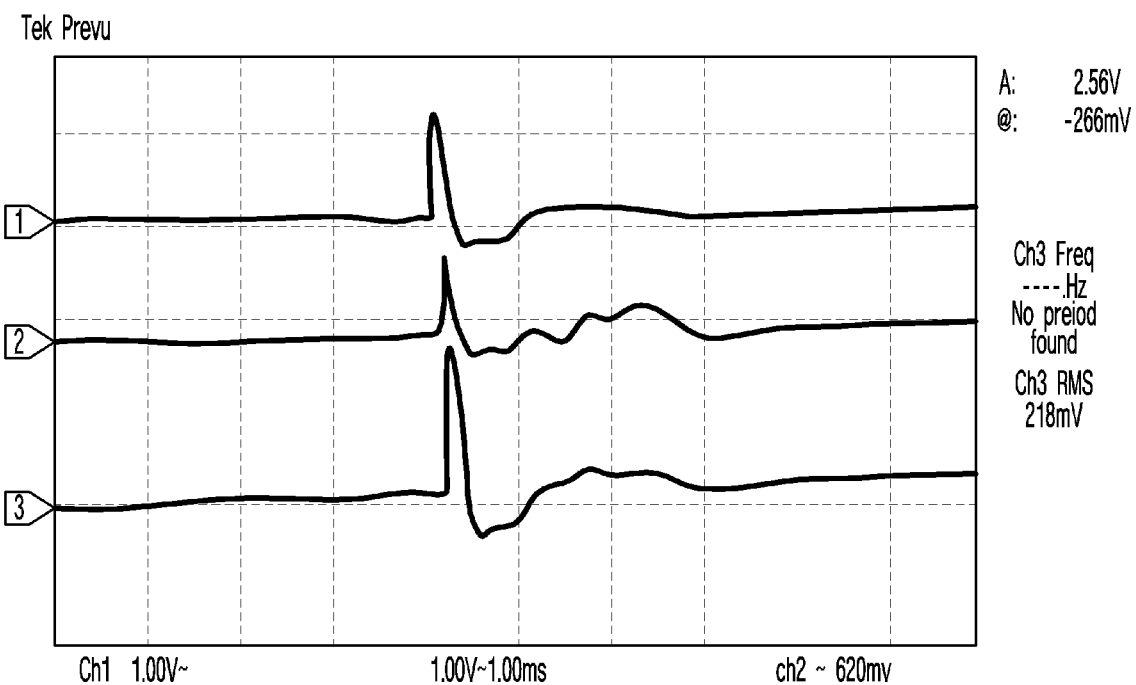
FIG. 18 illustrates a waveform of electromagnetic signals obtained over an underground duct where a single polarity current flows.

FIG. 18 shows the 3 waveforms over the duct of the detoured neutral conductor wire, where all of the three waveforms have all same polarity of +.

Figure 19:
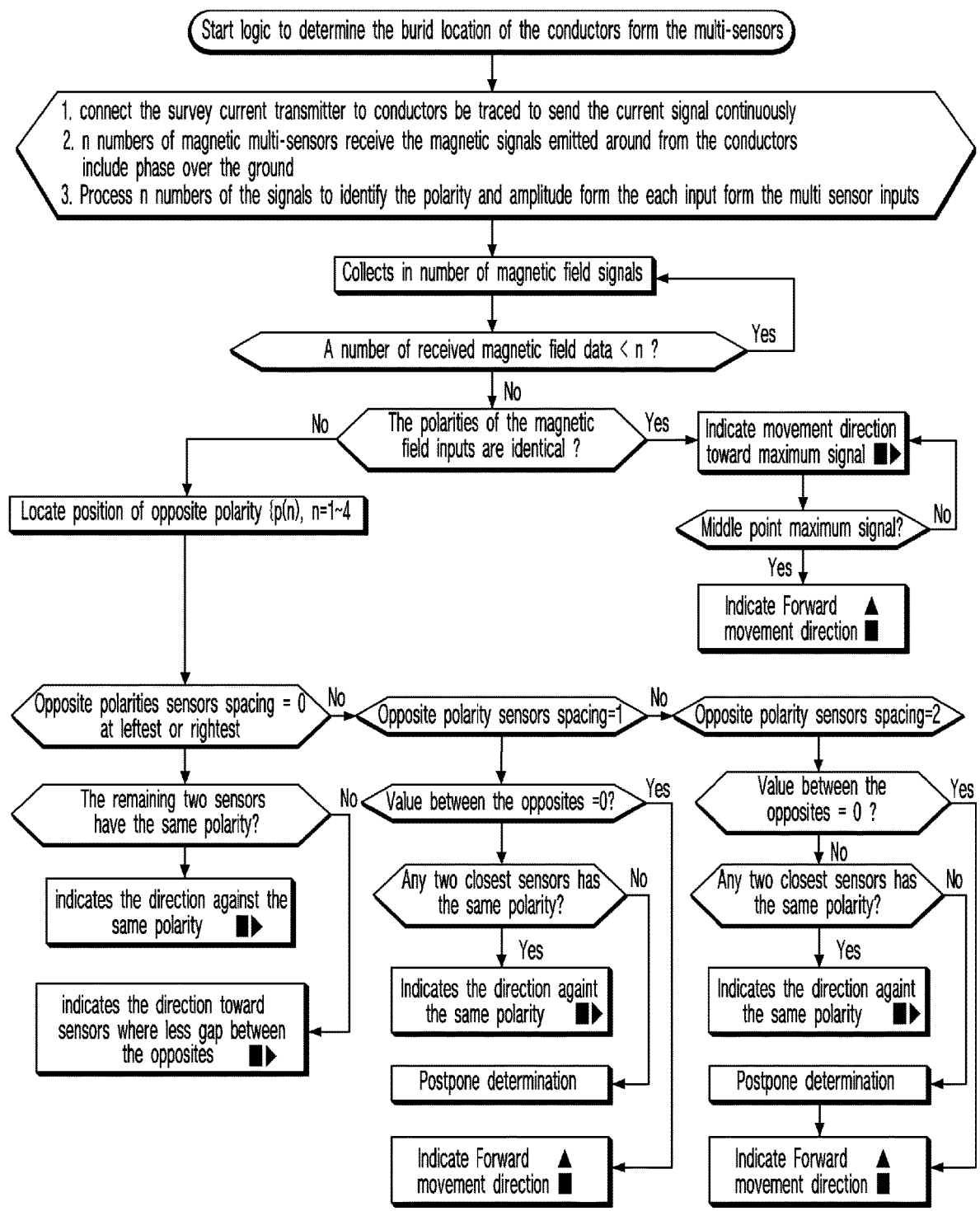
FIG. 19 is a flowchart illustrating a logic to determine the directions of buried paths of underground phase cables.

FIG. 19 is the flow charts of decision making to locate the phase conductor wire by analyzing the polarity and amplitude simultaneously of the signals from the multiple sensors to determine the buried route shown in FIG. 16. The highest priority of decision making is whether the incoming signals have the opposite polarities signals among the 4 inputs, determine the position is directly over the duct of phase and neutral conductor wires when the incoming signals have a weaker level caused by cancellation like a null between the opposite polarities, and then display an arrow to upward direction to move forward. For 2 pairs of same and opposite polarity signals without a space like a null among the inputs, the arrow against the same direction to move right or leftward is displayed. For 2 pairs of the opposite direction signals without a space, the arrow to a weaker opposite signal pair to horizontal move will be displayed. For signals without opposite but same polarities from the inputs, the arrow to a stronger sensor with a remark saying the current location is over the duct without a phase conductor wire (detoured route) will be displayed.

Figure 20:
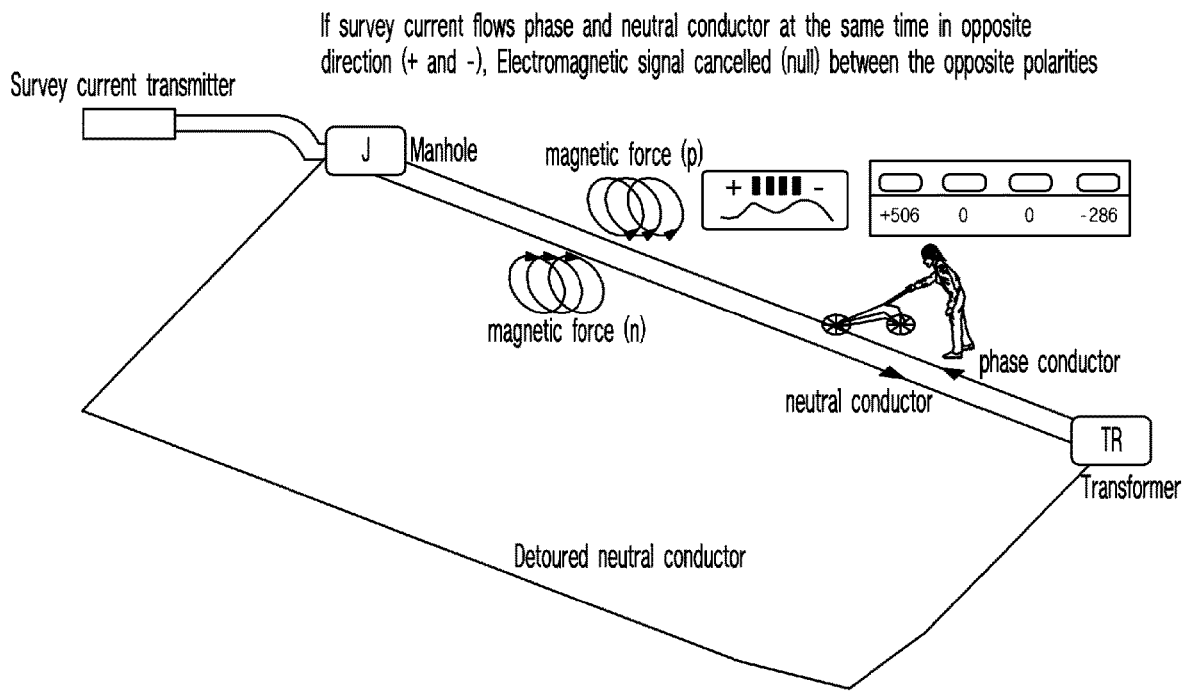
FIG. 20 illustrates a result of survey of an underground, buried path of a couple of phase and neutral wires according to an embodiment of the present disclosure.
Figure 21:
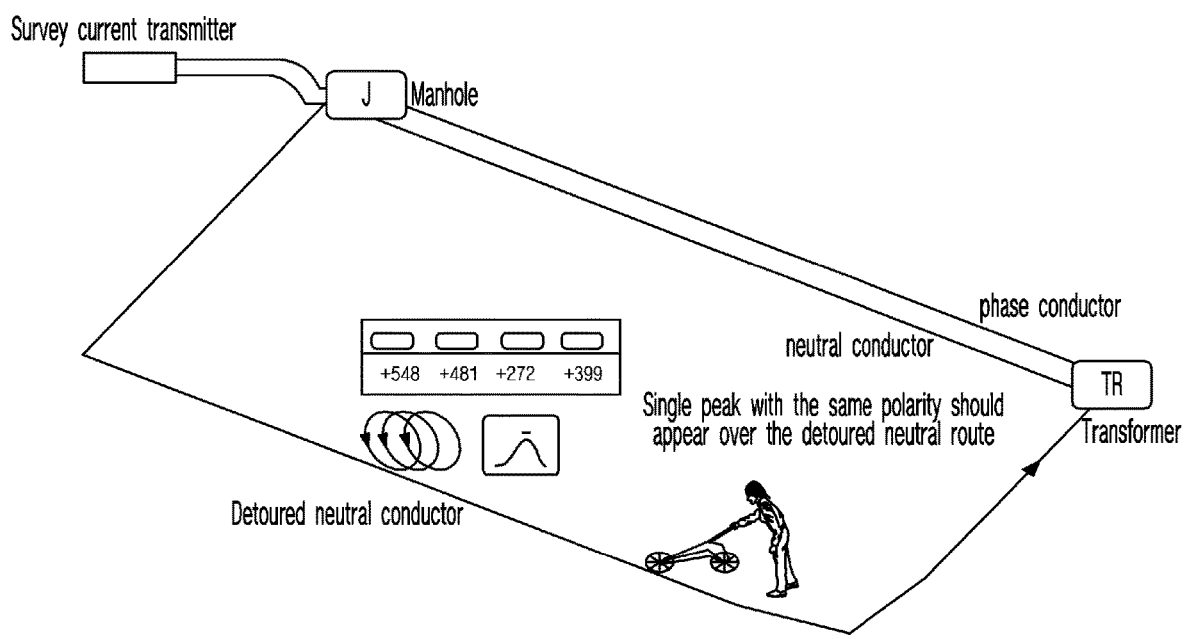
FIG. 21 illustrates a result of survey of an underground, buried path of a neutral wire according to an embodiment of the present disclosure.
Figure 25:
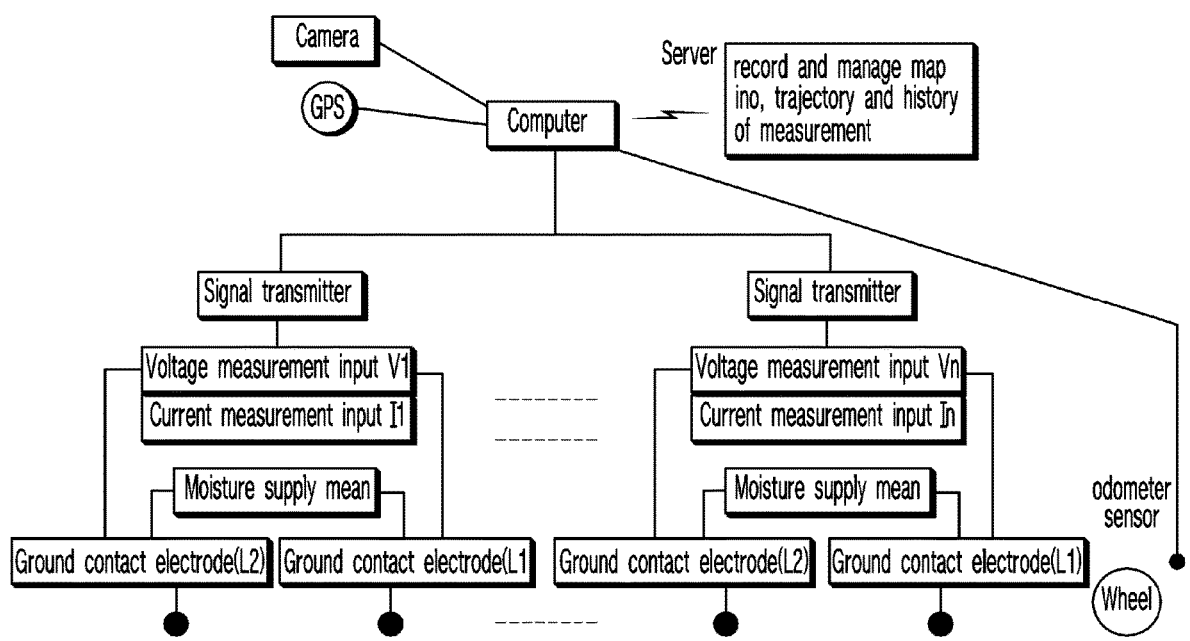
FIG. 25 is a block diagram illustrating a mobile ground potential measurement device according to an embodiment of the present disclosure.

FIG. 20 illustrates the survey result using the multi-sensor and decision making logic to detect the polarity of the electromagnetic signals from the sensors as shown in FIG. 16 and the decision making logic to determine the each point as shown in FIG. 19 over the ground extending whole route of buried feeder lines by following the null of the magnetism between the opposite polarity sensors as shown in FIG. 25, while FIG. 21 shows all input electromagnetic signals having the single polarity of + which denotes a detoured neutral or water line without the phase conductor wire to trace.

The embodiment of the route survey apparatus comprising multi-sensor inputs to trace the route of a buried feeder line by picking up the points of the null between the opposite direction signals by the decision making logic enables the surveyor to accurately locate the phase conductor wire which has potential to leak the dangerous voltage out to the earth instead of the zero potential detoured neutral conductor wire to prevent the electric shock accident by locating and removing the earth leaking source.

The present disclosure also discloses the method and apparatus to locate the earth leaking point by exploring the ground potential increasing point in which a leak is generated by any of degraded insulation of an electric wire while moving along the buried route of the feeder line using the route survey apparatus and method mentioned above.

Figure 22:
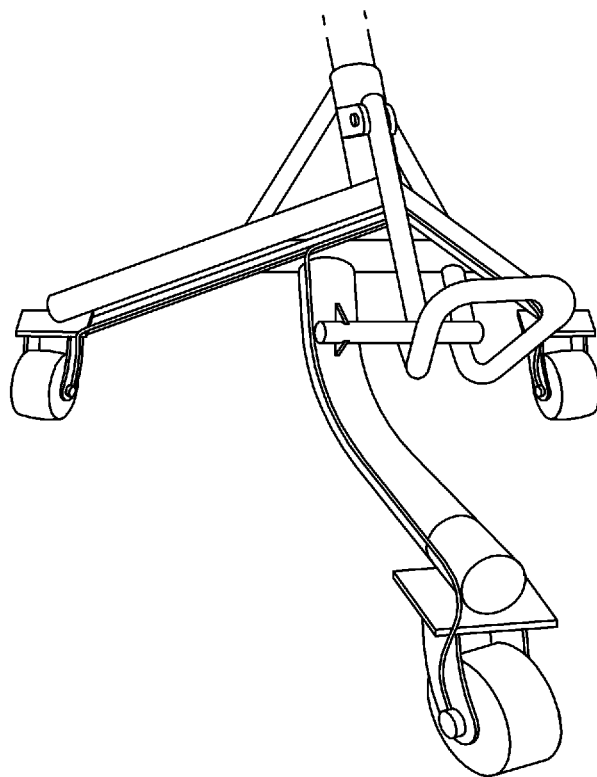
FIG. 22 illustrates metal wheel electrodes installed in a mobile ground potential detection device according to an embodiment of the present disclosure.
Figure 23:
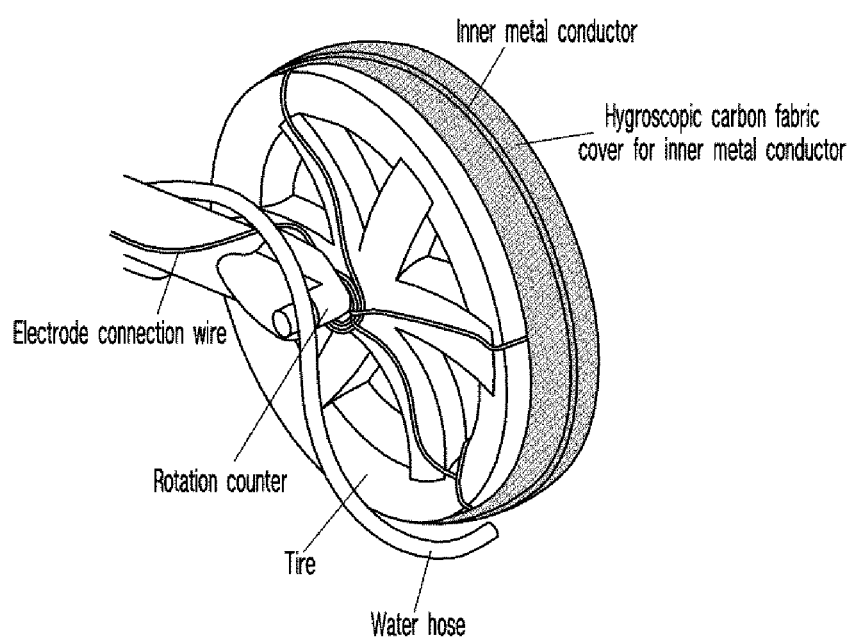
FIG. 23 illustrates a wet type wheel electrode covered with a carbon fiber fabric according to an embodiment of the present disclosure.

FIG. 10 shows a conventional portable earth potential device including an A-shaped frame with 2 electrode legs. An electrode has ends with a sharp tip to be forced down manually to the earth to minimize the contact resistance every time while measuring the earth potential and then a surveyor should walk to move the electrode along the feeder line which is a cumbersome and time consuming outside job. To speed up the measuring job, in an embodiment of the present disclosure, a plurality of metal wheel electrodes made of cast iron shown in FIG. 22 are provided, such that the metal wheel electrodes are configured to detect the earth potential increasing areas while rotating to move and directly touching the ground. However, in the above embodiment, the benefit of the new method of pushing the device with the metal wheel electrodes which measure the leaked voltages was lesser than expected because foreign substances like soil debris and dirt easily can adhere to the surface of metal wheels to block the electrical conduction between the earth and metal surface and furthermore the metal wheel may not have sufficient contact areas. To improve once again the problems with the solid metal wheels, in another embodiment of the present disclosure, as shown in FIG. 23, a metal conductor is wound up around an elastic vehicle tire and then a carbon fiber fabric with durability like Velcro hook is disposed on the metal conductor. Further, water is sprayed over the fabric by a pump, while moving along the route of the feeder line, such that the pump fed water can clean the dirt over the wheel and distribute the earth potential evenly over the fabric to measure the earth potential of AC mains.

Figure 24:
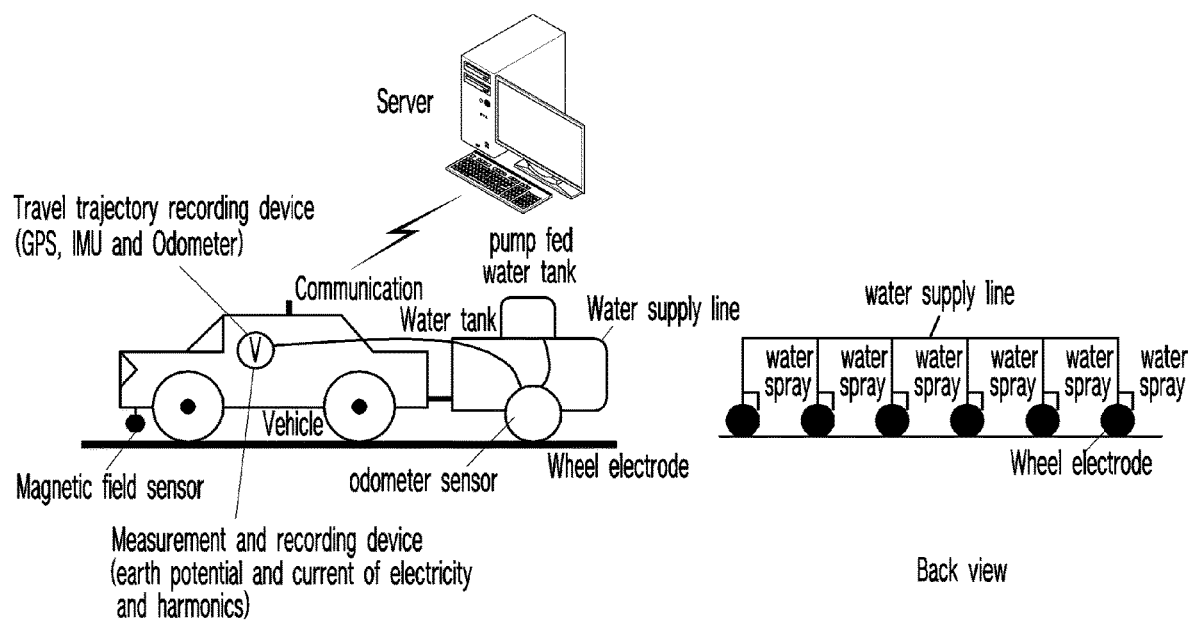
FIG. 24 is a diagram illustrating configuration of a ground potential measurement device for use in vehicles according to an embodiment of the present disclosure.

FIG. 24 is an example of an AC mains leakage scanning device for scanning wide areas, the device being attached to a SUV vehicle as a trailer equipped with multiple wet type wheel electrodes which are horizontally and widely arranged to scan the AC mains earth potential to quickly search hazardous places in a metro area like and to store the survey results and travel trajectory in the server via wireless communications.

FIG. 25 shows details of the wide area AC mains leakage scanning device to make production of the sample as shown in FIG. 24, driving the vehicle to follow the buried route map of the feeder lines or following the electromagnetic sensing signal to measure the values of voltage and current of AC mains by the ground touching wet type wheel electrodes. FIG. 26 shows the contents of the sample database to be stored and managed including the values of voltage and current of AC mains between 8 water fed wet type wheel electrodes, location data and weather information, the reason that monitoring the voltage and current together while moving is simpler and quicker way to determine the increased potential is truly from the leakage of AC mains without stopping to verify the earth potential by changing the internal impedance.

It is another database of GPS trajectory of travel by the vehicle in FIG. 27, which is a location data link to the measuring values respectively shown in FIG. 26.

Figure 28:
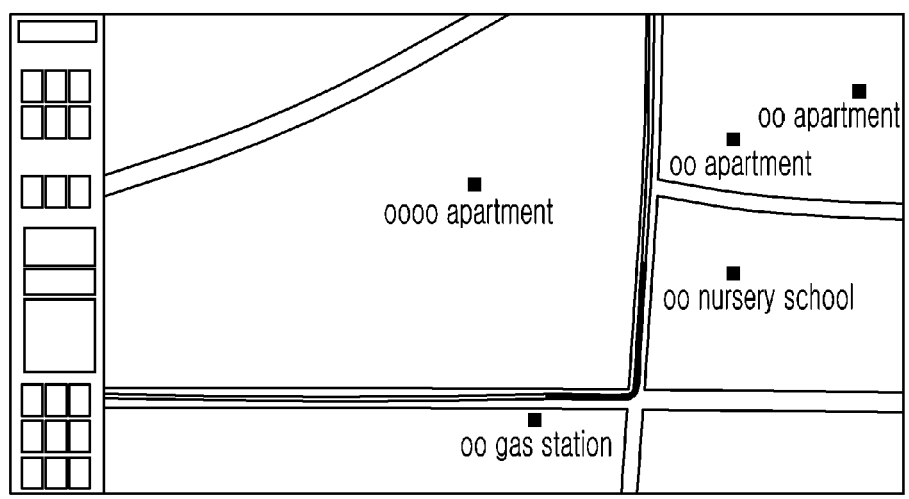
FIG. 28 illustrates a map for marking ground potential value information for respective locations using colors according to an embodiment of the present disclosure.

FIG. 28 is the sample of the color plotting trajectory over the map using both database of measured value and coordinate movement data shown in FIGS. 27 and 28. The color of each spot in the coordinate plane on the map represents the value of earth potential and current from the wet type wheel electrodes at the point of measured location.

After quick scanning of earth potential increasing area by the wide area AC mains leakage scanning device to locate a suspicious earth leaking section of AC mains possibly caused by a buried conductor wires of the feeder lines which have a poor quality of insulation, conduct the accurate earth leaking point survey at the area of suspicious earth leaking section to perform the maintenance job such as excavation to repair faulty conductor wires.

Figure 29:
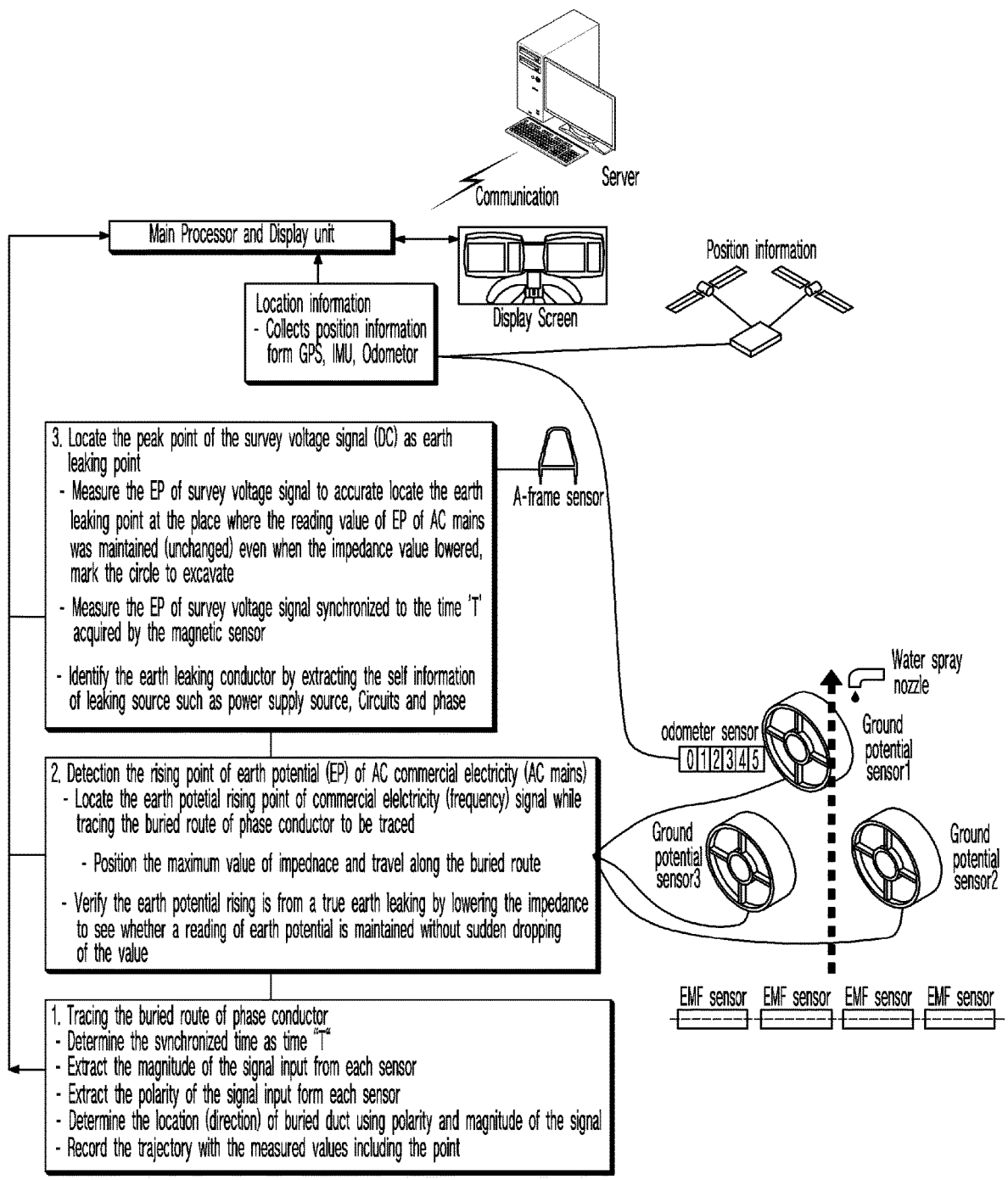
FIG. 29 is a block diagram illustrating an accurate earth leak point survey apparatus according to an embodiment of the present disclosure.
Figure 44:
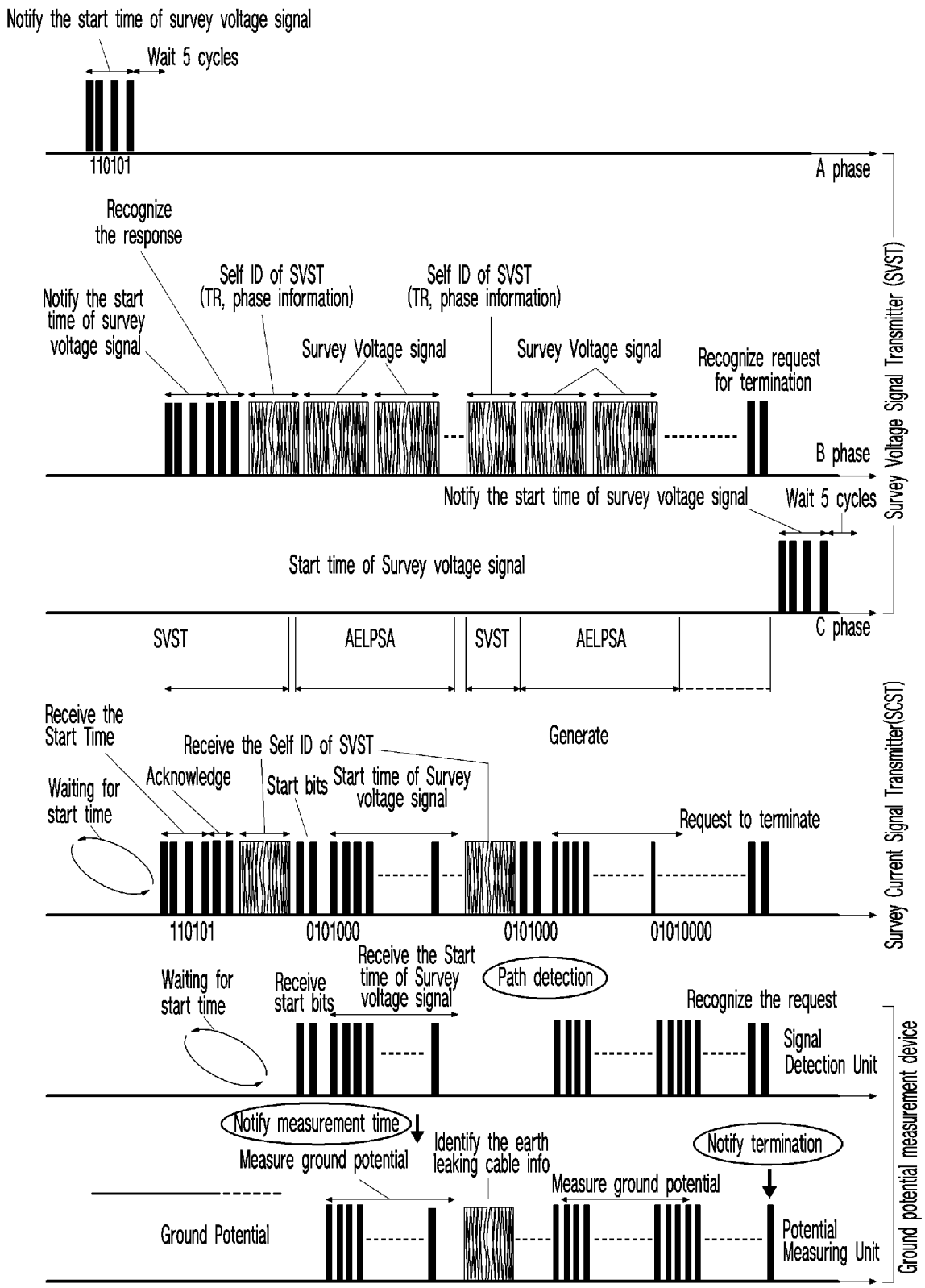
FIG. 44 is a diagram illustrating a protocol for a time synchronization inside an electric leakage detection device according to an embodiment of the present disclosure.

FIG. 29 shows an embodiment of the accurate earth leaking point survey apparatus to pinpoint the accurate location of earth leaking point using a push cart equipped with 3 wet type electrode wheels and moisture supply means. After getting the results of the quick scanning the earth potential increasing area by the wide area AC mains leakage scanning device shown in FIG. 28, an earth leaking point precision survey is followed by the hand push type accurate earth leaking point survey apparatus at a suspicious location, when the time initiation protocol described in FIG. 44 or non-repeating signal chains like '01010000' described in a flow chart in FIG. 61 as a true time 'T' generated by a survey current signal transmitter. As soon as getting the time 'T', the accurate earth leaking point survey apparatus resets a timer to synchronize the time of signal creation and reading time between the survey current transmitter and accurate earth leaking point survey apparatus to initiate the discrete period time and interval time to catch both the electromagnetic signals over the ground by picking up the null phenomenon between the two opposite polarities and the earth potential increasing voltage of AC mains between the 3 wet type wheel electrodes. As shown in FIG. 44, the incoming voltage signals from the electrodes are filtered to pass the frequency between 30-300 Hz which can fully cover the AC mains voltage; then signal that the filtered signal reached to the voltmeter (ADC) via an impedance logic, when an input potential is higher than a threshold while connecting to the highest value of impedance logic; verify that the increased potential is whether truly leaked from the AC mains source if the voltage reading is stable even after lowering the value of impedance in 3 steps; locate the highest potential increasing point of AC mains using the 3 electrodes detecting job flow diagram shown in FIGS. 48-51; finalize the point of highest potential increase of AC mains using a DC survey voltage injected into the conductor wires by comparing the direction of DC polarity when the logic value is '1'; and find the leaking sources of AC mains by reading the information encoded in the DC survey voltage signal without excavation.

In brief, the job locating the earth leaking point has 4 steps to follow in the suspicious area of earth leaking detected by the wide area AC mains scanner or without prior scanning as follows: (1) tracing the buried route of a phase conductor wire by collecting the polarities and magnitude of electromagnetic signals over the ground; (2) locating the earth potential increasing point while tracing the buried route of the phase conductor wire; (3) finalizing the earth leaking point by capturing the leaked DC survey voltage from a leak source of AC mains; and (4) finding the leak source by analyzing the codes in the leaked DC survey voltage on the ground.

The wide area AC mains leakage scanning device can scan the region without tracing of the burial path of conductor wires, but can travel quickly along the expected burial route depending on the map to scan the earth potential voltage and current together using a plurality of electrodes in horizon which are wide enough to identify the suspicious section where possibly earth leaking might be happening. After finding the suspicious section of earth voltage leaking, the accurate earth leaking point survey apparatus can be used to accurately pinpoint the location of leaking source of AC mains while walking along the burial route of phase conductor wires.

To locate the accurate point where the earth leaking is happening from the source of AC mains, a surveyor can walk along the points of null signals over the ground and measure the earth potential of AC mains between the wet type wheel electrodes and stop at the place where the earth potential is exceeding the alert level to verify whether the input potential is truly leaking from the AC mains, if the point of the earth potential elevated has a stable potential reading while impedance is lowering, finalize that the point is the leaking point of AC mains when the DC survey voltage shows the same peak, and identify the AC mains information by analyzing the DC survey voltage code to remove the earth leaking source without the civil works. To further improve the accuracy of survey, the present disclosure employs the time synchronization between the accurate earth leaking point survey apparatus and DC survey voltage and DC current transmitter.

Figure 30:
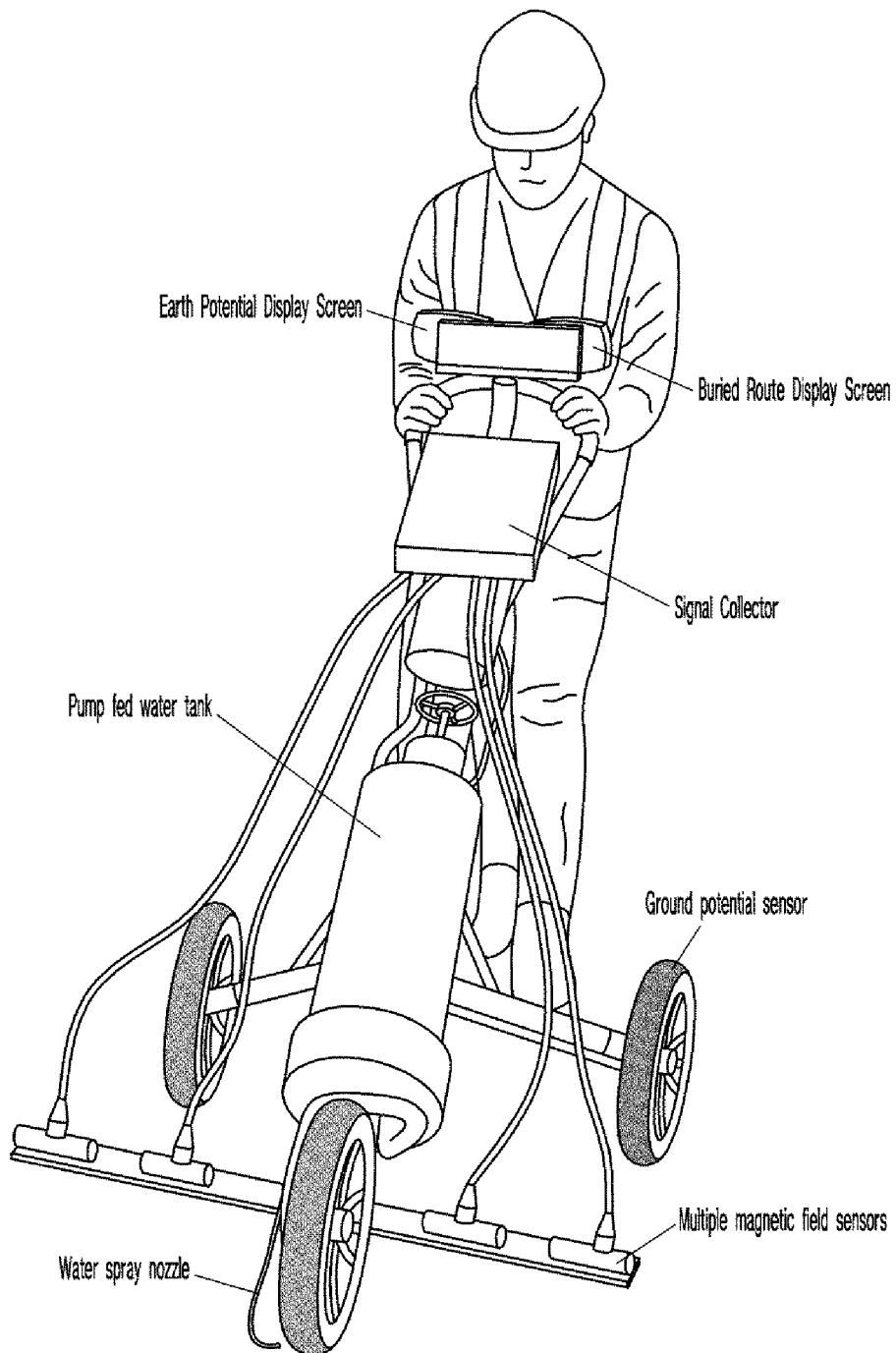
FIG. 30 is a photograph showing an example of an accurate earth leak point survey apparatus according to an embodiment of the present disclosure.

FIG. 30 shows an example of the accurate earth leaking point survey apparatus explained above.

A vehicle includes a conductive metal wire spirally wound around the outer periphery of a rubber tire as an electrode to scan the earth potential of the ground touched by the tire load and a water pump fed spray nozzle to remove the foreign substance on the surface of the electrode and distribute the earth potential evenly around the electrode. The vehicle can travel much faster than the conventional electrode which has sharp tips to be pressed manually at each measurement location toward the ground while performing the task to detect the elevated location of earth potential. And furthermore the vehicle can store the earth potential and current information with the respective location data together into the server to be used for managing and analyzing purposes.

In this way, the database stored in the server would be used when conducting the analysis to view the trend of earth potential increases at the point where the earth leaking is detected.

Figure 31:
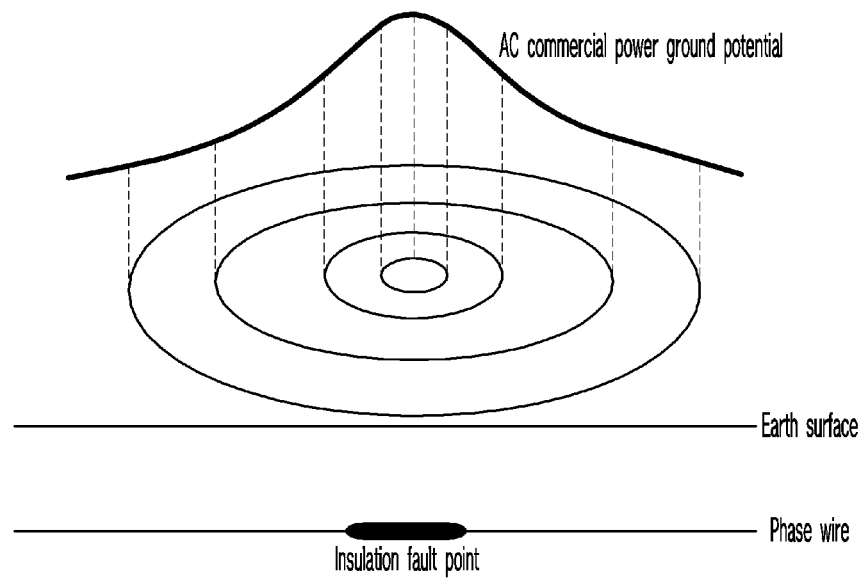
FIG. 31 illustrates an earth potential of AC commercial power voltage detected on the ground from a neutral ungrounded LV cable.
Figure 32:
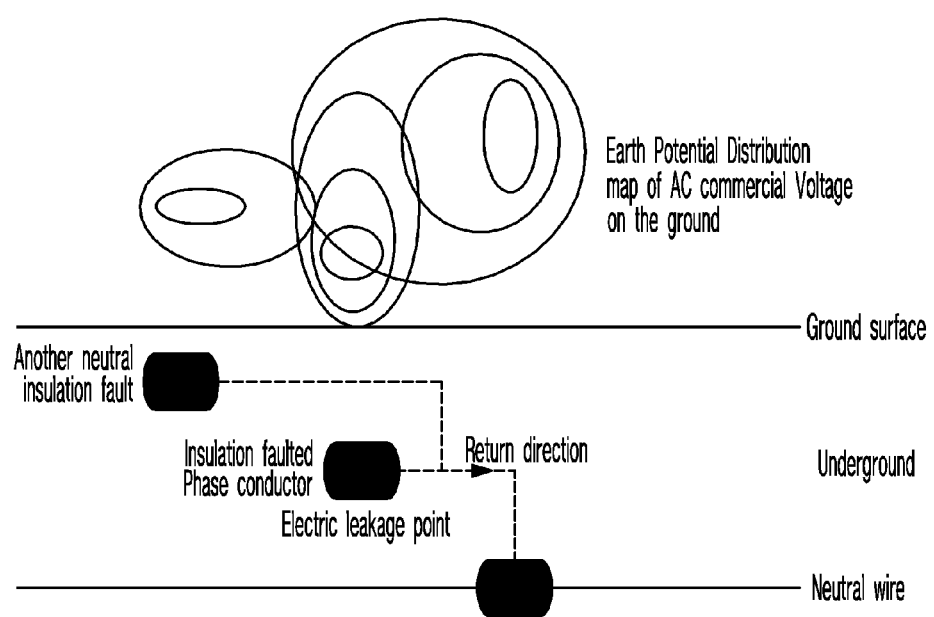
FIG. 32 illustrates an earth potential of AC commercial power voltage detected on the ground from a neutral grounded LV cable.
Figure 33:
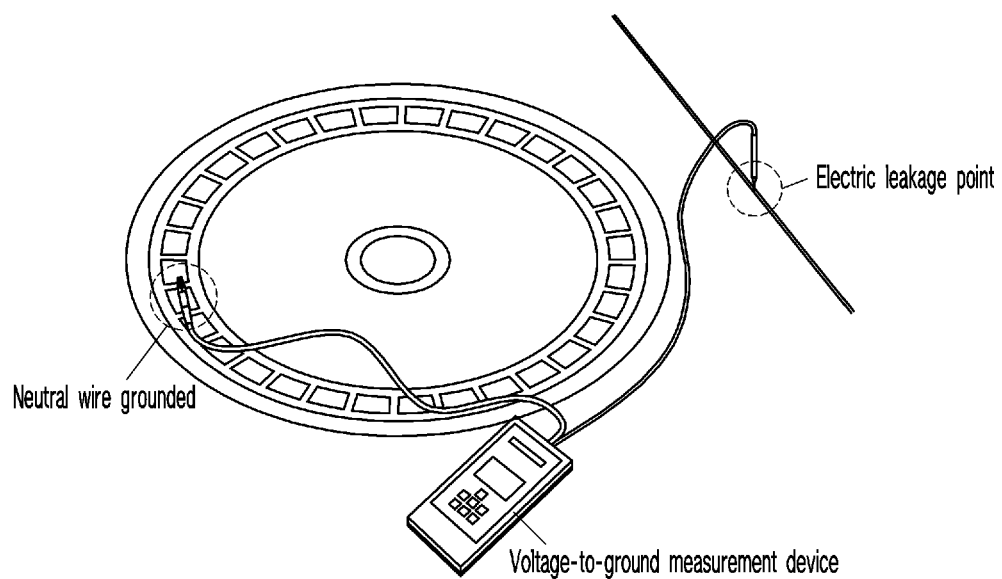
FIG. 33 is a photograph showing a measurement of electric leakage at a place near a neutral grounded manhole.

FIG. 31 shows the earth potential increasing level of AC mains near the earth leaking point where the neutral wire is not grounded and thus only the leaking voltage of AC mains is considered, which is not complex to find a location around the single peak point, but the increasing level of earth potential where the neutral wire is grounded and the multiple peaks of earth potential are spread around the PEN, leaking point of AC mains (phase conductor wire) and another neutral return point (neutral conductor wire) are mixed together due to multiple return paths of leaked and load currents shown in FIG. 32 and thus it is not easy to locate the peak level of AC mains. FIG. 33 shows an earth leaking point near a manhole and a captured waveform of the earth potential shown in FIG. 34 between the manhole cover bonded to a neutral wire and the earth leaking point. The waveform of pure AC mains is hidden in the waveform of the multiple peaks, and thus it is not possible to catch the zero crossing time to detect the peak level of the AC mains precisely.

Figure 34:
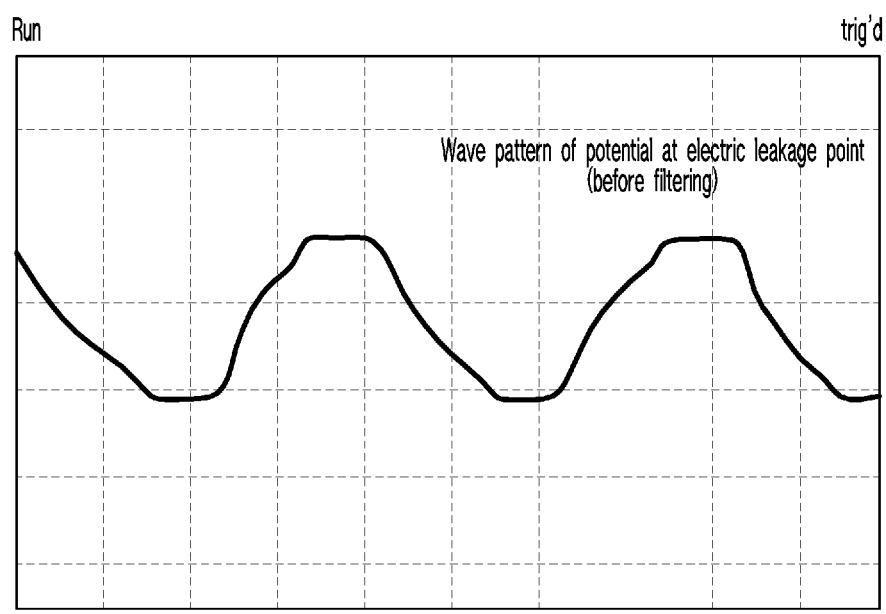
FIG. 34 shows an earth potential of AC commercial power obtained at the place of FIG. 33.

In order to overcome these difficulties, when locating the earth leaking point of AC mains, caused from the distorted waveform shown in FIG. 34, it is preferred, in an embodiment of the present disclosure, to send a DC impulsive survey voltage signal through the phase conductor wire to improve the accuracy of survey to locate the earth voltage leaking point.

Figure 35:
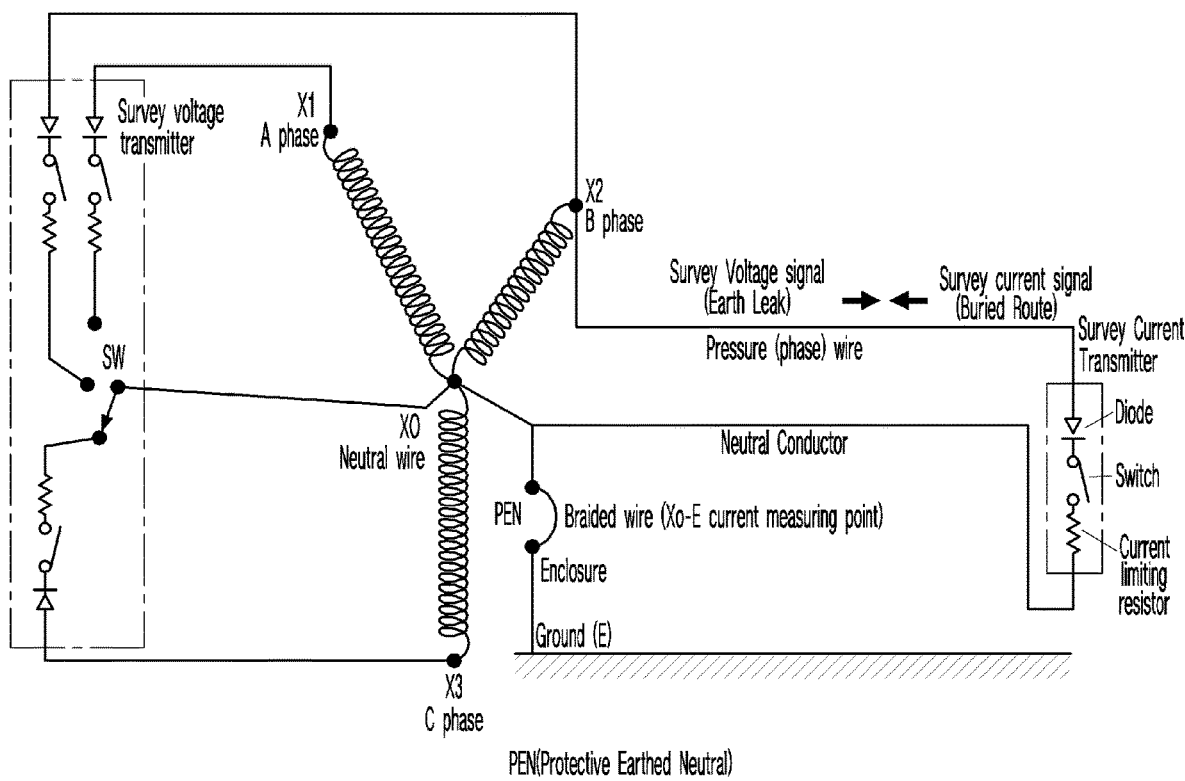
FIG. 35 is a circuit diagram illustrating a connection of a survey voltage and current transmitter to a neutral grounded LV distribution line.
Figure 36:
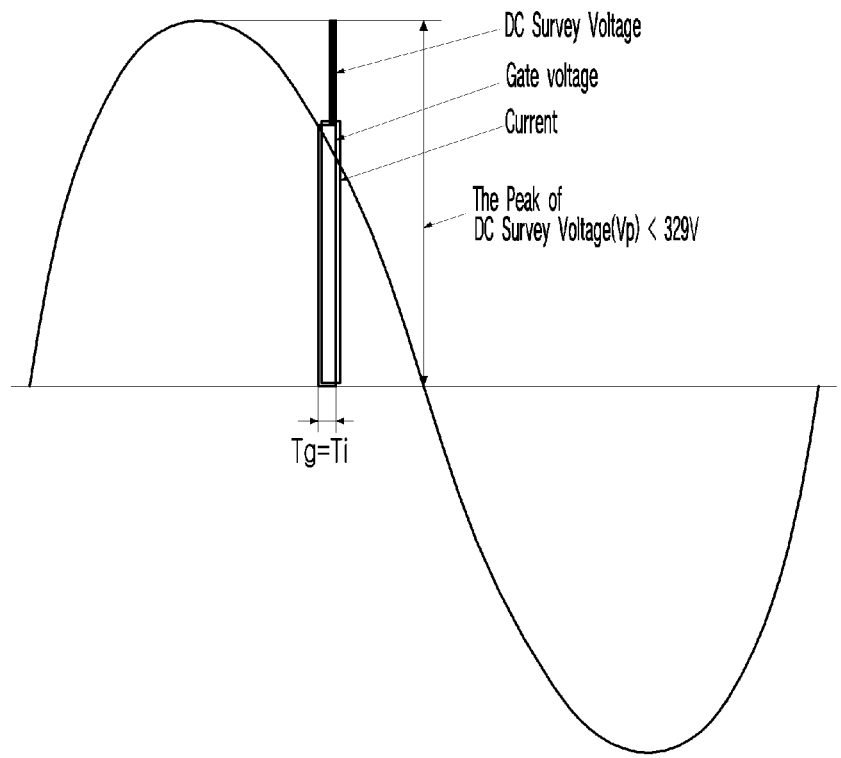
FIG. 36 is a diagram illustrating a relationship between a survey voltage signal and a gate voltage of Insulated Gate Bipolar Transistor (IGBT) according to an embodiment of the present disclosure.

FIG. 35 shows a circuit drawing of a DC survey voltage transmitter which can generate the impulsive voltage signal shown in FIG. 36. This DC survey voltage transmitter is added to the feeder line to be surveyed together with the DC survey current transmitter shown in FIG. 13. Locating the earth leaking point by detecting the peak of the DC survey voltage could improve the accuracy of locating the AC mains peak.

The DC survey voltage transmitter configured to generate a half-wave DC voltage signal between the phase and neutral conductor wires can be installed wherever close to the leaking point regardless a source or load side of the feeder line and adjustable to a single or a three-phase configuration.

FIG. 36 shows a time chart to generate the half-wave DC survey voltage signal. After applying the turn-on voltage to the gate of IGBT (Insulated gate bipolar transistor) by turning on a switch of the voltage transmitter during the time of Tg, remove the applied voltage to the gate of IGBT by turning off the switch momentarily to generate a big impulsive current (Ti) between the phase and neutral conductor wires. At the moment of cutting the flowing current sharply by removing the gate voltage of IGBT as discussed above, a uni-polar transient voltage (Vp) occurs between the same conductor wires of current flow.

Figure 37:
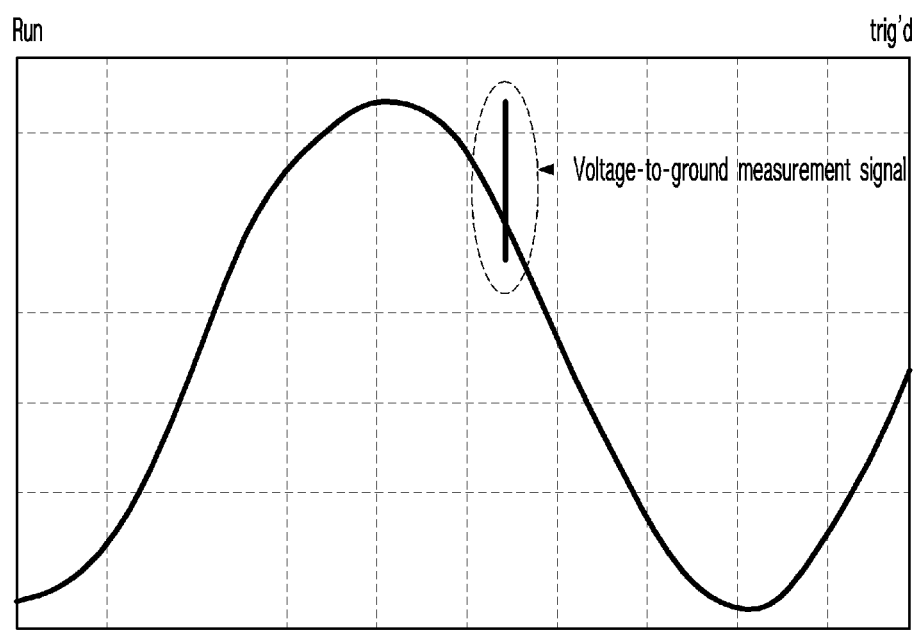
FIG. 37 is a photograph illustrating a DC survey voltage signal according to an embodiment of the present disclosure.

FIG. 37 shows a waveform of the DC survey voltage (transient voltage), which is the uni-polar and maximum voltage at an output terminal of the voltage transmitter where the voltage is maintained under 320V by regulation. In Korea, the voltage range of AC mains is 220±13V and the maximum allowable peak voltage of AC mains should be less than 329V (233 rms ACV*1.414).

Figure 38:
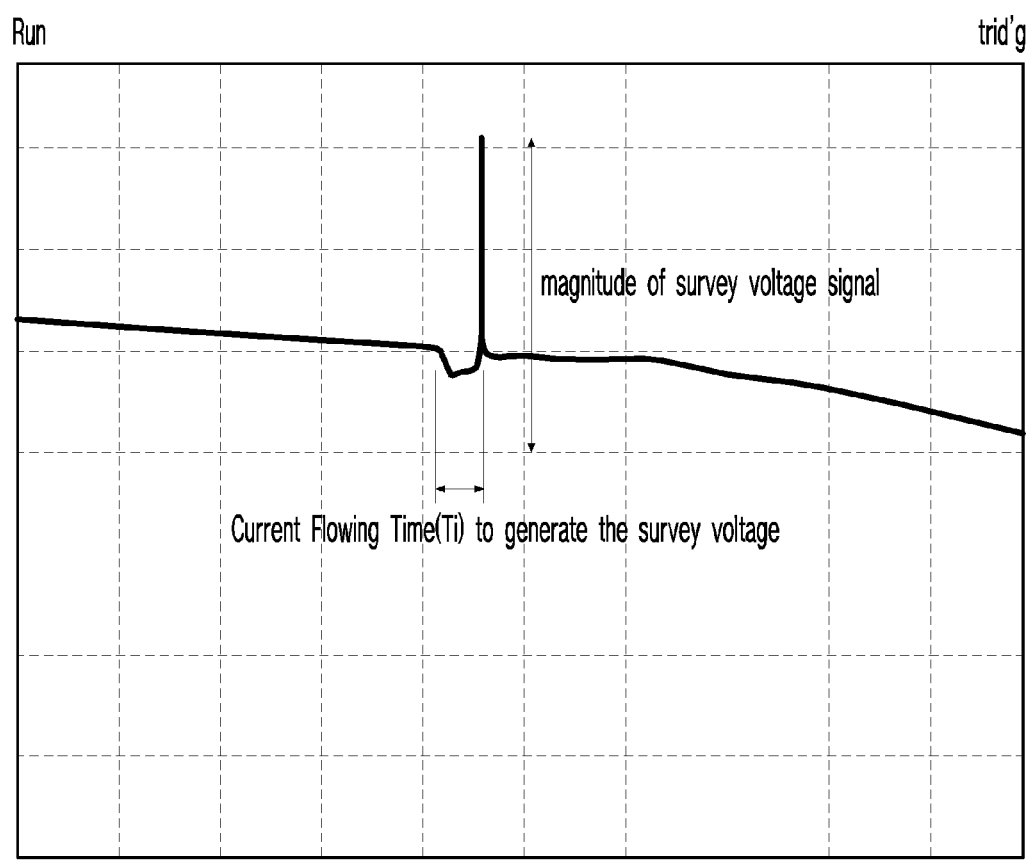
FIG. 38 is a photograph showing an enlarged view of a waveform of FIG. 37.

FIG. 38 is the enlarged waveform of the DC survey voltage from the FIG. 37. The gate turned on time of Tg is almost same as the current flowing time (Ti) which is around 40 microsecond to generate the DC transient voltage of about 320V maximum.

Figure 39:
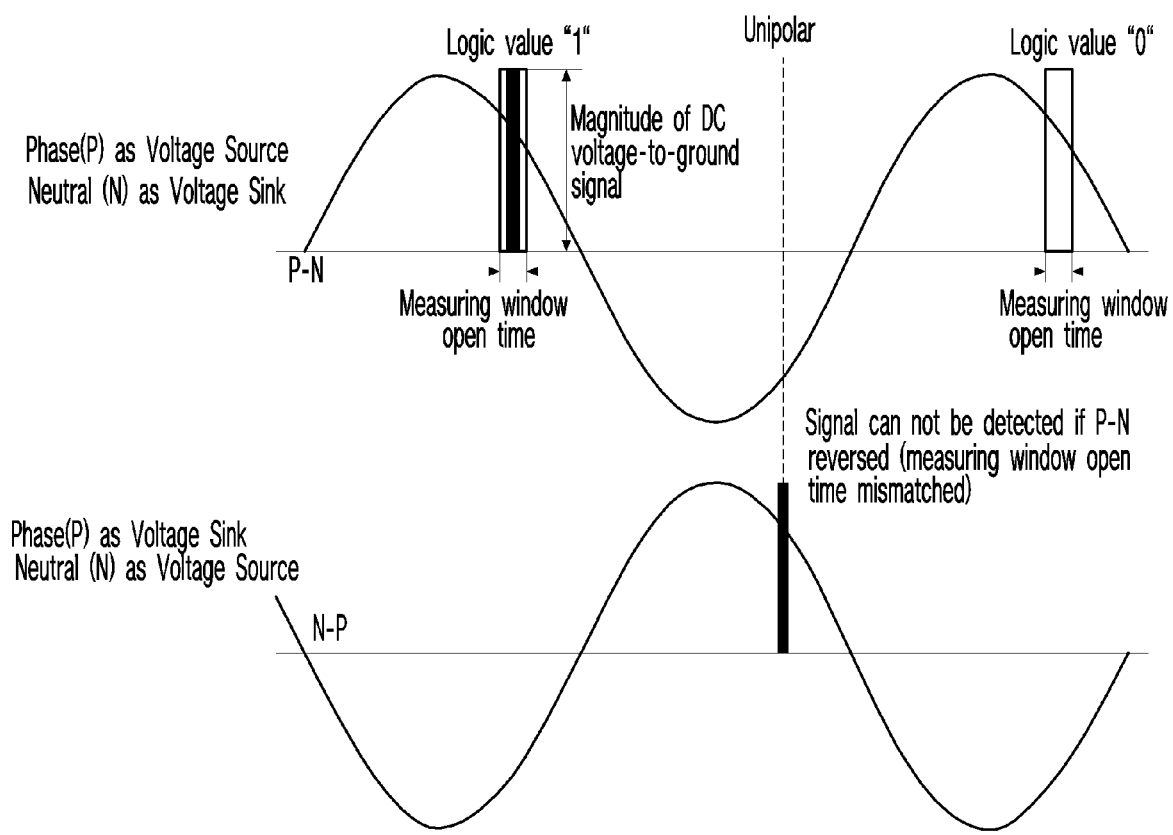
FIG. 39 is a diagram illustrating a reason for which a DC voltage-to-ground signal is generated only on a phase conductor wire.

FIG. 39 shows a case where transmitting the uni-polar DC survey voltage signal reversely when the DC survey voltage transmitter is connected to a neutral wire. A receiver in a vehicle mounted with an earth leaking locator opens the measuring window of DC survey voltage signal at a specific elapsed time between the positive slope zero crossing of AC mains and the firing time of IGBT. The top in the FIG. 39 shows the voltage waveform of the AC mains and a DC survey voltage pulse just in time to match the logic value of '10' between the transmitter and the earth potential locator (receiver). But the bottom shows a voltage waveform reversed by 180 degree where, even the transmitter generates the DC survey voltage same as at the elapsed time from the zero crossing 180 degree delayed, the voltage pulse generating time would not match the receiver's measuring time and finally the earth leaking locator (receiver) would fail to catch the signal pulse generated by the transmitter. To guarantee the DC survey voltage signal to be delivered to the receiver without an error, another time reference like the zero crossing in the AC mains between the transmitter and receiver to locate the DC survey voltage peak and identify the leaking source of AC mains is needed.

Figure 40:
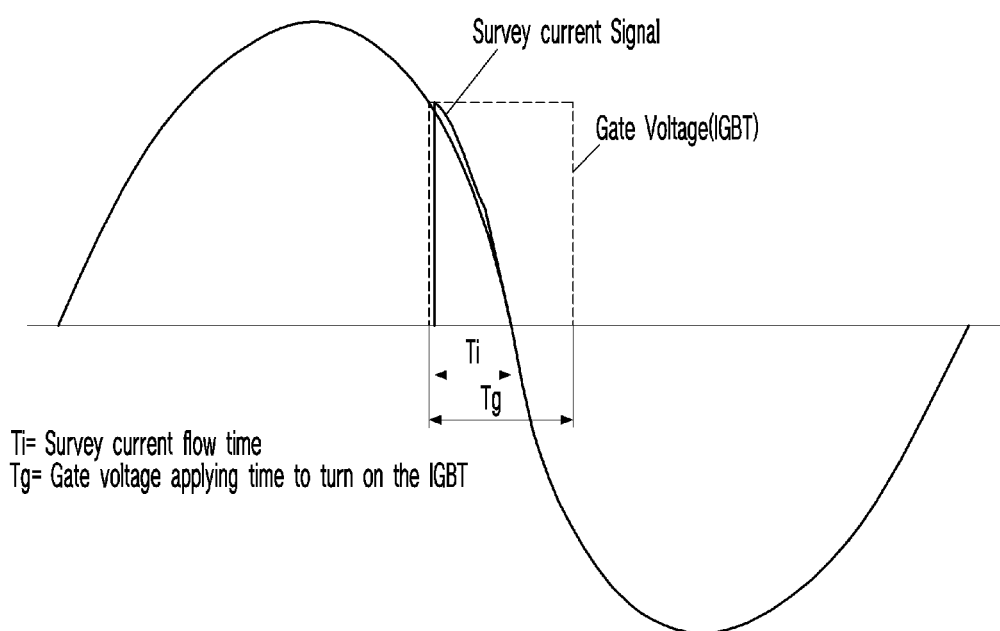
FIG. 40 is a diagram illustrating a relationship between a survey current signal and a gate voltage of IGBT according to an embodiment of the present disclosure.

FIG. 40 shows a time chart to generate a DC survey current signal created by a DC survey current transmitter shown in the left side of FIG. 35, to synchronize the transmitting and measuring times between the transmitter and receiver, and to minimize the measuring errors. Similar to the time chart of DC survey voltage shown in FIG. 36, except that the switch off time of IGBT is after the negative slope zero crossing which means the negative polarity of current is cut by the diode to minimize the cut off surge voltage. When applying the turned-on voltage during the time of Tg to the gate of IGBT, the switch is turned on until a time (Ti) after the negative slope zero crossing time. A difference from the voltage transmitter as shown in FIG. 36 is that the cut off transient voltage would not be generated because the cutting voltage (Vp) is almost 0V as the diode and the turned-on gate time (Tg) and the current flowing time (Ti) are not same as in the voltage transmitter of FIG. 36. The characteristics of the survey current and voltage signals are different not to interfere each other.

Figure 41:
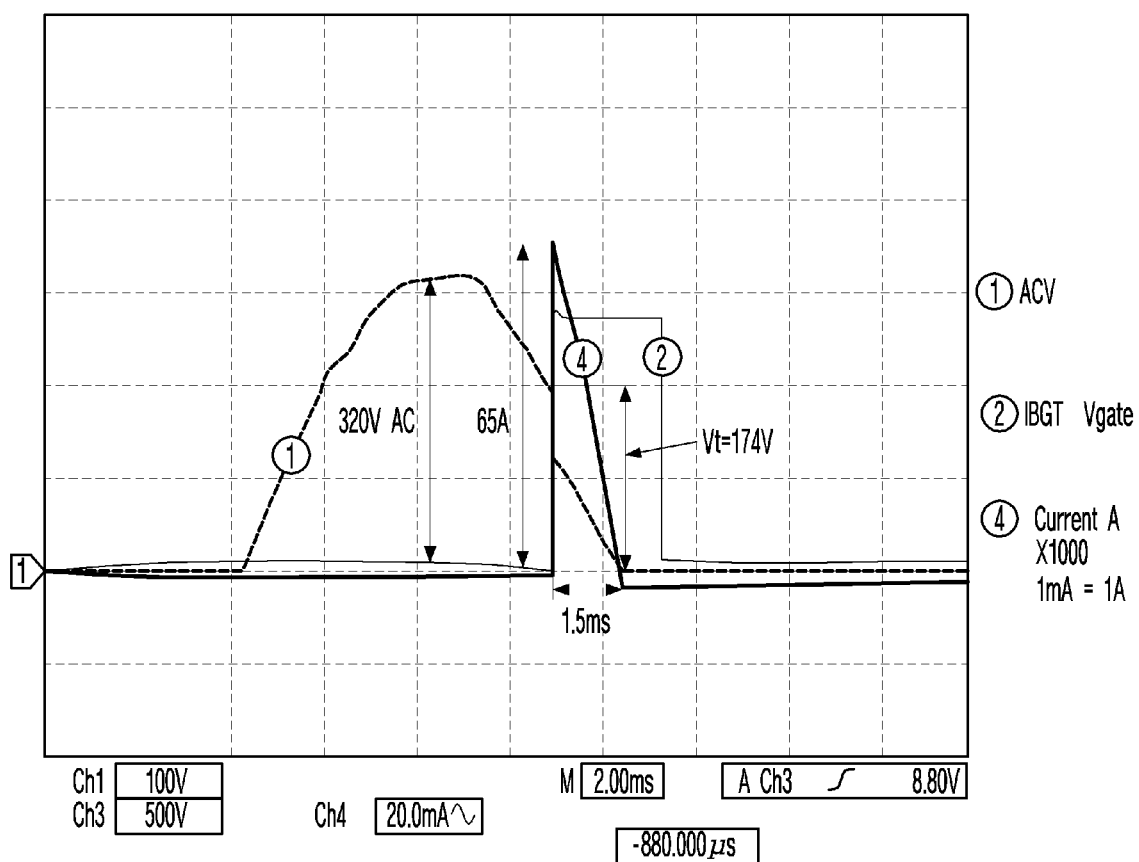
FIG. 41 is a photograph showing a survey current signal and a gate voltage together according to an embodiment of the present disclosure.

FIG. 41 shows a waveform of the DC survey current signal as an example under the environment where a peak voltage of AC mains is 320V (226V*1.414) and a current limiting resistor of 2.5Ω in serial is included as shown in FIG. 35, firing the IGBT for 1.5 ms before the negative slope zero crossing time, and where the measured voltage of AC mains is 174 Vp-p and the instantaneous peak current would be 65 A p-p [174V/2.67Ω (2.5+0.17 conductor resistance)] as a survey signal at the firing time and decreased OA to be extinguished after 1.5 msec as shown FIG. 41.

$$V_t = V_{peak} * \text{Sin}(wt + \Phi)$$

$$\Phi = \left(\frac{(8.33 \text{ ms} - 1.5 \text{ ms})}{8.33}\right) * 180 = 147°$$

If the current limiting resistor is 2.0Ω, then the current would be increased up to 147 A p-p instantaneously. When $V_t$=174 V, the current signal instantaneous value is about 65 A (including conductor resistance of 0.17 Q). If a resistor having resistance of 2.0Ω is selected for generation of a current signal, an instantaneous current signal of about 147 A is generated.

If the IGBT is turned on to flow the fixed current (65 A) and is then turned off to cut off the flow current before the extinction time would create the transient surge voltage like a DC survey voltage as shown in FIG. 36, but turning off the IGBT after the extinction time would generate only the DC survey current without the voltage as shown in FIG. 40.

But the waveform of the AC mains collected from the leaking point is distorted as shown in FIG. 32 or FIG. 34 which is not easy to extract the zero-crossing time to be used as synchronizing the signal generation and receiving (measuring) times between the transmitter and receiver (locator). If the times of sending and receiving are not matching each other as shown in FIG. 39, the locator could not detect the DC survey voltage signal at all.

Figure 42:
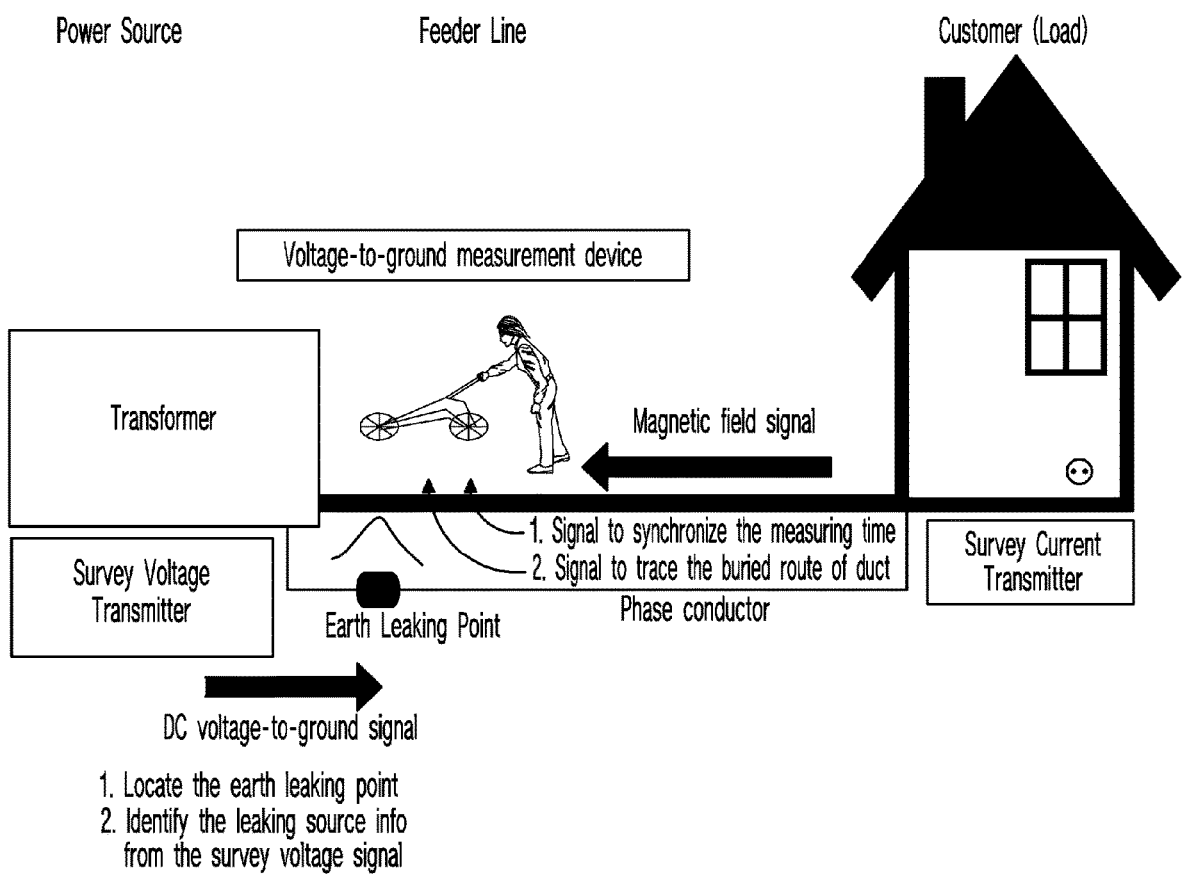
FIG. 42 is a diagram illustrating installation of an electric leakage detection device including a survey voltage transmitter, a survey current transmitter and an accurate earth leak point survey apparatus according to an embodiment of the present disclosure.
Figure 43:
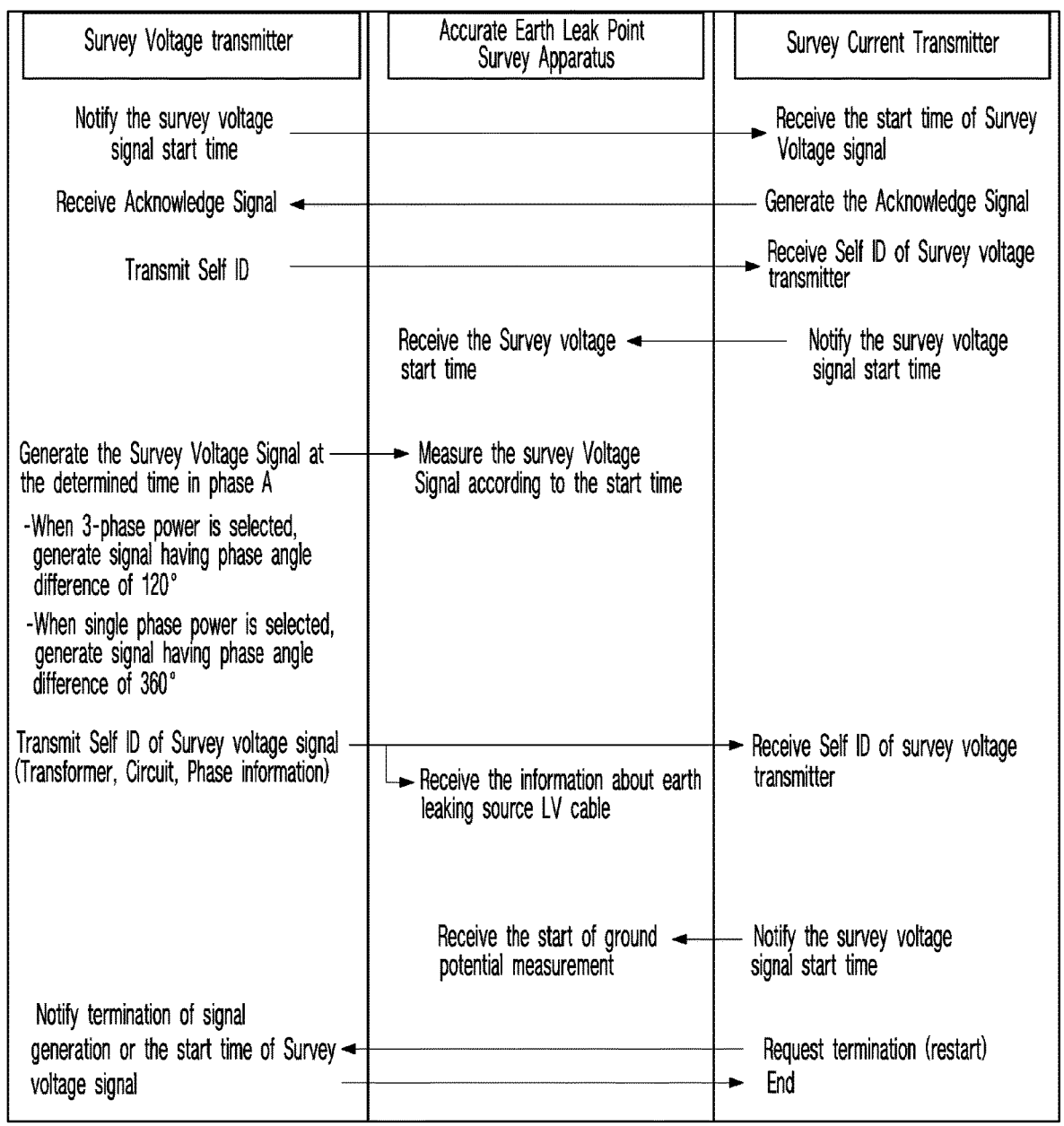
FIG. 43 is a flowchart illustrating a time synchronization inside an electric leakage detection device shown in FIG. 42 according to an embodiment of the present disclosure.

In order to solve this problem that is to detect the DC survey voltage signal correctly even when the waveform of AC mains is distorted not to be able to provide the reference time to measure such as the zero crossing, it is preferred to synchronize the transmitting and receiving times between the transmitter and locator (receiver) without dependency of AC mains as described in FIG. 43. The procedure to detect the DC survey voltage on the ground requires the 3 devices shown in FIG. 42, including (1) the DC survey voltage transmitter and (2) DC survey current transmitter both connected to the feeder line to be surveyed, and (3) the accurate earth leaking point survey apparatus configured to detect the earth potential increasing location of AC mains from the wet type wheel electrodes while moving along the path of phase and neutral conductor wires flowing the DC survey current by following the series of electromagnetic signal null sensing points between the opposite directions. This procedure includes the steps of: (1) exchanging the firing time of the DC survey voltage signal between the transmitters of DC survey voltage and DC survey current; (2) notifying the measuring time to the accurate earth leaking point survey apparatus in the form of electromagnetic signal from the DC survey current transmitter; (3) detecting the earth potential of the DC survey voltage signal on the ground by the accurate earth leaking point survey apparatus after setting the new measuring time by collecting the electromagnetic signals; and (4) in addition to the detection of the leaking point, the accurate earth leaking point survey apparatus identifying the earth leaking source information to prevent an electric shock accident without the excavation work.

FIG. 44 illustrates the protocol exchange process among the DC survey voltage transmitter, the DC survey current transmitter and the accurate earth leaking point survey apparatus to synchronize the time and match the time to generate and detect the signal. The DC survey voltage transmitter sends an initiation code to each phase in sequence waiting for reply from the DC survey current transmitter to know which phase is connected. As example, the DC survey current transmitter replies at phase B. After getting reply from phase B, the DC survey voltage signal transmitter sends continuous measuring signals through the phase conductor B to locate the DC survey voltage signal by the accurate earth leaking point survey apparatus, to get the electromagnetic signal to trace the phase conductor and synchronize the measuring time to detect the DC survey voltage signal on the ground while tracing the route of phase conductor which carrying the DC survey voltage signal.

Figure 45:
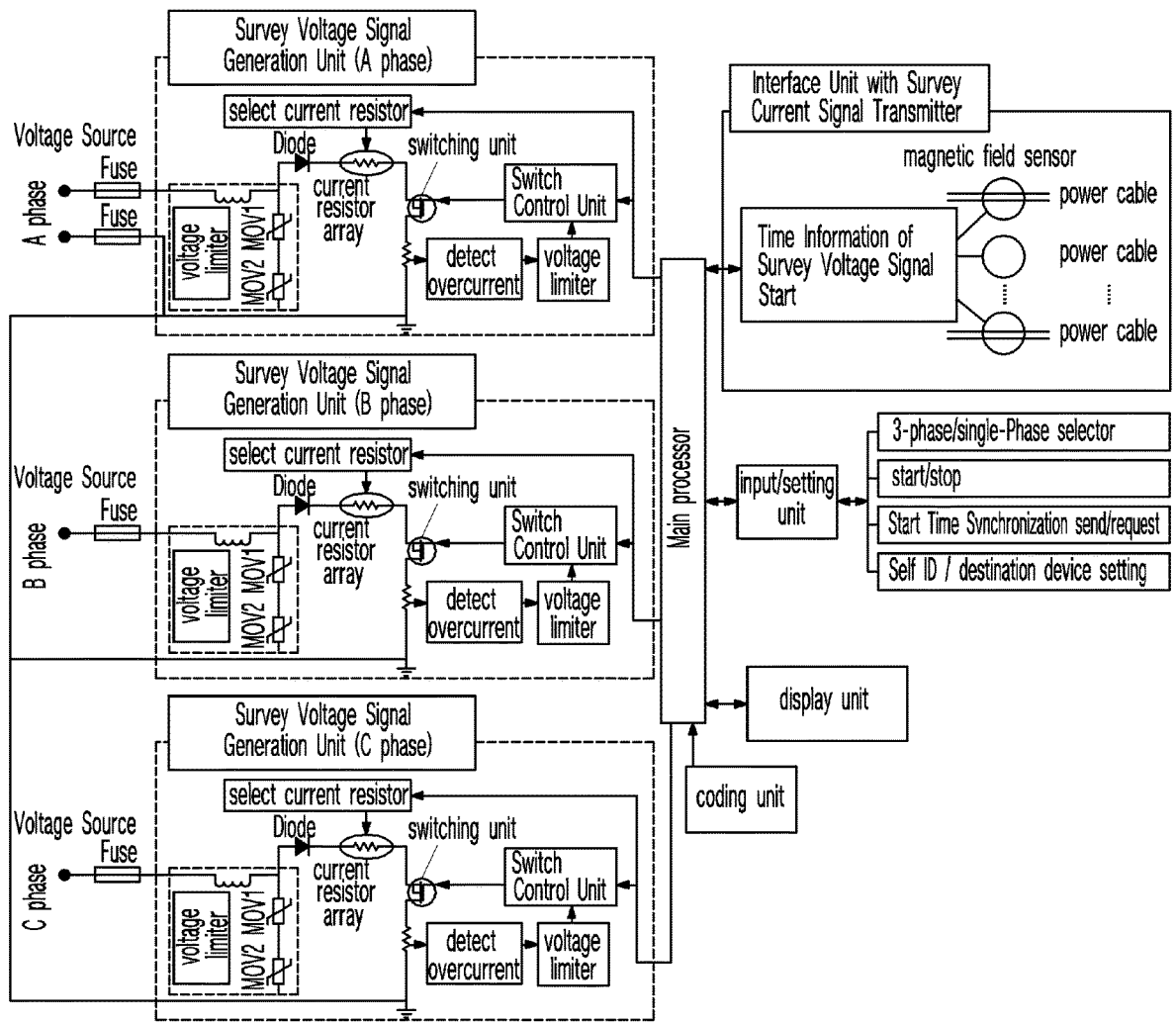
FIG. 45 is an internal circuit diagram illustrating a survey voltage transmitter according to an embodiment of the present disclosure.

FIG. 45 shows a block diagram of the DC survey voltage transmitter, which has an interface part to exchange the time of the DC survey voltage signal generated with the DC survey current transmitter, a phase selecting part to choose a single or 3 phases, an input part to set a self-ID of the accurate earth leaking point survey apparatus, a DC survey voltage generating part which generates current pulses as a time characteristic and generates the transient voltage as shown in FIG. 36 at every 120 degree angle time in sequence, a coding part for assigning values of meaning (logic values) to the DC voltage pulses. Since the amount of transfer energy by DC survey voltage signal is proportional to the amount of currents flowing through the gate as shown in FIG. 36, the phase angle of the gate voltage can be adjusted closer to the top of the sign curve corresponding to the maximum voltage such that the survey voltage transmitter can generate a higher survey voltage when the current is momentarily disconnected.

Figure 46:
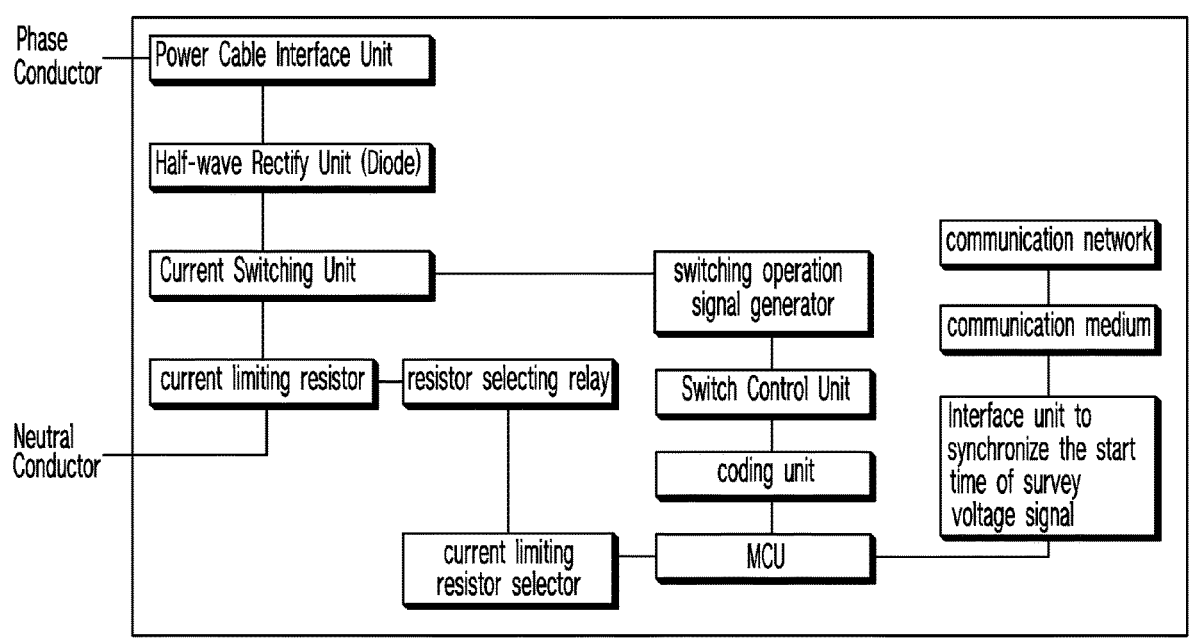
FIG. 46 is a block diagram illustrating a survey current transmitter according to an embodiment of the present disclosure.

FIG. 46 shows a block diagram of the DC survey current transmitter which has a power cable interface part to connect the transmitter to the AC mains, and a diode for rectifying the input AC into a half wave uni-polar voltage and generating a current pulse with a time characteristic shown in FIG. 36 so as to generate a DC survey current signal to send electromagnetic signals to be traced and to be synchronized with the measuring time of the accurate earth leaking point survey apparatus. This device is configured to coordinate the signals between the DC survey voltage transmitter and accurate earth leaking point survey apparatus to improve the accuracy of the survey without the dependency of zero crossing time of AC mains.

Figure 47:
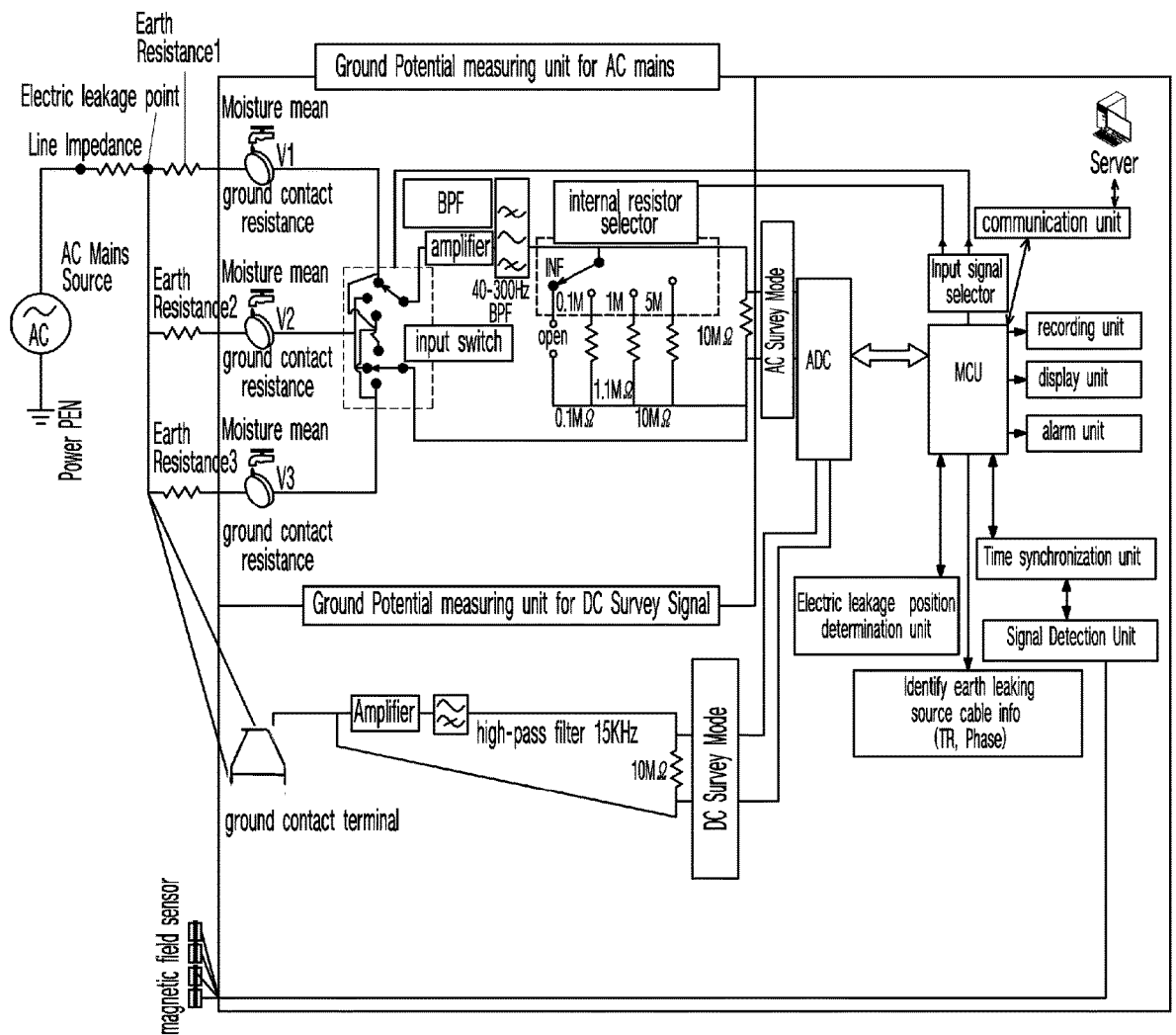
FIG. 47 is a schematic circuit diagram illustrating an accurate earth leak point survey apparatus according to an embodiment of the present disclosure.

FIG. 47 shows a block diagram of the accurate earth leaking point survey apparatus which has 3 main functions including an earth potential detection function of AC mains, an earth potential detection function of DC survey voltage, and a buried route tracing function by detecting electromagnetic signals.

Firstly, the earth potential detection function of AC mains requires 3 inputs from the wet type wheel electrodes with a pump fed water spray nozzle while moving on the ground to trace the buried route of the phase conductor wire touching the ground to scan the earth potentials of AC mains to detect potential increasing locations. The 3 inputs from the electrodes pass the input selection switch and are filtered by a BPF in the range of 40-300 Hz within the frequency of AC mains to reach the ADC via an internal impedance selecting switch to verify the input of earth potential is truly from the potential leak of AC mains. It is preferred to set the highest value of the internal impedance as infinite, to move and stop at a location where the potential is more than 50 mV and make sure the reading of potential is maintained in a stable level even the impedance is changed to a lower value.

After finding a peak location of earth potential of AC mains by using one of wet type wheel electrodes or A-frame tip electrodes, a more accurate peak of the earth potential of the DC survey voltage on the ground around the peak location of AC mains can be precisely detected. The measuring time and route tracing signals are in the form of electromagnetic signals in the air from the DC survey current signal transmitter.

The input signal of DC survey voltage will pass through a high pass filter of 15 kHz to the ADC via a fixed internal impedance of 10 MΩ for example. When the signal level of the DC survey voltage signal needs to be changed, the firing time of IGBT (Tg) should be shifted as shown in the FIG. 36. The DC survey voltage signals also have the information of the earth leaking source transmitted by the DC survey current transmitter which could be useful to isolate the earth leaking source without excavation in emergency situations.

Moreover, the accurate earth leaking point survey apparatus has a function of acquiring geospatial data from the IMU, GPS and odometer from the wheel rotation counter, etc., and a communication unit to store the acquired data into the server through a communication medium.

Figure 48:
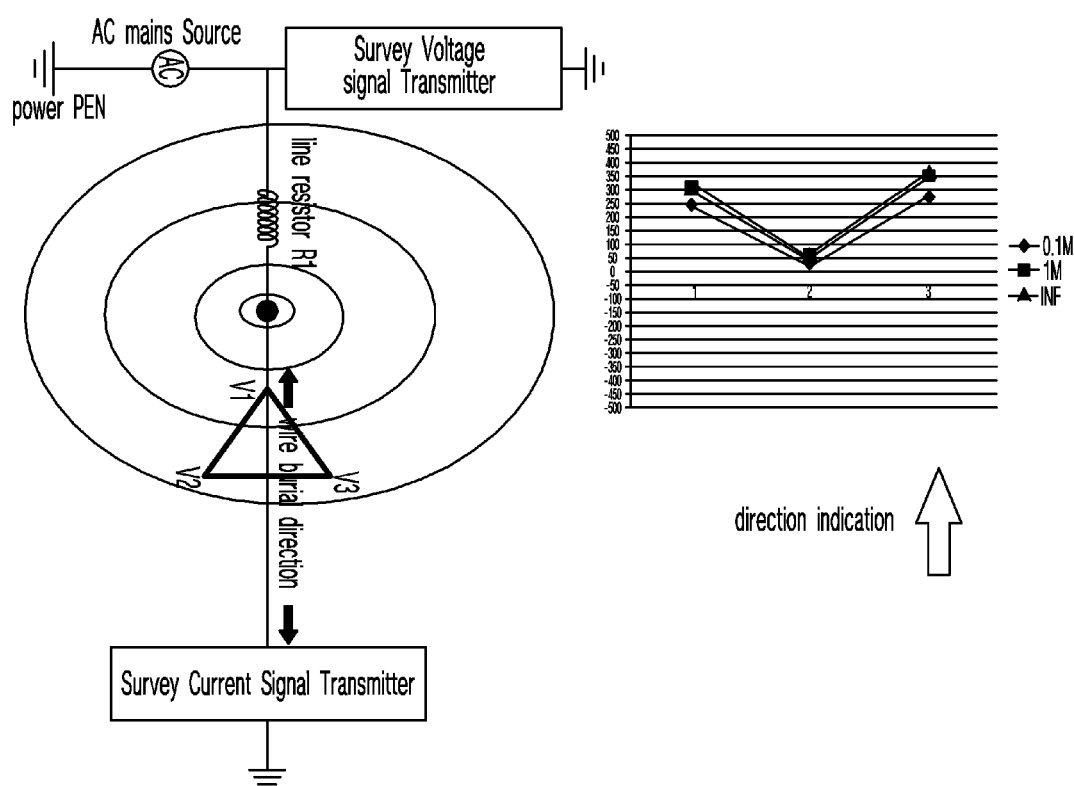
FIG. 48 illustrates a case where the accurate earth leak point survey apparatus marks a direction before the electric leakage point.

FIG. 48 shows earth potential levels of AC mains from the 3 wet type wheel electrodes to reach the earth leaking point to display an arrow upward to go forward to the leaking point where V2 (V2=IV2−V3I) is lower than V1 (VI=IV1−V2I) and V3 (V3=IV3−V1I).

Figure 49:
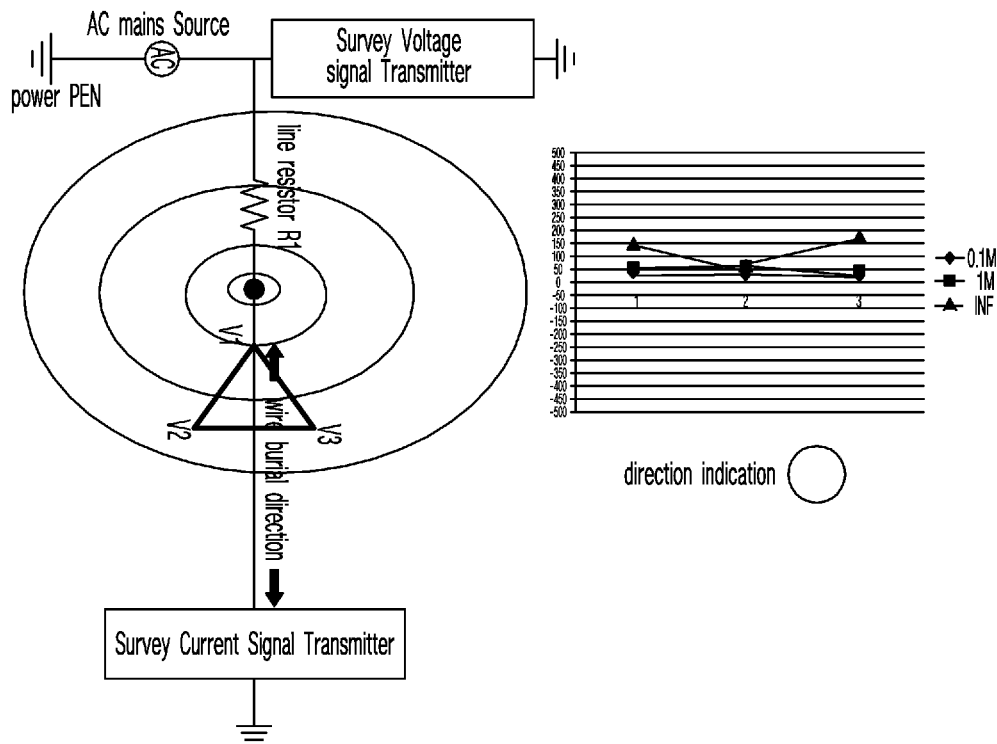
FIG. 49 illustrates a case where the accurate earth leak point survey apparatus marks a direction at the electric leakage point.

FIG. 49 shows earth potential levels of AC mains detected directly over the earth leaking point and displays a circle shown just over the leaking point where all 3 values of V1, V2 and V3 have a same minimum value.

Figure 50:
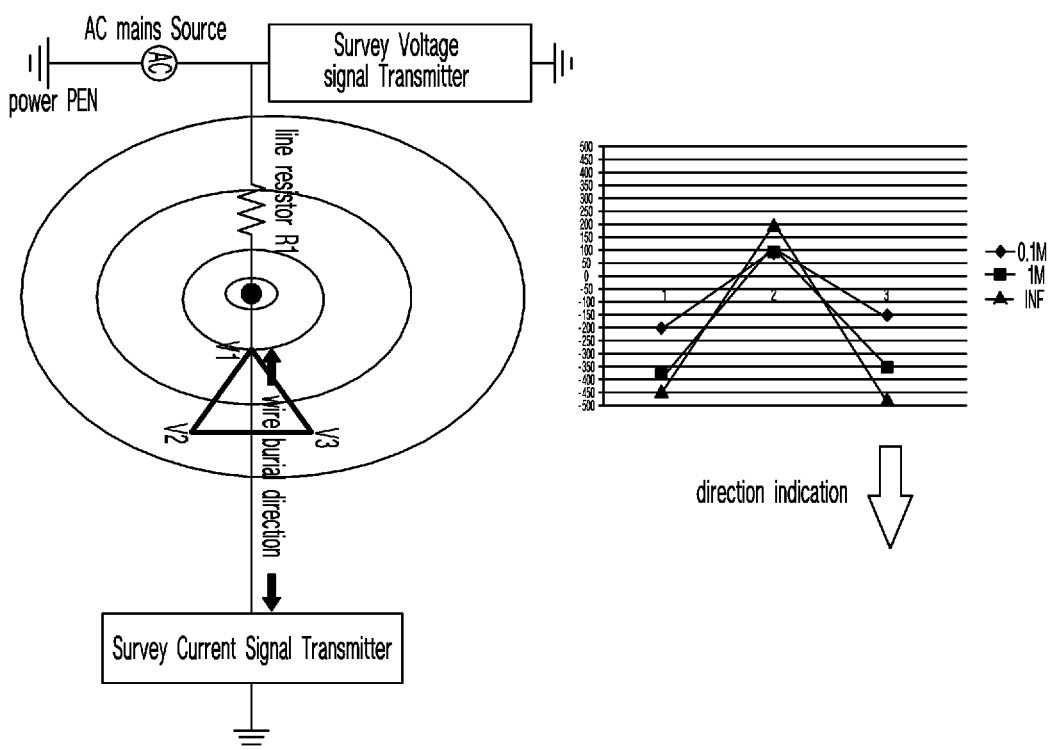
FIG. 50 illustrates a case when the accurate earth leak point survey apparatus has passed the electric leakage point.

FIG. 50 shows an earth potential detected at a location after passing the leakage point of FIG. 49, where the value of V2 is higher than those of V1 and V3, and illustrates a downward arrow to imply that the leaking point is behind the current location.

The earth potentials of AC mains among the 3 wet type wheel electrodes are compared and analyzed in such a way that, before and after the earth leaking point, the value of the potential suddenly is increased or decreased but, directly on the earth leaking point, the value becomes the lowest in all 3 electrodes, i.e., the point having the lowest potential value can be determined as a leaking point.

Figure 51:
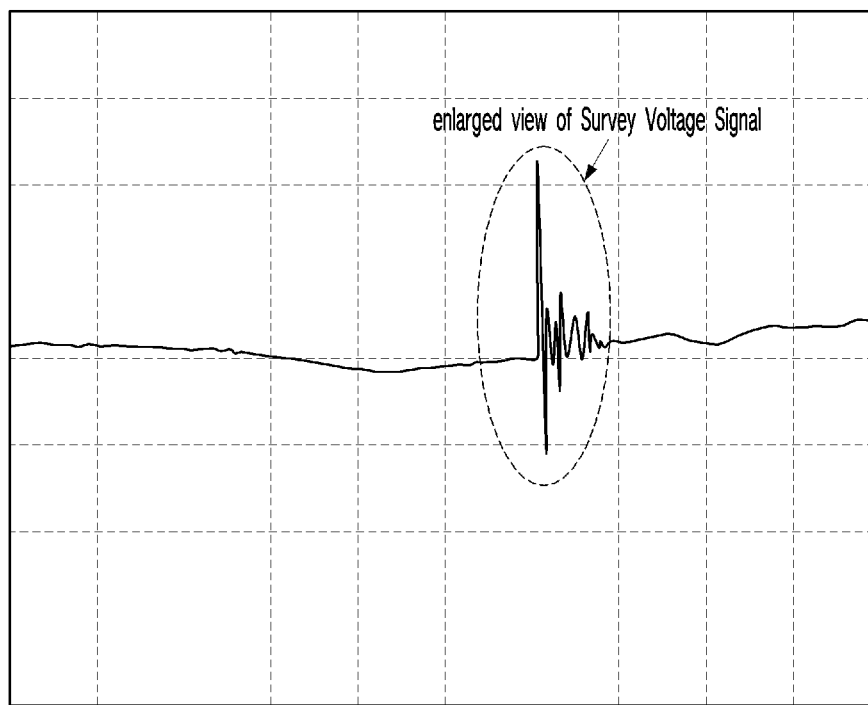
FIG. 51 is a photograph showing a DC survey voltage signal waveform at the place of FIG. 33.
Figure 52:
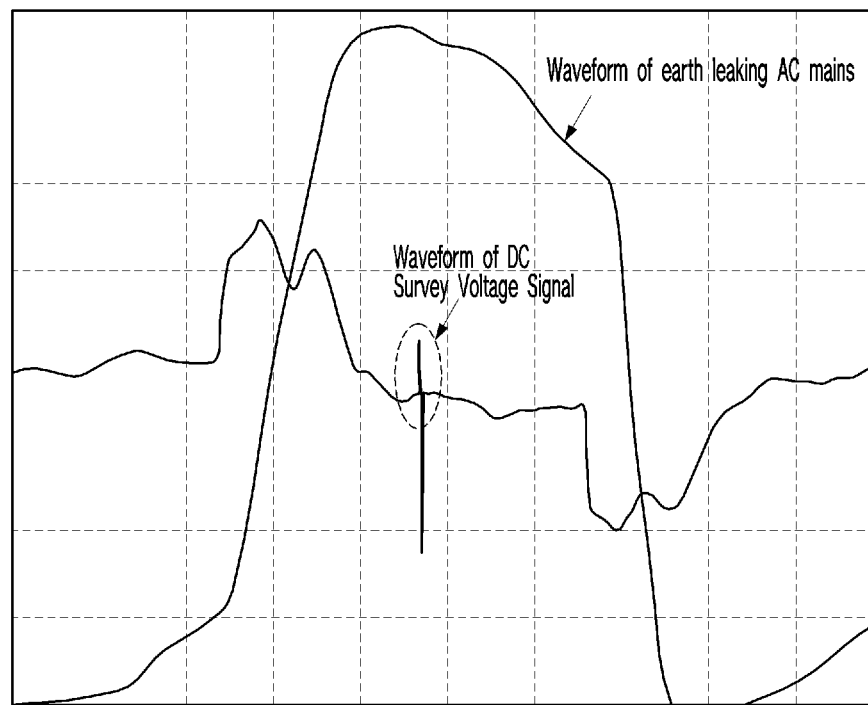
FIG. 52 is a photograph showing waveforms of earth potential of an AC commercial power and a DC survey voltage signal together at the place of FIG. 33 in a comparing manner.

FIG. 51 shows a waveform of the DC survey voltage signal received at the earth leaking point shown in FIG. 33, and the FIG. 52 shows both an earth potential voltage in FIG. 34 and a DC survey voltage in FIG. 51 to compare the waveform between the AC mains and DC survey voltage.

The waveforms between the earth potential of AC mains with a 40-300 Hz range and DC survey voltage signal with a 15 kHz above range are not well matched in the timing and amplitude of the peak because the low frequency of AC mains and mixture of potential created by other return load will have more distortion (time shift) compared to the waveform of the DC survey signal. Therefore finalizing the earth leaking point only after doing the peak detection of the earth voltage of AC mains sometimes could be erroneous result.

Figure 53:
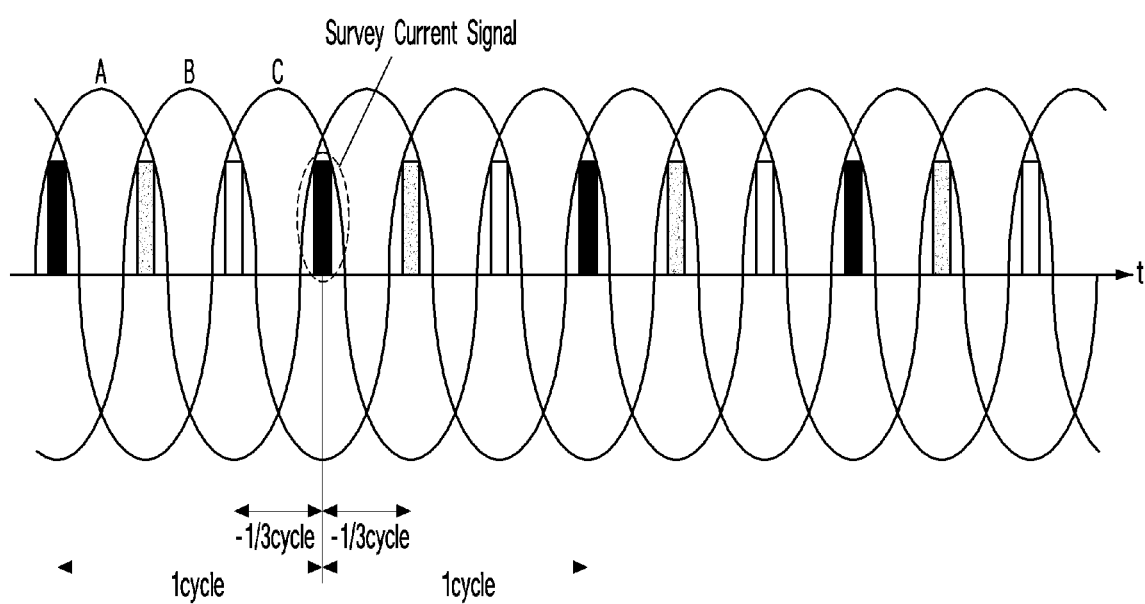
FIG. 53 is a diagram illustrating a DC survey voltage signal generation time for notifying magnetic field signal trigger time T and an actual measurement time according to an embodiment of the present disclosure.

FIG. 53 shows an example of implementation of time intervals between a notification time from the DC survey current transmitter to the accurate earth leaking point survey apparatus and an actual measuring time to detect the earth potential of DC survey voltage, which is a ⅓ cycle of AC mains. If the DC survey current transmitter sends the notification to the accurate earth leaking point survey apparatus in the form of electromagnetic signals, after a successful reception of the notification signal, the accurate earth leaking point survey apparatus will do the measuring of the DC survey voltage the ⅓ cycle time later at the time a logic value is '1'.

After getting the notification time signal from the DC survey current transmitter, the accurate earth leaking point survey apparatus automatically opens a measuring window to measure the earth potential of the DC survey voltage on the ground the ⅓ cycle of AC mains later as programmed.

Figure 54:
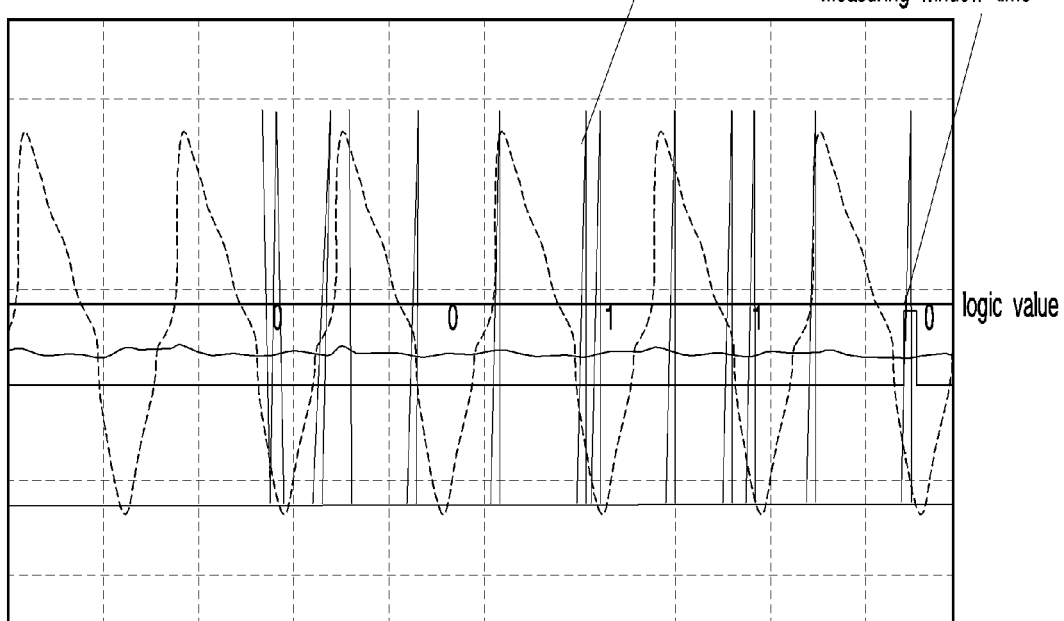
FIG. 54 is a diagram illustrating a DC survey voltage signal measuring window open time and logic values according to an embodiment of the present disclosure.

FIG. 54 shows the opening time of measuring window and earth potential of the DC survey voltage signal together with the logic value of '00110'. The accurate earth leaking point survey apparatus measures the earth potential of DC survey pulse within the time of measuring window open to distinguish the signal from noise, and when the earth potential signal exists in the time of measuring window open, set the logic value as '1', otherwise '0'.

Figure 55:
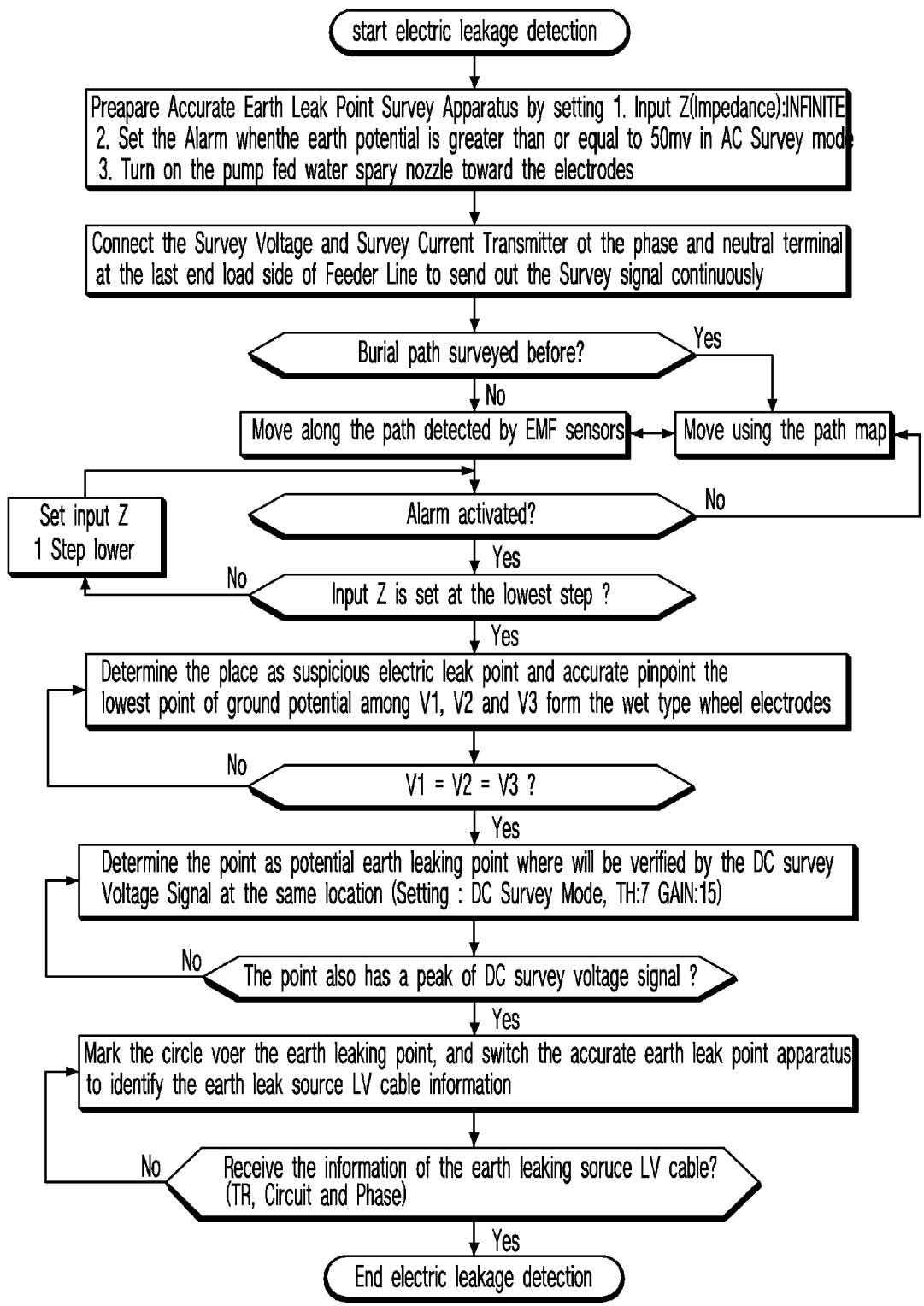
FIG. 55 is a flowchart illustrating electric leakage detection according to an embodiment of the present disclosure.

FIG. 55 shows a flow chart to locate an earth potential leaking point. As shown in the case of FIG. 42, the survey current and voltage transmitter are connected to a LV cable to be examined. To perform the accurate survey of earth leakage point, trace along the buried route of phase conductor wires using the accurate earth leak point survey apparatus. Alternatively, drive along expected routes of buried cables to roughly scan the earth potential increasing (unsafe) places in a certain wide area where underground distribution feeder lines are installed by using the AC mains leakage scanning device with the multiple wet type wheel electrodes, and then pinpoint the accurate location of earth leaking and acquire the leaking cable information within said earth potential increasing (unsafe) places.

Figure 56:
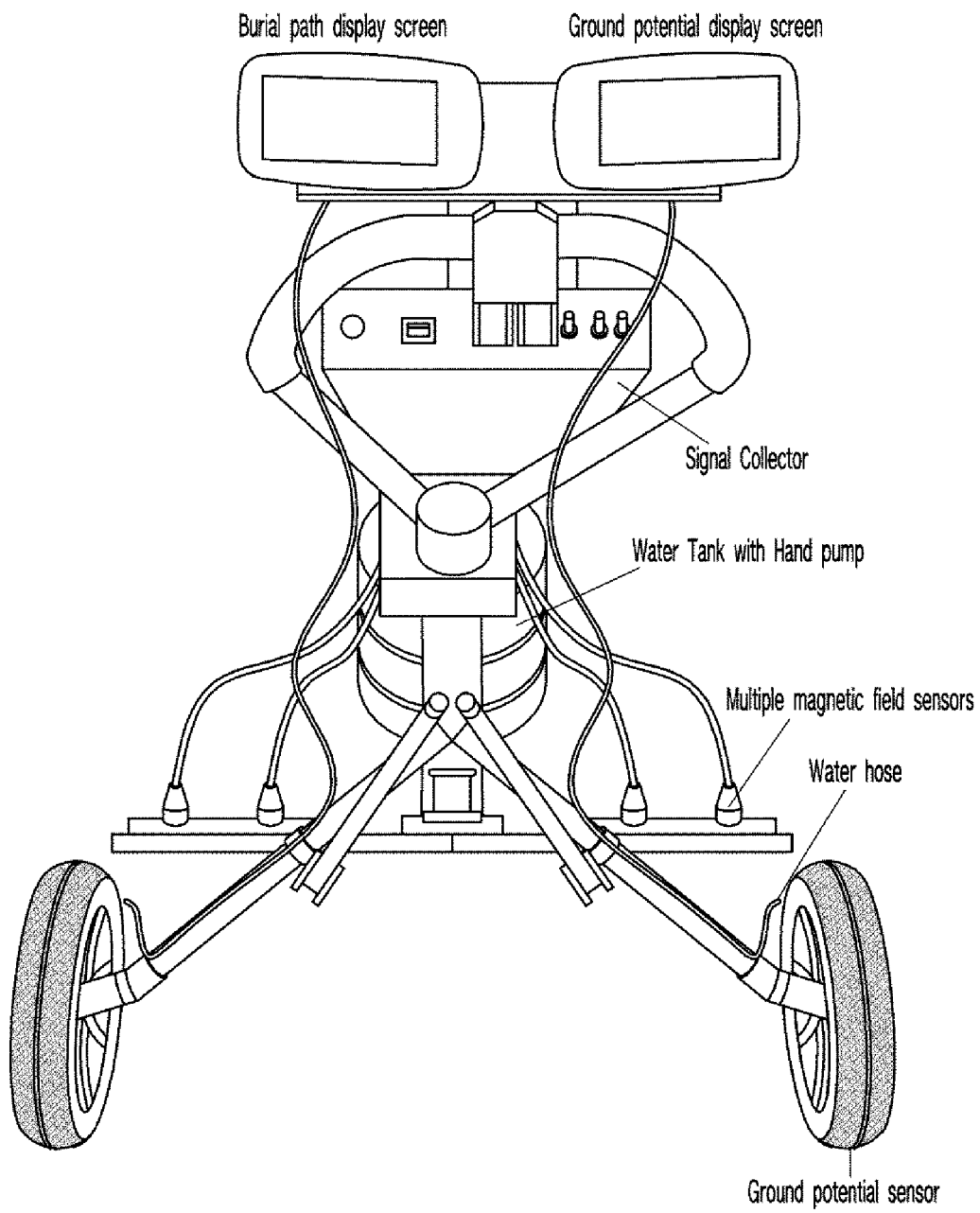
FIG. 56 shows an example of accurate earth leak point survey apparatus seen from a view by a surveyor.
Figure 57:
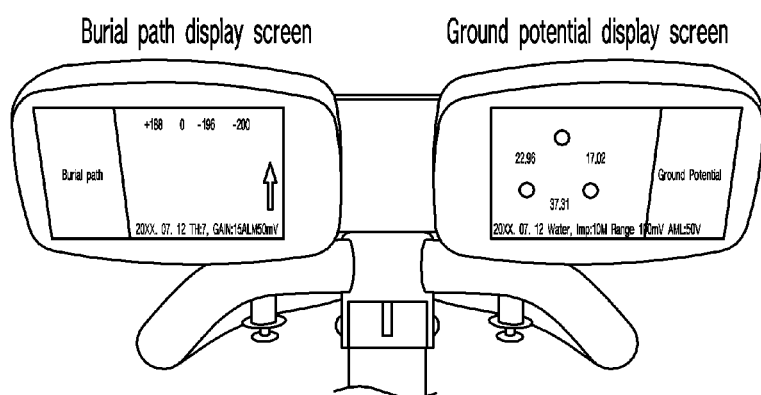
FIG. 57 shows 2 screens of a path detection and earth potential measurement according to an embodiment of the present disclosure.

FIGS. 56 and 57 show an example of the accurate earth leaking point survey apparatus viewed from the hand pushing location and 2 screens to allow one operator to perform tracing the path of a buried phase conductor wire and measuring the increasing point of ground potential at one time, comprising a plurality of wet type wheel electrodes to measure ground potential, a moisture supply means, multiple magnetic field signal sensors, and a water tank and a water hose for continuously supplying water to reduce a contact resistance between the electrodes and the ground.

Figure 58:
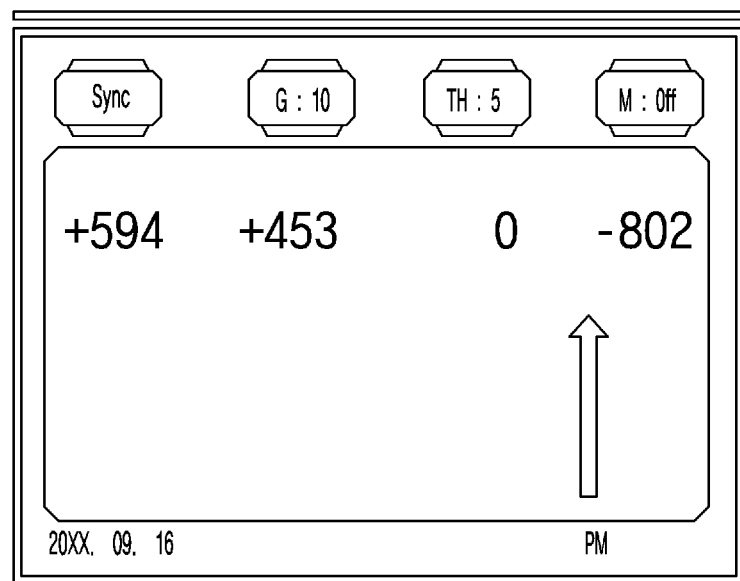
FIG. 58 shows a screen displaying a result of determination of the direction of movement of a ground potential measurement device along a buried path of a power cable.

FIG. 58 shows 4 input electromagnetic signals with polarities and magnitudes received from the electromagnetic sensors shown in FIG. 29, where a null (which has the magnitude closer to zero) is at the 3rd place from the leftist between the opposite polarities (+ in the $2^{nd}$ from the leftist, − in the rightest), so that the place corresponding to the location of null position is determined to be directly over the route of a duct which includes phase and neutral conductor wires to be traced, and thus an arrow is displayed direct a surveyor to move forward.

Figure 59:
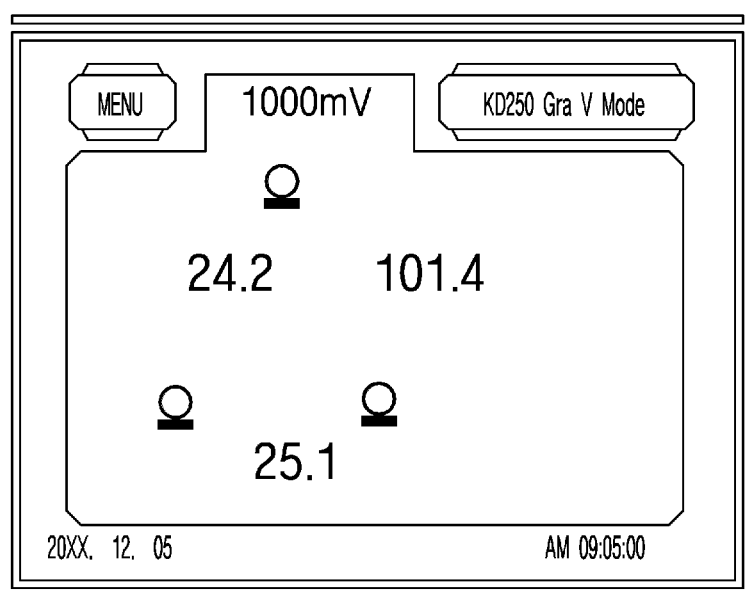
FIG. 59 shows a screen display for ground potential values from three wet type wheel electrodes in the accurate earth leak point survey apparatus according to an embodiment of the present disclosure.

FIG. 59 shows a screen display indicating 3 ground potential values V1, V2 and V3 input from the wet type wheel electrodes.

Figure 60:
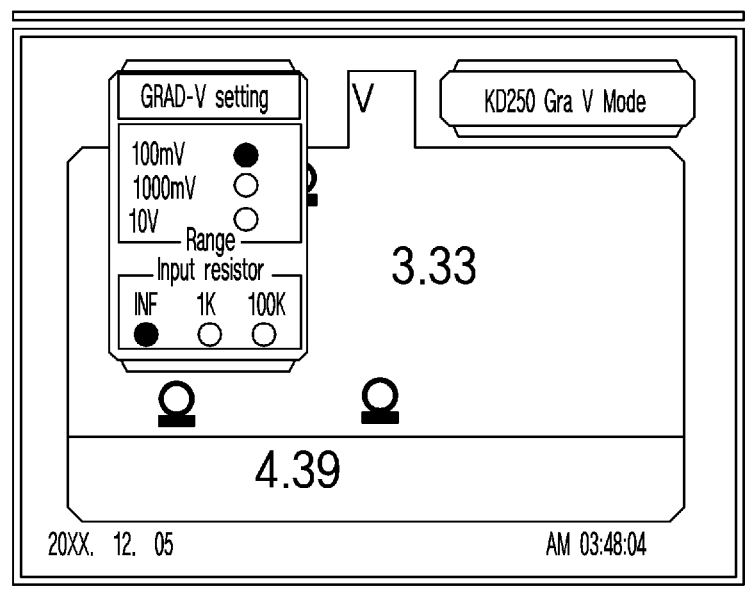
FIG. 60 is a diagram illustrating a menu item for changing internal impedances of the accurate earth leak point survey apparatus according to an embodiment of the present disclosure.

FIG. 60 shows a screen to judge the true ground potential leakage distinguished from an induced false voltage at an alarmed location where the ground potential is exceeding a threshold level by connecting a different internal impedance to the measuring circuit shown in FIG. 47.

Figure 61:
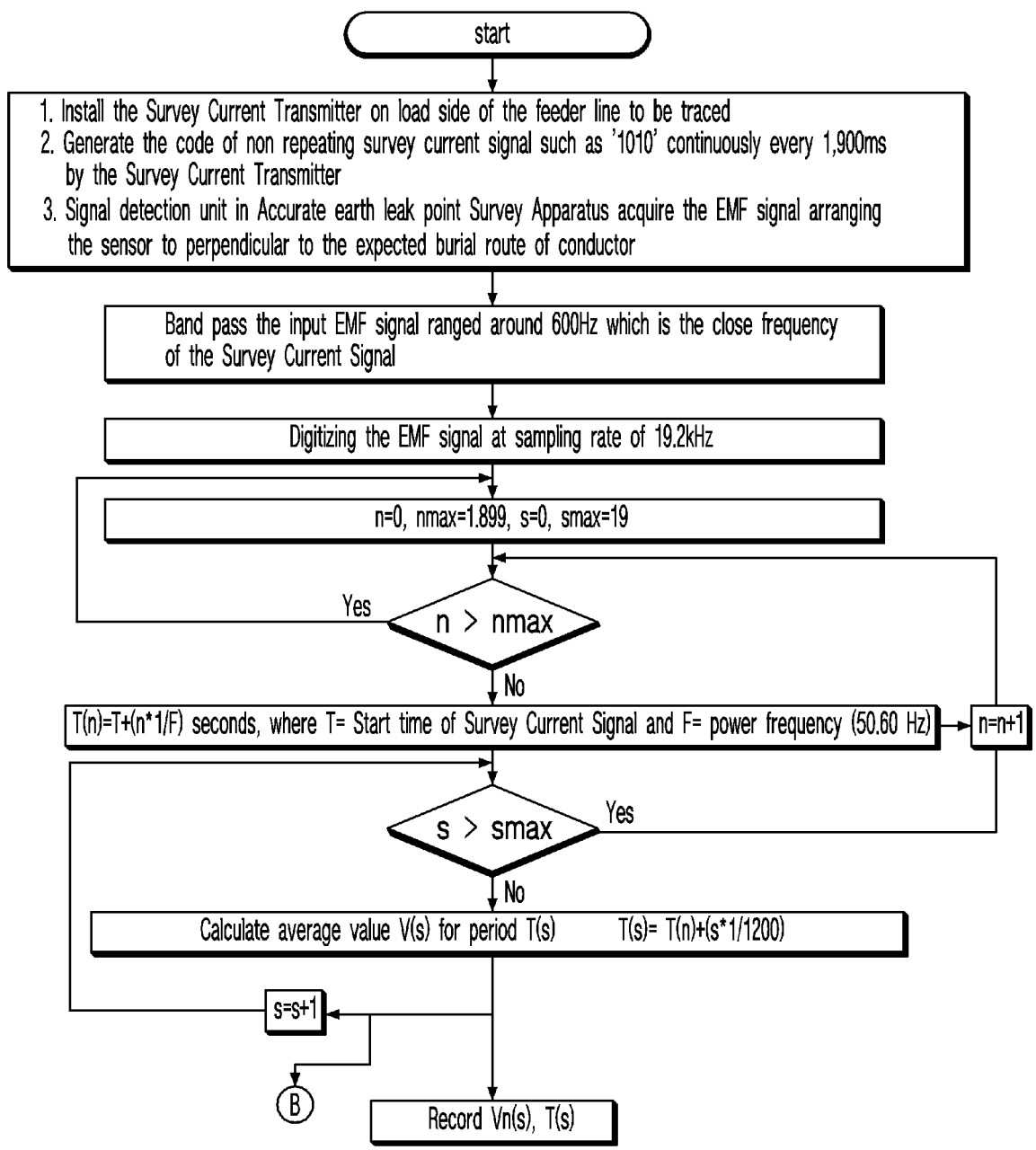
FIG. 61 is a flowchart illustrating procedures how to reconstruct electromagnetic signals by the accurate earth leak point survey apparatus according to an embodiment of the present disclosure.
Figure 62:
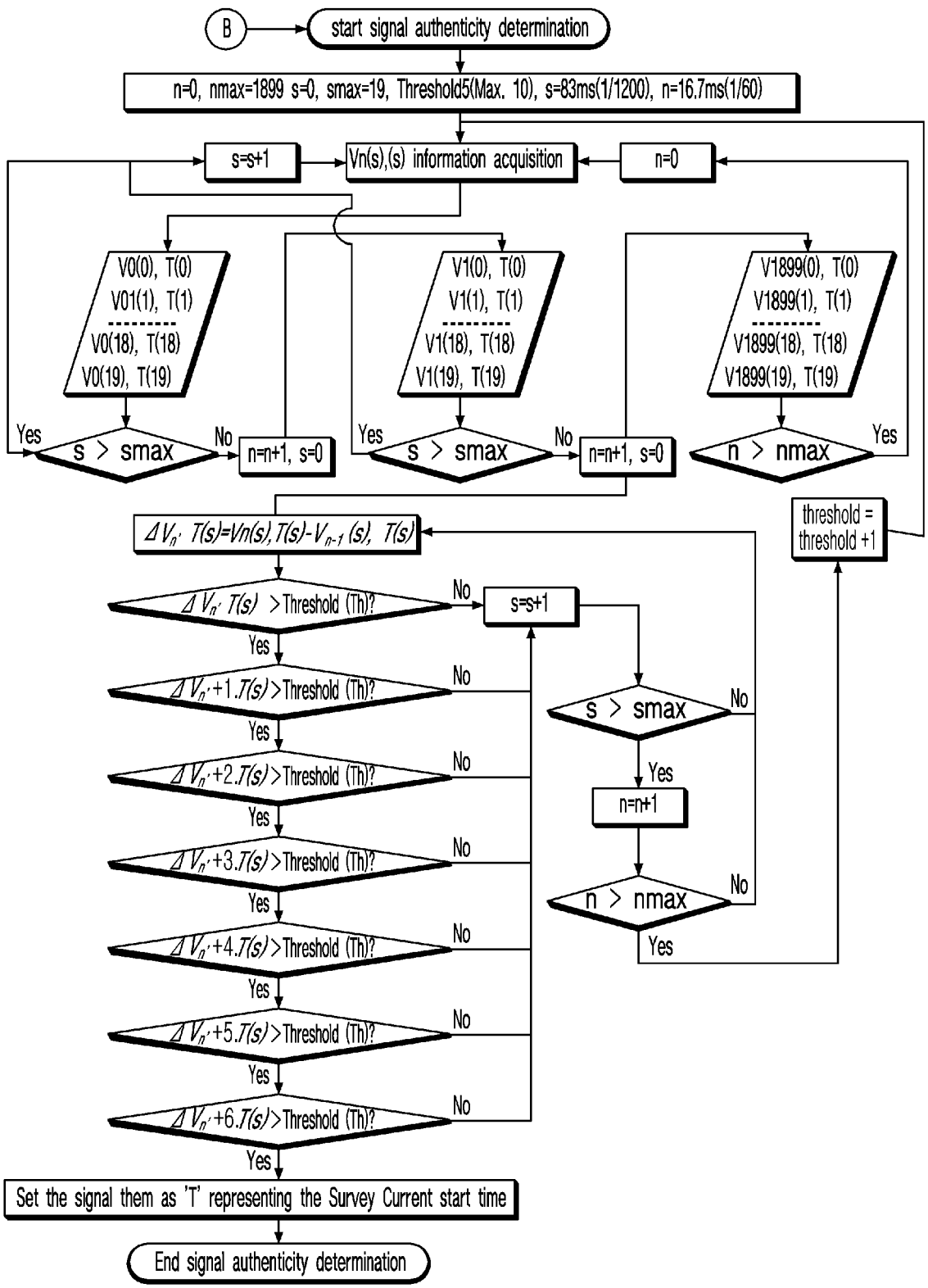
FIG. 62 is a flowchart illustrating how to find the true time 'T' by the accurate earth leak point survey apparatus according to an embodiment of the present disclosure.

FIG. 61 is a flowchart illustrating a procedure how the accurate earth leak point survey apparatus measures the electromagnetic signals. To minimize an influence of a load current, it is configured to have the load current pass a filter of 600 Hz and be digitized. And, reconstruct sampled signals similar to the survey current signal in a period and sequence and pass them through the signal authenticity logic as shown in FIG. 62. Thereafter, when a trigger time T is determined by the signal authenticity logic, the true time 'T' is used as a synchronized time to measure the polarity and magnitude of the electromagnetic signal.

Referring to FIG. 62, the logic of identifying the true time 'T' based on the unknown inputs from the electromagnetic sensors includes averaging 16 sampled signals to reconstruct a signal to have a same discrete period time and put them in sequence distanced by a power frequency 1 cycle interval (16.7 msec if 60 Hz) to detect a series of logic values from the chain of recovered signals that is not a repeated logic value of '0', and following additional '1000' logic value to be determined as the true time T' and resetting the time 'T' in FIG. 61 identical to the measuring time.

FIG. 63 illustrates a record section in the wide area AC mains leakage scanning device in detail. The record section provides the location data combining gathered data from the GPS, IMU (Inertial Measurement Unit) and odometer from a wheel electrode to enable to spot an accurate point on the map with the value of measurement.

It is preferred to transmit input signals from the 4 EMF sensors into a filter which has a center frequency 600 HZ to eliminate electromagnetic signals with a certain power frequency range so as to minimize the influence from the load current flowing in a power cable to be traced, and then the filtered signals are digitized by a sampled 19,200 Hz rate. To transform a signal to have a same discrete period time (1.5 msec) of survey current signal, average or pick the maximum value in the 16 samples (0.8 msec), and find a logic value chain of the recovered electromagnetic signal which has the same value of the initiation code of survey current signals to determine the true time 'T' as the synchronized reference time to compare the polarity and magnitude of electromagnetic signal to find the buried point of electric power line and measure the earth potential according to the time, and record the measured data with the location data from a satellite into the record section in the accurate earth leak point survey apparatus.

Although the preferred embodiments of the present disclosure have been disclosed for illustrative purposes, those skilled in the art will appreciate that various modifications, additions and substitutions are possible, without departing from the scope and spirit of the disclosure as set forth in the accompanying claims.

What is claimed is:

1. A survey voltage transmitter comprising:
   a diode;
   a resistor;
   a first connection wire connected to a hot wire of AC power at a place;
   a second connection wire connected to a neutral wire of the AC power at the place;
   a switching unit for turning on and off a circuit connected between the hot wire and the neutral wire to control a current flow through the diode and the resistor connected in series;
   a switching control unit for controlling a switch time of the circuit by providing a time control signal to the switching unit to turn on the circuit at a predetermined phase angle of the AC power and turn off the circuit before a half wave extinction phase angle of the AC power; and
   a coding unit for controlling the switching control unit to generate the current flow or not and for generating a series of logic values corresponding to the current flow.

2. The survey voltage transmitter according to claim 1, further comprising an interface unit for synchronizing the switch time with an associated device through communications.

3. The survey voltage transmitter according to claim 1, wherein the switching unit has three switching circuits corresponding to three phases of the AC power.

4. The survey voltage transmitter according to claim 1, further comprising an input and setting unit to enter identity information of the voltage transmitter to the coding unit and set a single phase or three phases of the AC power.

5. A survey current transmitter configured to identify a burial path of a power cable, comprising:
   a diode;
   a resistor;
   a first connection wire connected to a hot wire of AC power at a place;
   a second connection wire connected to a neutral wire of the AC power at the place;
   a switching unit for turning on and off a circuit connected between the hot wire and the neutral wire to control a current flow through the diode and the resistor connected in series;
   a switching control unit for controlling a switch time of the circuit by providing a time control signal to the switching unit to turn on the circuit at a predetermined phase angle of the AC power and turn off the circuit after a half wave extinction phase angle of the AC power; and a coding unit for controlling the switching control unit to generate the current flow or not and for generating a series of logic values corresponding to the current flow.

6. The survey current transmitter according to claim 5, further comprising an interface unit to synchronize the switching time with an associated device through communications.

* * * * *